(12) United States Patent
Hiramatsu et al.

(10) Patent No.: US 11,509,063 B2
(45) Date of Patent: Nov. 22, 2022

(54) STRUCTURE, ANTENNA, WIRELESS COMMUNICATION MODULE, AND WIRELESS COMMUNICATION DEVICE

(71) Applicant: KYOCERA Corporation, Kyoto (JP)

(72) Inventors: Nobuki Hiramatsu, Yokohama (JP); Hiroshi Uchimura, Kagoshima (JP); Yasuhiko Fukuoka, Yokohama (JP); Hikaru Nekozuka, Yokohama (JP); Fangwei Tong, Machida (JP); Masamichi Yonehara, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/270,412

(22) PCT Filed: Aug. 22, 2019

(86) PCT No.: PCT/JP2019/032874
§ 371 (c)(1),
(2) Date: Feb. 22, 2021

(87) PCT Pub. No.: WO2020/040258
PCT Pub. Date: Feb. 27, 2020

(65) Prior Publication Data
US 2021/0194149 A1 Jun. 24, 2021

(30) Foreign Application Priority Data
Aug. 24, 2018 (JP) .............................. JP2018-157866

(51) Int. Cl.
*H01Q 1/48* (2006.01)
*H01Q 21/00* (2006.01)
*H01Q 5/378* (2015.01)

(52) U.S. Cl.
CPC ......... *H01Q 21/0025* (2013.01); *H01Q 5/378* (2015.01)

(58) Field of Classification Search
CPC ...... H01Q 21/0025; H01Q 5/378; H01Q 1/48; H01Q 9/0407; H01Q 9/0414; H01Q 19/005
See application file for complete search history.

(56) References Cited

U.S. PATENT DOCUMENTS 5,781,158 A * 7/1998 Ko .................... H01Q 9/0421
343/848
7,737,368 B2 6/2010 Kohara et al.
(Continued)

FOREIGN PATENT DOCUMENTS

CN 103928757 A 7/2014
EP 3745530 A1 12/2020
(Continued)

OTHER PUBLICATIONS

Yasutaka Murakami et al., Low-Profile Design and Bandwidth Characteristics of Artificial Magnetic Conductor with Dielectric Substrate, 2015,172-179, vol. J98-B No. 2, IEEE, Japan, 9pp.
(Continued)

*Primary Examiner* — Dieu Hien T Duong
(74) *Attorney, Agent, or Firm* — Hauptman Ham, LLP

(57) ABSTRACT

There is provided a new type of structure that resonates at a predetermined frequency, an antenna, a wireless communication module, and a wireless communication device. The structure includes a first conductor that extends in a second direction, a second conductor, a third conductor, a fourth conductor. The second conductor faces the first conductor in a first direction and that extends along the second direction. The third conductor is configured to capacitively connect the first conductor and the second conductor. The fourth conductor is configured to be electrically connected to the first
(Continued)

conductor and the second conductor and extends along a first plane. Each of the first conductor and the second conductor includes a portion that extends along the second direction and that is exposed to an exterior space.

10 Claims, 75 Drawing Sheets

(56) References Cited

U.S. PATENT DOCUMENTS

| | | |
|---|---|---|
| 10,177,446 B2 | 1/2019 | Hashiguchi et al. |
| 2007/0273588 A1 | 11/2007 | Kim et al. |
| 2016/0276751 A1 | 9/2016 | Ueda |
| 2017/0365919 A1 | 12/2017 | Hovmoller |

FOREIGN PATENT DOCUMENTS

| | | | |
|---|---|---|---|
| JP | 2003243925 A | * | 8/2003 |
| JP | 200796187 A | | 4/2007 |
| JP | 2010183546 A | | 8/2010 |
| JP | 20165117 A | | 1/2016 |
| JP | 2017229066 A | | 12/2017 |

OTHER PUBLICATIONS

Yasutaka Murakami et al., Optimum Configuration of Reflector for Dipole Antenna with AMC Reflector, 2015, 1212-1220, vol. 98-B No. 11, IEEE, 10pp.

* cited by examiner

STRUCTURE, ANTENNA, WIRELESS COMMUNICATION MODULE, AND WIRELESS COMMUNICATION DEVICE

This application is a National Stage of PCT international application Ser. No. PCT/JP2019/032874 filed on Aug. 22, 2019 which designates the United States, incorporated herein by reference, and which is based upon and claims the benefit of priority from Japanese Patent Application No. 2018-157866 filed on Aug. 24, 2018, the entire contents of which are incorporated herein by reference.

FIELD

Background

The present disclosure is related to a structure that resonates at a predetermined frequency, an antenna, a wireless communication module, and a wireless communication device.

The electromagnetic waves radiated from an antenna are reflected from a metallic conductor. The electromagnetic waves reflected from a metallic conductor have a phase shift of 180°. The reflected electromagnetic waves are combined with the electromagnetic waves radiated from the antenna. The electromagnetic waves radiated from the antenna may decrease in the amplitude due to the combination thereof with the electromagnetic waves having a phase shift. That leads to a decrease in the amplitude of the electromagnetic waves radiated from the antenna. The distance between the antenna and the metallic conductor is set to be ¼ of a wavelength λ of the radiated electromagnetic waves, so that the influence of the reflected waves is reduced.

On the other hand, a technique has been proposed in which the influence of the reflected light is reduced using an artificial magnetic conductor. That technique is described in, for example, Non Patent Literature 1 and Non Patent Literature 2.

CITATION LIST

Patent Literature

Non Patent Literature 1: Murakami et al., "Low-profile design and band characteristics of artificial magnetic conductor using dielectric substrate", IEICE (B), Vol. J98-B No. 2, pp. 172-179

Non Patent Literature 2: Murakami et al., "Optimized configuration of reflector for dipole antenna with AMC reflection board", IEICE (B), Vol. J-98-B No. 11, pp. 1212-1220

SUMMARY

A structure according to an embodiment of the present disclosure includes a first conductor that extends in a second direction, a second conductor, a third conductor, a fourth conductor. The second conductor faces the first conductor in a first direction and that extends along the second direction. The third conductor is configured to capacitively connect the first conductor and the second conductor. The fourth conductor is configured to be electrically connected to the first conductor and the second conductor and extends along a first plane. Each of the first conductor and the second conductor includes a portion that extends along the second direction and that is exposed to an exterior space.

An antenna according to an embodiment of the present disclosure includes the structure described above and a feeding line. The feeding line is connected to the third conductor.

A wireless communication module according to an embodiment of the present disclosure includes the antenna described above and an RF module that is configured to be electrically connected to the antenna.

A wireless communication device according to an embodiment of the present disclosure includes the wireless communication module described above and a battery that is configured to supply electric power to the wireless communication module.

BRIEF DESCRIPTION OF DRAWINGS

FIG. 99 is a cross-sectional view of the wireless communication device illustrated in FIG. 98.

FIG. 100 is a perspective view of a wireless communication device according to embodiments.

FIG. 101 is a cross-sectional view of a resonator according to embodiments.

FIG. 102 is a planar view of a resonator according to embodiments.

FIG. 103 is a planar view of a resonator according to embodiments.

FIG. 104 is a cross-sectional view of the resonator illustrated in FIG. 103.

FIG. 105 is a planar view of a resonator according to embodiments.

FIG. 106 is a planar view of a resonator according to embodiments.

FIG. 107 is a cross-sectional view of the resonator illustrated in FIG. 106.

FIG. 108 is a planar view of a wireless communication module according to embodiments.

FIG. 109 is a planar view of a wireless communication module according to embodiments.

FIG. 110 is a cross-sectional view of the wireless communication module illustrated in FIG. 109.

Figure 111:
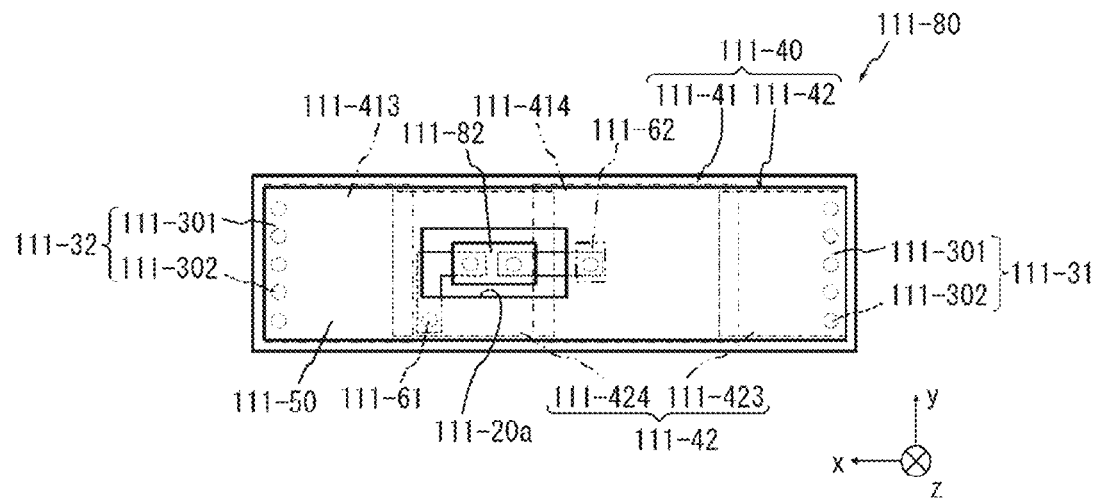

FIG. 111 is a planar view of a wireless communication module according to embodiments.

Figure 112:
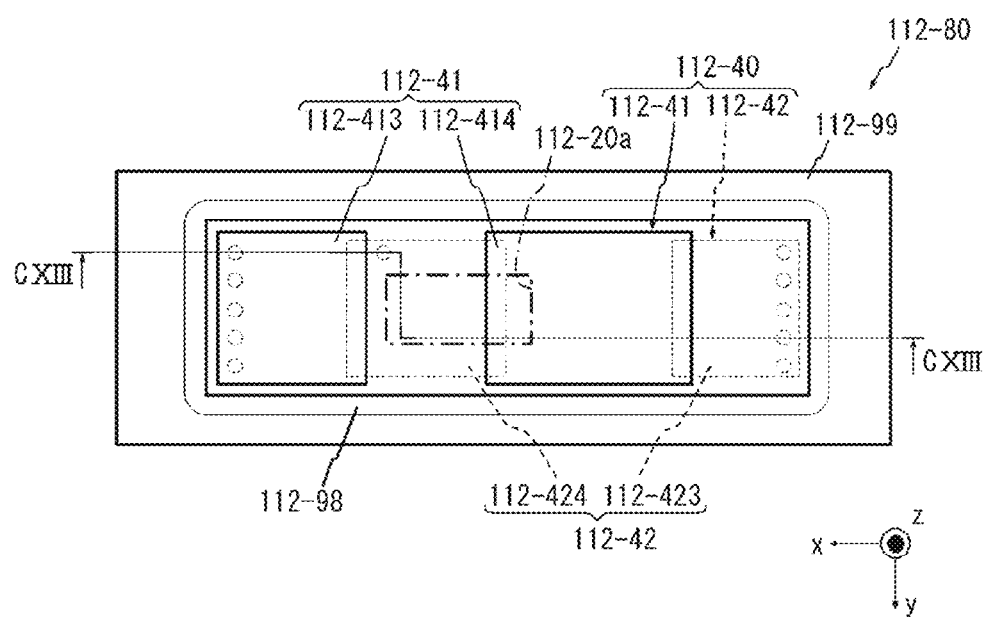

FIG. 112 is a planar view of a wireless communication module according to embodiments.

Figure 113:
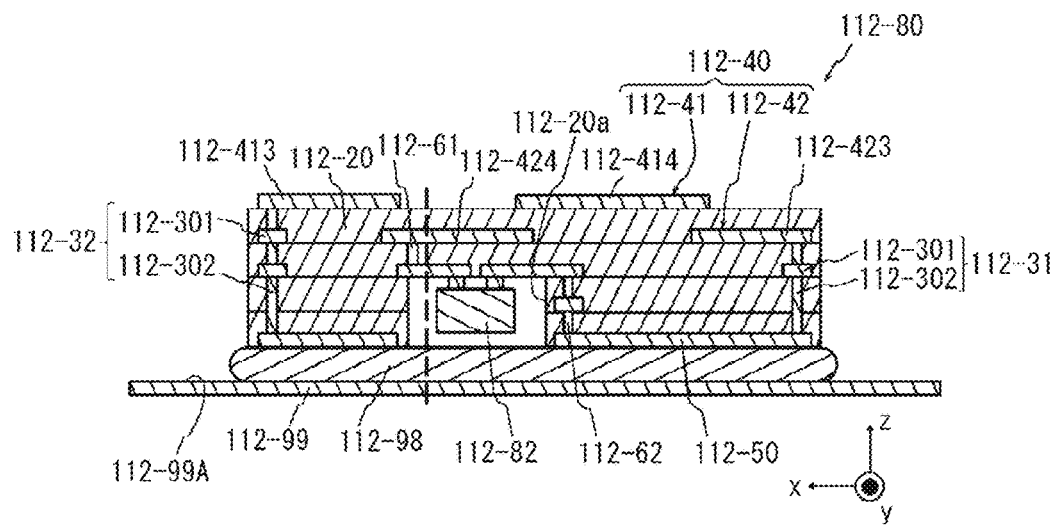

FIG. 113 is a cross-sectional view of the wireless communication module illustrated in FIG. 112.

Figure 114:
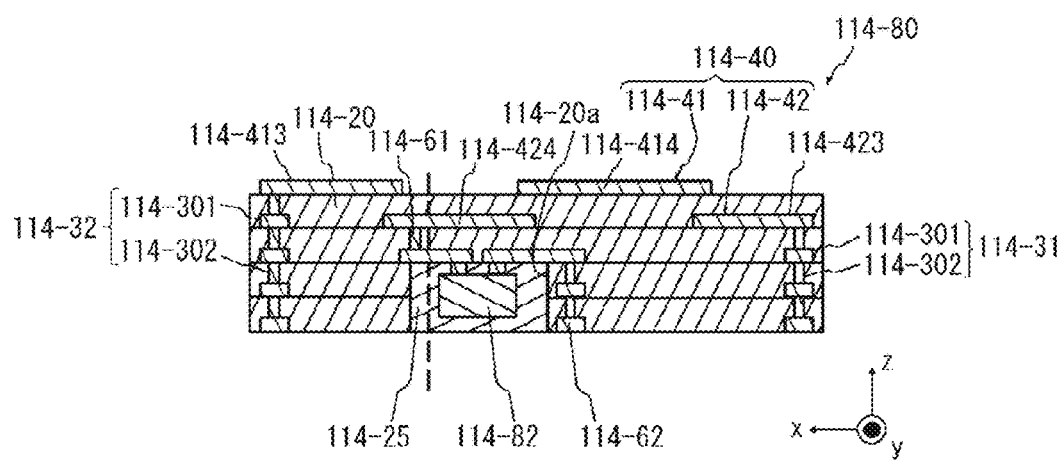

FIG. 114 is a cross-sectional view of a wireless communication module according to embodiments.

Figure 115:
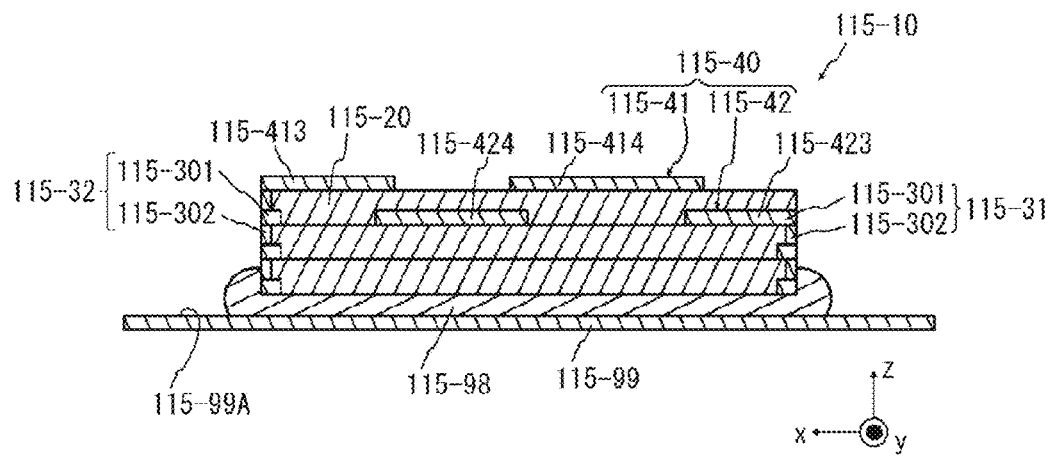

FIG. 115 is a cross-sectional view of a resonator according to embodiments.

Figure 116:
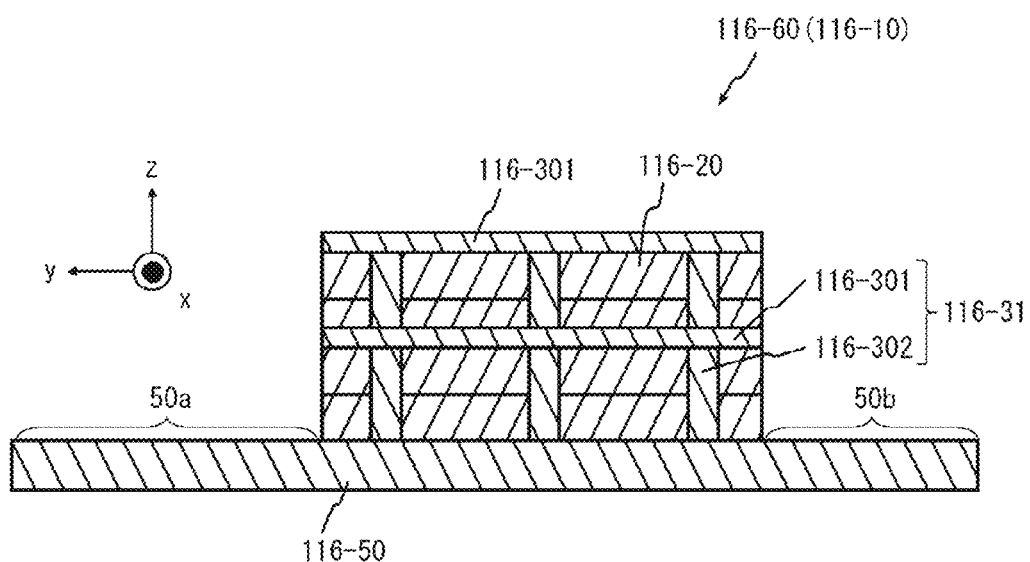

FIG. 116 is a cross-sectional view of a resonance structure according to embodiments.

Figure 117:
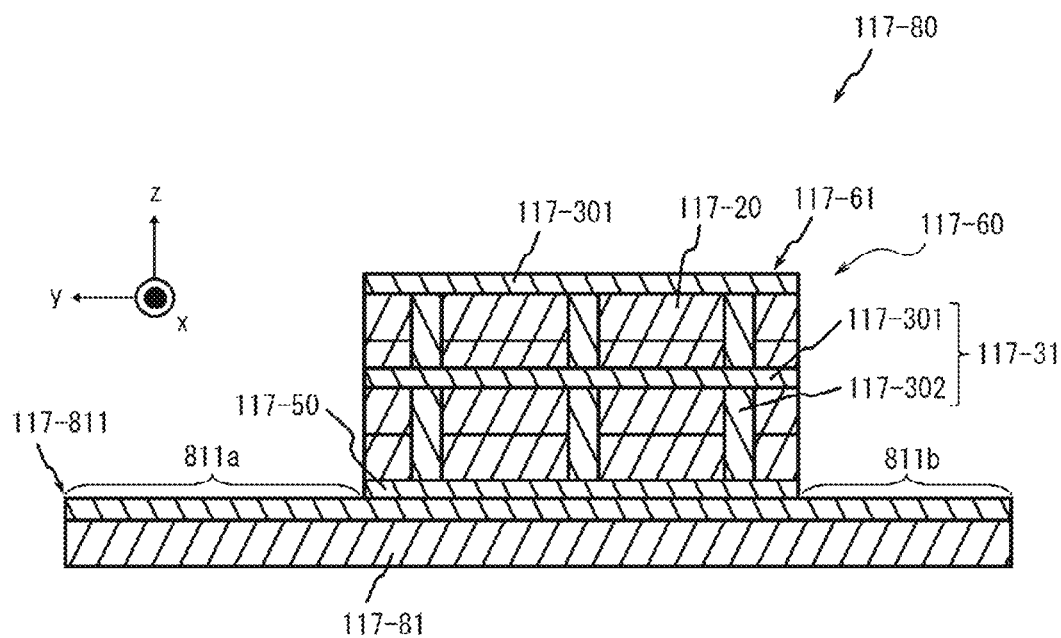

FIG. 117 is a cross-sectional view of a resonance structure according to embodiments.

Figure 118:
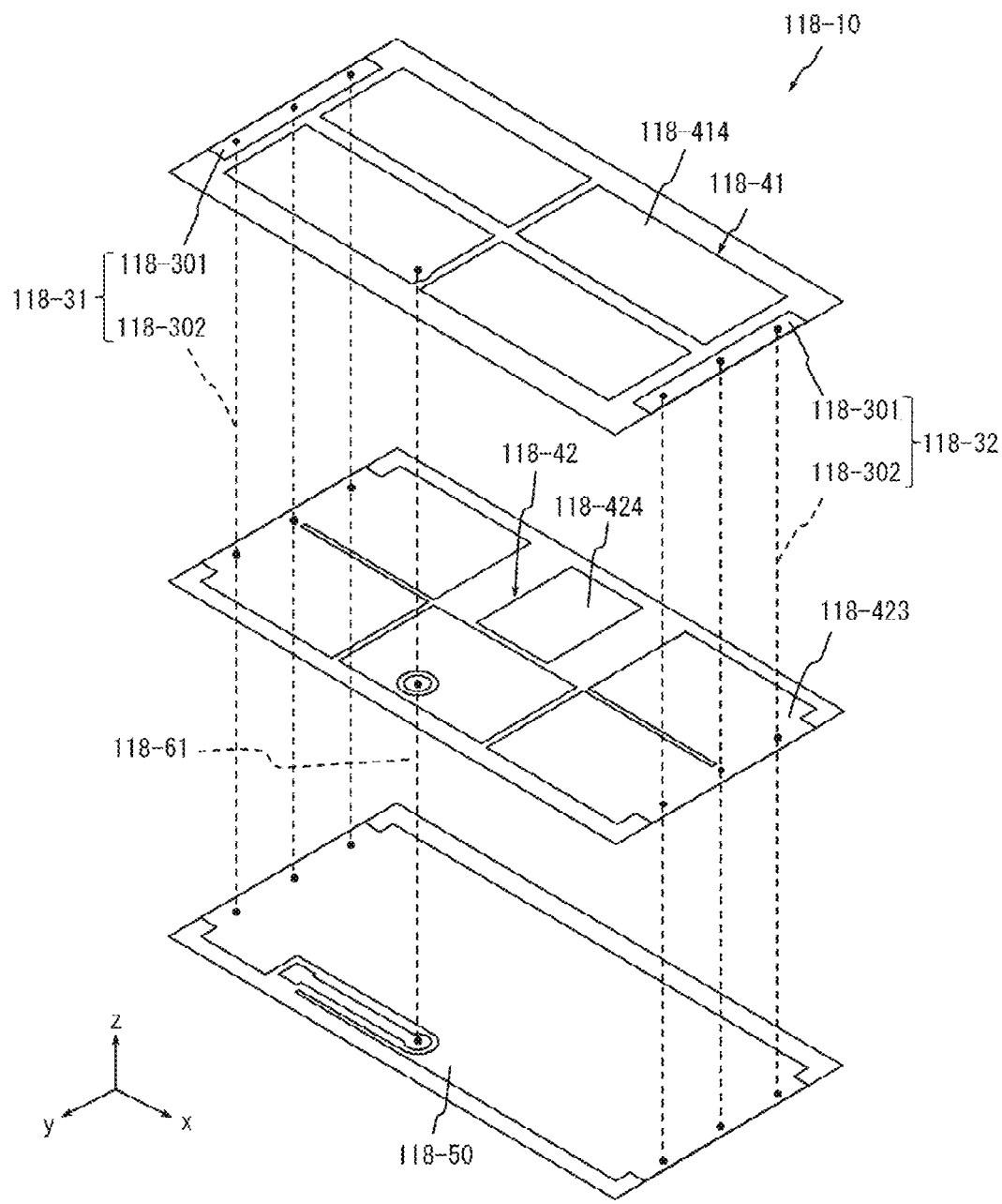

FIG. 118 is a perspective view of the conductor shape of a first antenna used in a simulation.

Figure 119:
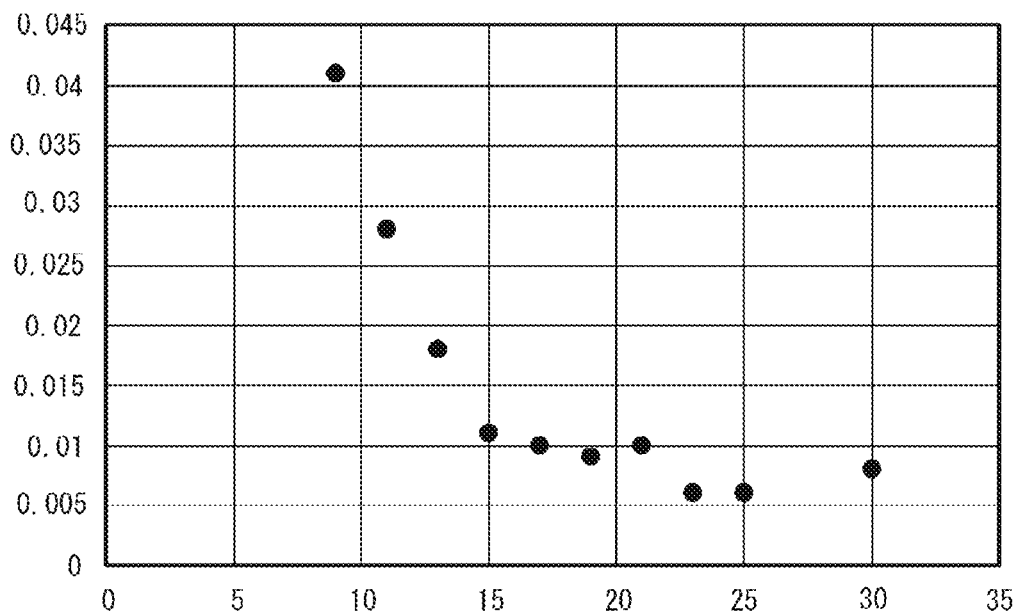

FIG. 119 is a graph corresponding to the result given in Table 1.

Figure 120:
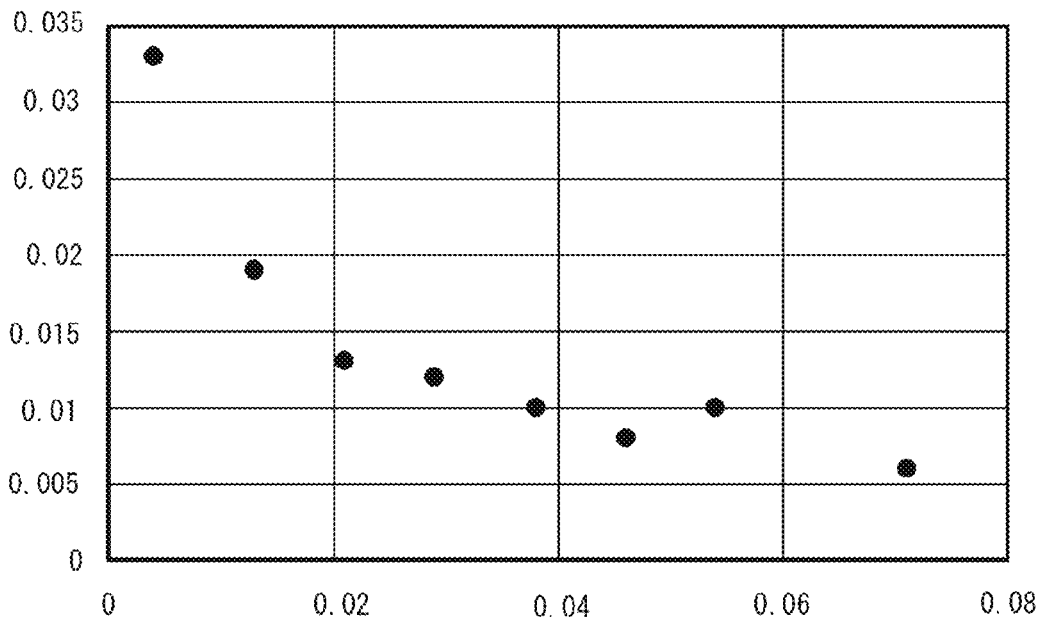

FIG. 120 is a graph corresponding to the result given in Table 2.

Figure 121:
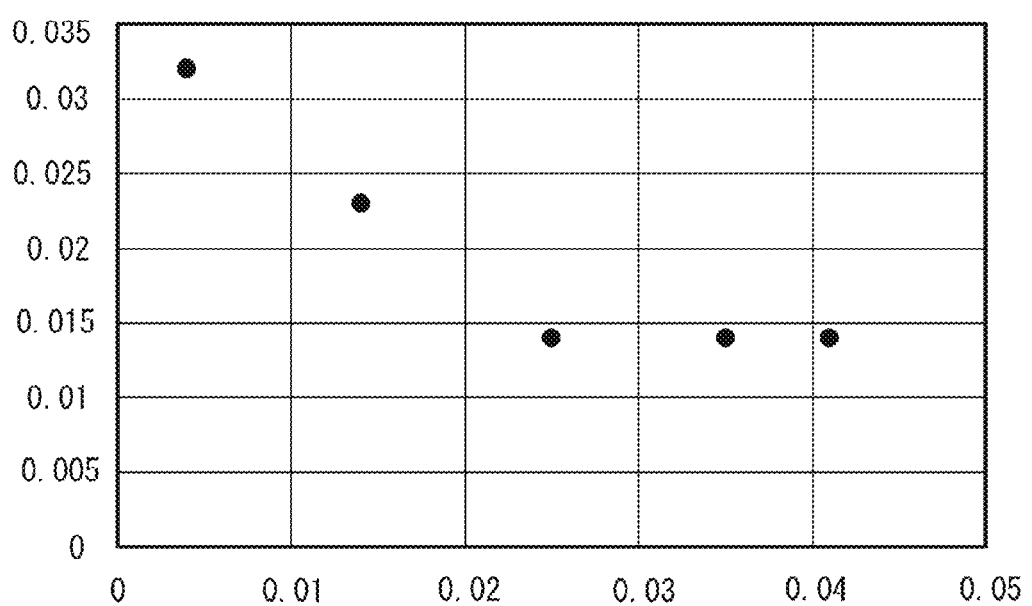

FIG. 121 is a graph corresponding to the result given in Table 3.

Figure 122:
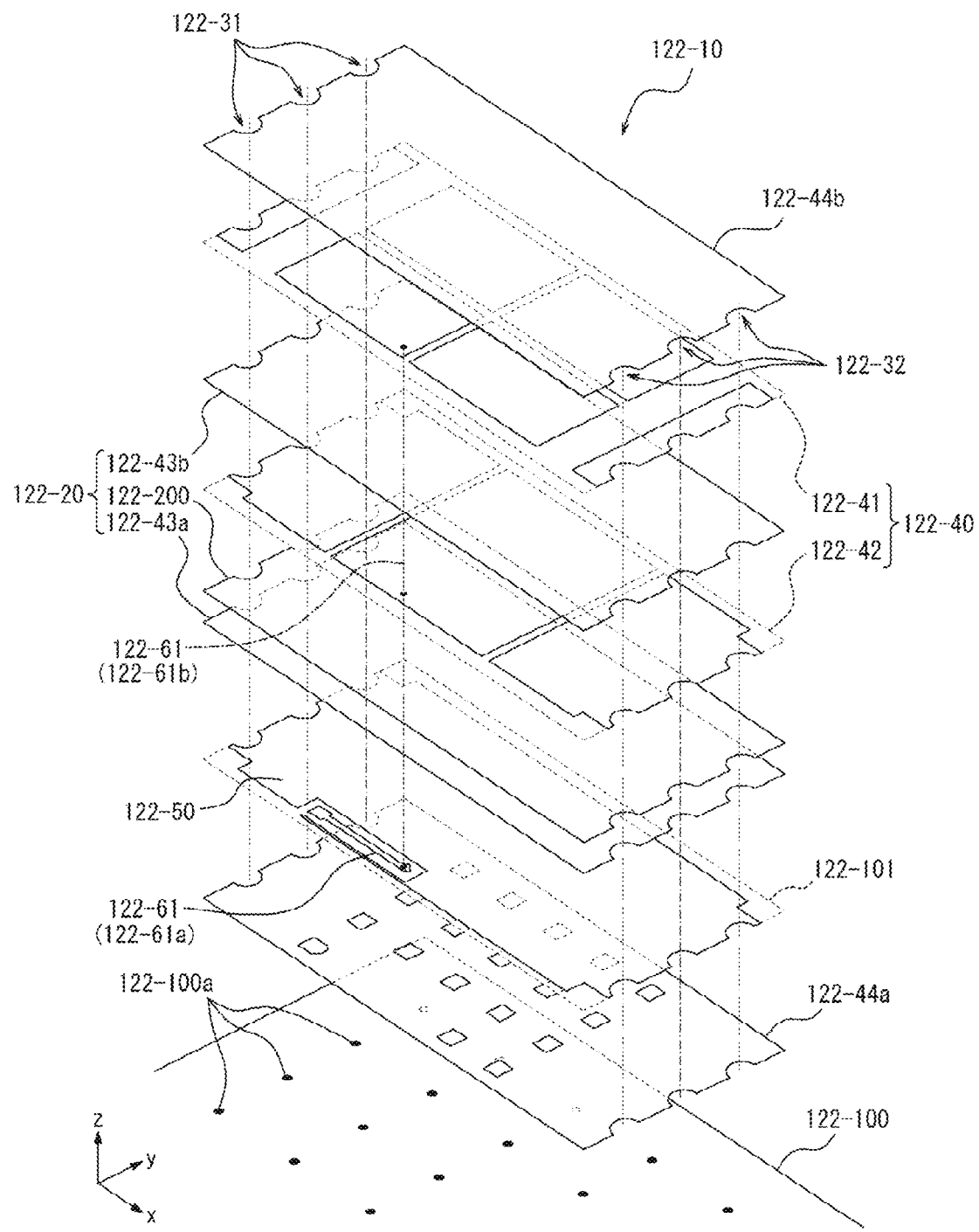

FIG. 122 is a perspective view for explaining a hierarchical structure of a resonator mounted on a board.

Figure 123:
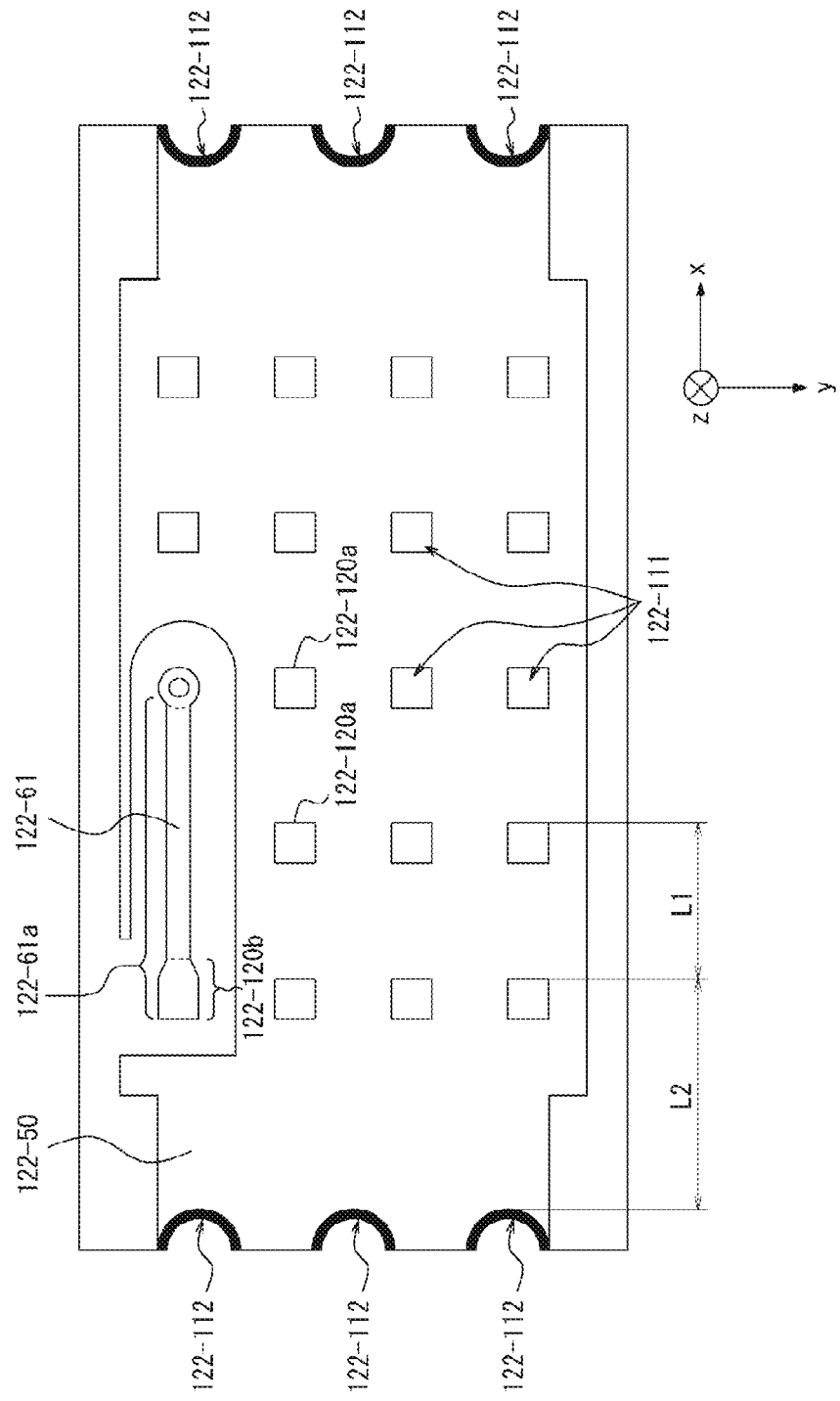

FIG. 123 is a planar view of the resonator illustrated in FIG. 122.

Figure 124:
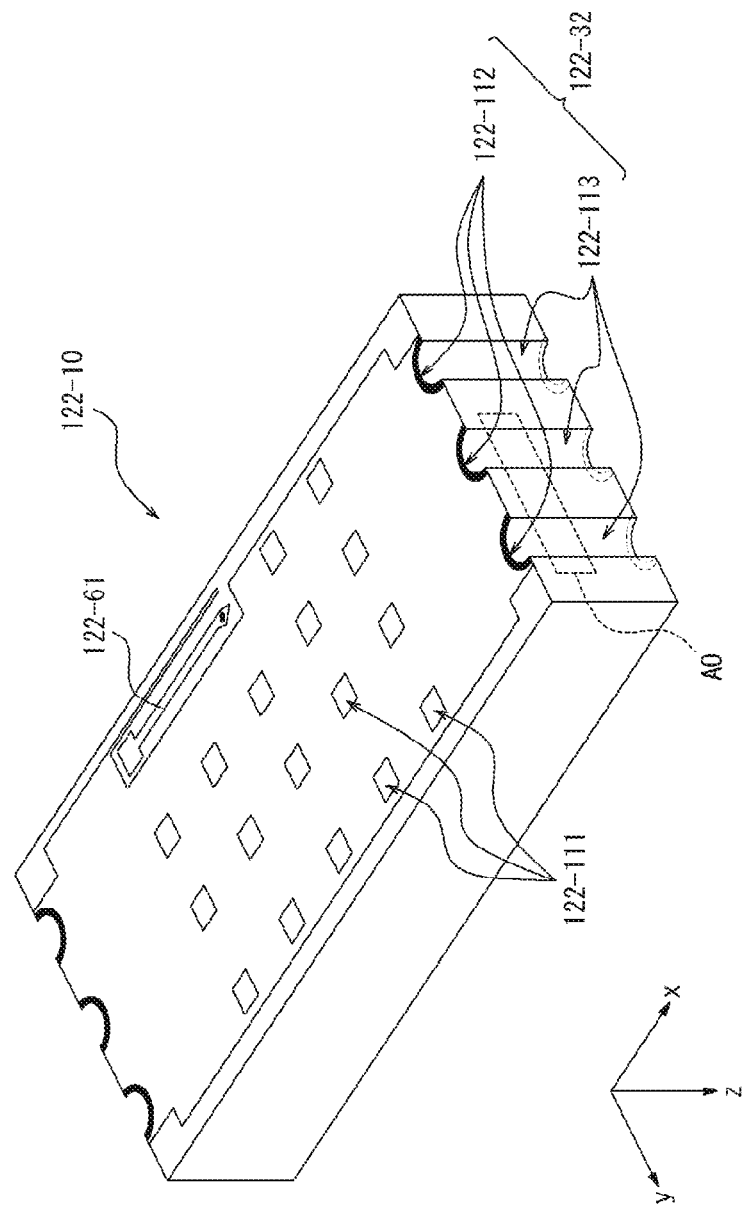

FIG. 124 is a cross sectional view of the resonator illustrated in FIG. 122.

Figure 125:
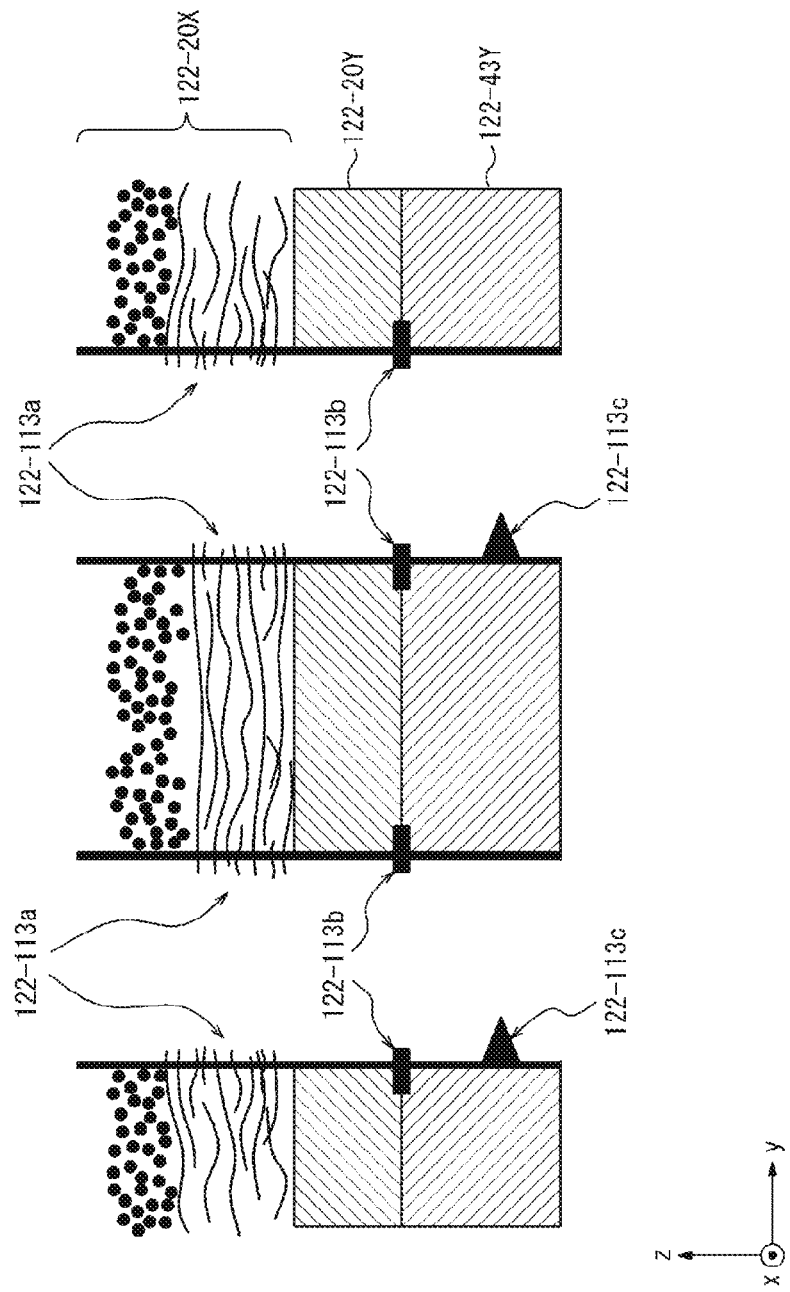

FIG. 125 is an enlarged view of an area A0 illustrated in FIG. 124.

Figure 126:
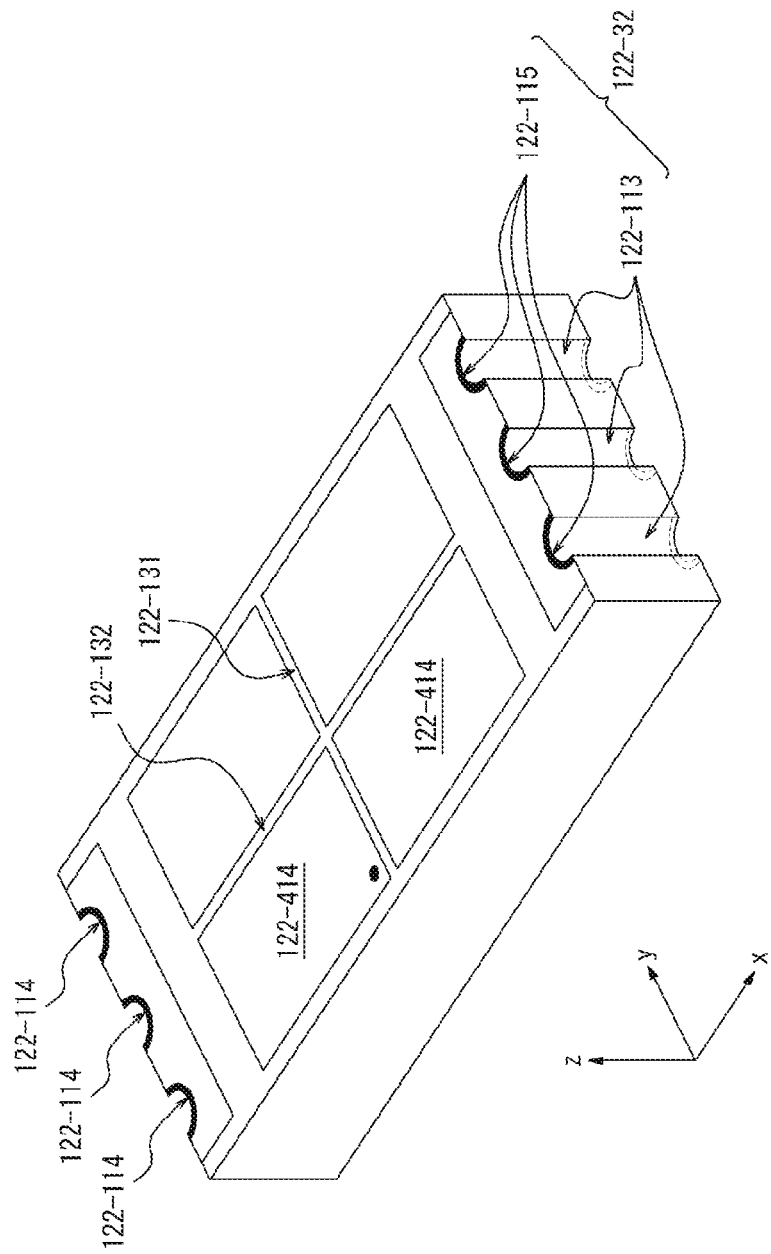

FIG. 126 is a perspective view of the resonator illustrated in FIG. 122.

Figure 127:
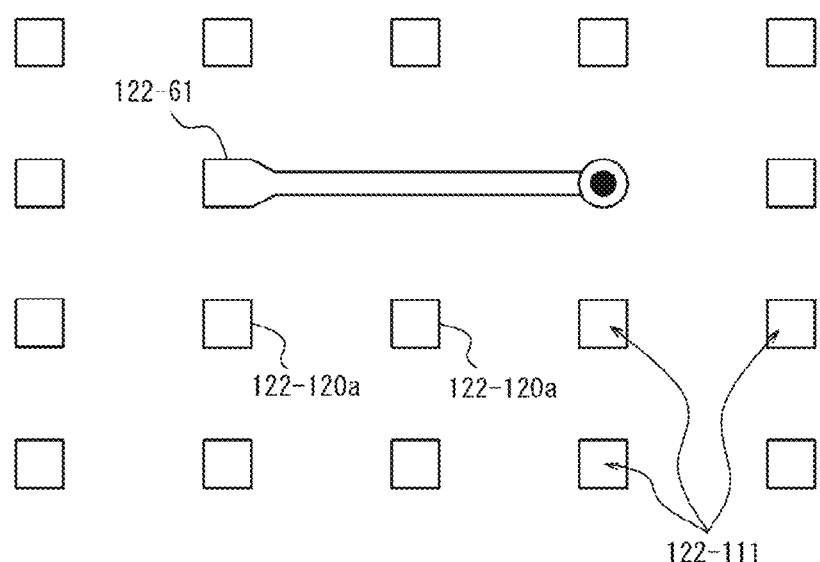

FIG. 127 is a diagram illustrating another example of a position of a feeding line in the resonator illustrated in FIG. 122.

DESCRIPTION OF EMBODIMENTS

According to a conventional art, a large number of resonators need to be arranged side by side.

The present disclosure relates to providing a new type of structure that resonates at a predetermined frequency, an antenna, a wireless communication module, and a wireless communication device.

According to the structure, the antenna, the wireless communication module, and the wireless communication device of the present disclosure, the influence of the reflected waves are less affected by reflected waves from a metallic conductor.

Given below is the explanation of embodiments of the present disclosure. Regarding the constituent elements illustrated in FIGS. 1 to 127, the constituent elements corresponding to already-illustrated constituent elements are referred to with common reference numerals, along with prefixes indicating the respective drawing numbers. A resonance structure can include a resonator.

Alternatively, a resonance structure includes a resonator and other members, and can be implemented in a composite manner. In the following explanation given with reference to FIGS. 1 to 64, when constituent elements need not be particularly distinguished, the constituent elements will be referred to by the common reference numeral. A resonator 10 illustrated in FIGS. 1 to 64 includes a base 20, pair conductors 30, third conductors 40, and a fourth conductor 50. The base 20 is in contact with the pair conductors 30, the third conductors 40, and the fourth conductor 50. The resonator 10 is configured such that the pair conductors 30, the third conductors 40, and the fourth conductor 50 function as a resonator. The resonator 10 is capable of resonating at a plurality of resonance frequencies. One of the resonance frequencies of the resonator 10 is assumed to be a first frequency $f_1$. The first frequency $f_1$ has a wavelength $\lambda_1$. In the resonator 10, at least one of the resonance frequencies can be treated as the operating frequency. In the resonator 10, the first frequency $f_1$ is treated as the operating frequency.

The base 20 can contain either a ceramic material or a resin material as a composition. A ceramic material includes an aluminum oxide sintered compact, an aluminum nitride sintered compact, a mullite sintered compact, a glass ceramic sintered compact, a crystalized glass formed by depositing a crystalline component in a glass matrix, and a microcrystalline sintered compact such as mica or aluminum titanate. A resin material includes a material obtained by curing an uncured material such as an epoxy resin, a polyester resin, a polyimide resin, a polyamide-imide resin, a polyetherimide resin, and a liquid crystal polymer.

The pair conductors 30, the third conductors 40, and the fourth conductor 50 can includes, as a composite, any of a metallic material, a metallic alloy, a hardened material of metallic paste, and a conductive polymer. The pair conductors 30, the third conductors 40, and the fourth conductor 50 can all be made of the same material. The pair conductors 30, the third conductors 40, and the fourth conductor 50 can all be made of different materials. Any combination of the pair conductors 30, the third conductors 40, and the fourth conductor 50 can be made of the same material. The metallic material includes copper, silver, palladium, gold, platinum, aluminum, chromium, nickel, cadmium-lead, selenium, manganese, tin, vanadium, lithium, cobalt, titanium, and the like. An alloy includes a plurality of metallic materials. The metallic paste includes a paste formed by kneading the powder of a metallic material along with an organic solvent and a binder. The binder includes an epoxy resin, a polyester resin, a polyimide resin, a polyamide-imide resin, and a polyetherimide resin. The conductive polymer includes a polythiophene polymer, a polyacetylene polymer, a polyaniline polymer, polypyrrole polymer, and the like.

The resonator 10 includes two pair conductors 30. The pair conductors 30 include a plurality of conductors. The pair conductors 30 include a first conductor 31 and a second conductor 32. The pair conductors 30 can include three or more conductors. Each conductor of the pair conductors 30 is separated from the other conductor in a first direction. In the conductors of the pair conductors 30, one conductor can be paired with another conductor. Each conductor of the pair conductors 30 can be seen as an electrical conductor from the resonator present between the paired conductors. The first conductor 31 is located away from the second conductor 32 in the first direction. The conductors 31 and 32 extend along a second plane that intersects with the first direction.

In the present disclosure, the first direction (first axis) is represented as an x direction. In the present disclosure, a third direction (third axis) is represented as a y direction. In the present disclosure, a second direction (second axis) is represented as a z direction. In the present disclosure, a first plane is represented as an x-y plane. In the present disclosure, the second plane is represented as a y-z plane. In the present disclosure, a third plane is represented as a z-x plane. These planes are planes in a coordinate space, and do not represent a specific plate or a specific surface. In the present disclosure, a area in the x-y plane may be referred to as a first area. In the present disclosure, the area in the y-z plane may be referred to as a second area. In the present disclosure, the area in the z-x plane may be referred to as a third area. The area can be measured in the unit of square meters or the like. In the present disclosure, a length in the x direction may be simply referred to as the "length". In the present disclosure, the length in the y direction may be simply referred to as the "width". In the present disclosure, a length in the z direction may be simply referred to as a "height".

In an example, the conductors 31 and 32 are positioned at respective ends of the base 20 in the x direction. A part of each of the conductors 31 and 32 can face the outside of the base 20. A part of each of the conductors 31 and 32 can be present inside the base 20, and another part thereof can be present outside the base 20. Each of the conductors 31 and 32 can be present within the base 20.

The third conductor 40 is configured to function as a resonator. The third conductor 40 can include a resonator of at least either the line type, or the patch type, or the slot type. In an example, the third conductor 40 is positioned on the base 20. In an example, the third conductor 40 is positioned at an end of the base 20 in the z direction. In an example, the third conductor 40 can be present within the base 20. A part of the third conductor 40 can be present inside the base 20, and another part can be present outside the base 20. A part of the surface of the third conductor 40 can face the outside of the base 20.

The third conductor 40 includes at least one conductor. The third conductor 40 can include a plurality of conductors. When the third conductor 40 includes a plurality of conductors, the third conductor 40 can be referred to as a third conductor group. The third conductor 40 includes at least one conductive layer. The third conductor 40 includes at least one conductor in one conductive layer. The third conductor 40 can include a plurality of conductive layers. For example, the third conductor 40 can include three or more conductive layers. The third conductor 40 includes at least one conductor in each of the plurality of conductive layers. The third conductor 40 extends along the x-y plane. The x-y plane includes the x direction. Each conductive layer of the third conductor 40 extends along the x-y plane.

In an example according to embodiments, third conductor 40 includes a first conductive layer 41 and a second conductive layer 42. The first conductive layer 41 expands along the x-y plane. The first conductive layer 41 can be present on the base 20. The second conductive layer 42 expands along the x-y plane. The second conductive layer 42 can be configured to be capacitively coupled with the first conductive layer 41. The second conductive layer 42 can be configured to be electrically connected to the first conductive layer 41. The two capacitively-coupled conductive layers can face each other in the y direction. Two capacitively-coupled conductive layers can face each other in the x direction. The two capacitively-coupled conductive layers can face each other on the first plane. The two conductive layers facing each other on the first plane can be rephrased as two conductors being present in one conductive layer. The second conductive layer 42 can be positioned so that at least a part thereof overlaps the first conductive layer 41 in the z direction. The second conductive layer 42 can be present within the base 20.

The fourth conductor 50 is positioned away from the third conductors 40. The fourth conductor 50 is configured to be electrically connected to the conductors 31 and 32 of the pair conductors 30. The fourth conductor 50 is configured to be electrically connected to the first conductor 31 and the second conductor 32. The fourth conductor 50 extends along the third conductors 40. The fourth conductor 50 extends along the first plane. The fourth conductor 50 spans from the first conductor 31 to the second conductor 32. The fourth conductor 50 is positioned on the base 20. The fourth conductor 50 can be present in the base 20. A part of the fourth conductor 50 can be present inside the base 20, and another part thereof can be present outside the base 20. A part of the surface of the fourth conductor 50 can face the outside of the base 20.

In an example according to embodiments, the fourth conductor 50 can be configured to function as a ground conductor in the resonator 10. The fourth conductor 50 can serve as a reference point of potential of the resonator 10. The fourth conductor 50 can be connected to the ground of a device that includes the resonator 10.

In an example according to embodiments, the resonator 10 can include the fourth conductor 50 and a reference potential layer 51. The reference potential layer 51 is positioned away from the fourth conductor 50 in the z direction. The reference potential layer 51 is electrically insulated from the fourth conductor 50. The reference potential layer 51 can serve as a reference point of potential of the resonator 10. The reference potential layer 51 can be configured to be electrically connected to the ground of the device that includes the resonator 10. The fourth conductor 50 can be electrically separated from the ground of the device that includes the resonator 10. The reference potential layer 51 faces either the third conductors 40 or the fourth conductor 50 in the z direction.

In an example according to embodiments, the reference potential layer 51 faces the third conductors 40 via the fourth conductor 50. The fourth conductor 50 is positioned between the third conductors 40 and the reference potential layer 51. The spacing between the reference potential layer 51 and the fourth conductor 50 is shorter than the spacing between the third conductors 40 and the fourth conductor 50.

In the resonator 10 that includes the reference potential layer 51, the fourth conductor 50 can include one or more conductors. In the resonator 10 that includes the reference potential layer 51, the fourth conductor 50 can include one or more conductors, and the third conductor 40 can serve as one conductor connected to the pair conductors 30. In the resonator 10 that includes the reference potential layer 51, each of the third conductor 40 and the fourth conductor 50 can include at least one resonator.

In the resonator 10 that includes the reference potential layer 51, the fourth conductor 50 can include a plurality of conductive layers. For example, the fourth conductor 50 can include a third conductive layer 52 and a fourth conductive layer 53. The third conductive layer 52 can be configured to be capacitively coupled with the fourth conductive layer 53. The third conductive layer 52 can be configured to be electrically connected to the first conductive layer 41. The two capacitively-coupled conductive layers can face each other in the y direction. The two capacitively-coupled conductive layers can face each other in the x direction. The two capacitively-coupled conductive layers can be positioned to be mutually opposite within the x-y plane.

The distance between the two capacitively-coupled conductive layers facing each other in the z direction is shorter than the distance between the concerned conductor group and the reference potential layer 51. For example, the distance between the first conductive layer 41 and the second conductive layer 42 is shorter than the distance between the third conductor 40 and the reference potential layer 51. For example, the distance between the third conductive layer 52 and the fourth conductive layer 53 is shorter than the distance between the fourth conductor 50 and the reference potential layer 51.

Each of the first conductor 31 and the second conductor 32 can include one or more conductors. Each of the first conductor 31 and the second conductor 32 can serve as one conductor. Each of the first conductor 31 and the second conductor 32 can include a plurality of conductors. Each of the first conductor 31 and the second conductor 32 can include at least one fifth conductive layer 301 and a plurality of fifth conductors 302. The pair conductors 30 include at least one fifth conductive layer 301 and a plurality of fifth conductors 302.

The fifth conductive layer 301 extends along the y direction. The fifth conductive layer 301 extends in the x-y plane. The fifth conductive layer 301 represents a layered conductor. The fifth conductive layer 301 can be positioned on the base 20. The fifth conductive layer 301 can be positioned within the base 20. The plurality of fifth conductive layers 301 are separated from each other in the z direction. The plurality of fifth conductive layers 301 are arranged in the z direction. The plurality of fifth conductive layers 301 partially overlap with each other in the z direction. The fifth conductive layers 301 are configured to electrically connect a plurality of fifth conductors 302. The fifth conductive layers 301 serve as connecting conductors for connecting a plurality of fifth conductors 302. The fifth conductive layers 301 can be configured to be electrically connected to any conductive layer of the third conductors 40. According to one embodiment, the fifth conductive layers 301 are configured to be electrically connected to the second conductive layer 42. The fifth conductive layers 301 can be integrated with the second conductive layer 42. According to one embodiment, the fifth conductive layers 301 can be configured to be electrically connected to the fourth conductor 50. The fifth conductive layers 301 can be integrated with the fourth conductor 50.

Each of the fifth conductors 302 extends in the z direction. The plurality of fifth conductors 302 are separated from each other in the y direction. The distance between two fifth conductors 302 is equal to or less than ½ of the wavelength $\lambda_1$. When the distance between the two fifth conductors 302 configured to be electrically connected is equal to or less than ½ of the wavelength $\lambda_1$, each of the first conductor 31 and the second conductor 32 enables achieving reduction in the leakage of the electromagnetic waves in a resonance frequency band from the gaps among the fifth conductors 302. Since leakage of the electromagnetic waves in the resonance frequency band, the pair conductors 30 are seen as electric conductors from a unit structure. At least some of the plurality of fifth conductors 302 are configured to be electrically connected to the fourth conductor 50. According to one embodiment, some of the plurality of fifth conductors 302 can be configured to electrically connect the fourth conductor 50 to the fifth conductive layer 301. According to one embodiment, the plurality of fifth conductors 302 can be configured to be electrically connected to the fourth conductor 50 via the fifth conductive layers 301. Some of the plurality of fifth conductors 302 can be configured to electrically connect one fifth conductive layer 301 to another fifth conductive layer 301. As the fifth conductors 302, it is possible to use via conductors and through-hole conductors.

The resonator 10 includes the third conductor 40 that is configured to function as a resonator. The third conductor 40 can be configured to function as an artificial magnetic conductor (AMC). An artificial magnetic conductor can also be called a reactive impedance surface (RIS).

The resonator 10 includes the third conductor 40, which is configured to function as a resonator, between two pair conductors 30 facing each other in the x direction. The two pair conductors 30 can be seen as electric conductors extending in the y-z plane from the third conductors 40. The resonator 10 is electrically opened at both ends in the y direction. The resonator 10 has high impedance in the z-x planes at both ends in the y direction. From the third conductors 40, the z-x planes at both ends of the resonator 10 in the y direction can be seen as magnetic conductors. In the resonator 10. Since the resonator 10 is surrounded by two electric conductors and two high-impedance surfaces (magnetic conductors), the resonators of the third conductors 40 have the artificial magnetic conductor character in the z direction. As a result of being surrounded by two electric conductors and two high-impedance surfaces, the resonators of the third conductors 40 have the artificial magnetic conductor character in finite number.

The "artificial magnetic conductor character" implies that there is a phase difference of 0 degrees between incident waves and reflected waves at the operating frequency. In the resonator 10, there is a phase difference of 0 degrees between the incident waves and the reflected waves at a first frequency $f_1$. Regarding the "artificial magnetic conductor character", in an operating frequency band, there is a phase difference in the range of −90 degrees to +90 degrees between the incident waves and the reflected waves. The operating frequency band is a frequency band between a second frequency $f_2$ and a third frequency $f_3$. The second frequency $f_2$ is a frequency at which there is a phase difference of +90 degrees between the incident waves and the reflected waves. The third frequency $f_3$ is a frequency at which there is a phase difference of −90 degrees between the incident waves and the reflected waves. The width of the operating frequency band as decided based on the second frequency and the third frequency can be, for example, 100 MHz or more when the operating frequency is approximately 2.5 GHz. The width of the operating frequency band can be, for example, 5 MHz. or more when the operating frequency is approximately 400 MHz.

The operating frequency of the resonator 10 can be different from the resonance frequency of each resonator of the third conductors 40. The operating frequency of the resonator 10 can vary depending on the length, the size, the shape, and the material of the base 20, the pair conductors 30, the third conductors 40, and the fourth conductor 50.

In an example according to embodiments, the third conductor 40 can include at least one unit resonator 40X. The third conductor 40 can include one unit resonator 40X. The third conductor 40 can include a plurality of unit resonators 40X. The unit resonator 40X is positioned in an overlapping manner with the fourth conductor 50 in the z direction. The unit resonator 40X faces the fourth conductor 50. The unit resonator 40X can be configured to function as a frequency selective surface (FSS). The plurality of unit resonators 40X are arranged along the x-y plane. The plurality of unit resonators 40X can be regularly arranged in the x-y plane. The unit resonators 40X can be arranged in a form of a square grid, an oblique grid, a rectangular grid, or a hexagonal grid.

The third conductor 40 can include a plurality of conductive layers arranged in the z direction. Each of the plurality of conductive layers of the third conductor 40 includes at least one unit resonator. For example, the third conductor 40 includes the first conductive layer 41 and the second conductive layer 42.

The first conductive layer 41 includes at least one first unit resonator 41X. The first conductive layer 41 can include one first unit resonator 41X. The first conductive layer 41 can include a plurality of first divisional resonators 41Y formed by dividing one first unit resonator 41X. The plurality of first divisional resonators 41Y can constitute at least one first unit resonator 41X with adjacent unit structures 10X. The plurality of first divisional resonators 41Y are positioned at the end portions of the first conductive layer 41. The first unit resonator 41X and the first divisional resonator 41Y can be called a third conductor.

The second conductive layer 42 includes at least one second unit resonator 42X. Thus, the second conductive layer 42 can include one second unit resonator 42X. The second conductive layer 42 can include a plurality of second divisional resonators 42Y formed by dividing one second unit resonator 42X. The plurality of second divisional resonators 42Y can constitute at least one second unit resonator 42X with adjacent unit structures 10X. The plurality of second divisional resonators 42Y are positioned at the end portions of the second conductive layer 42. The second unit resonator 42X and the second divisional resonator 42Y can be called a third conductor.

The second unit resonator 42X and the second divisional resonators 42Y are positioned so as to at least partially overlap the first unit resonator 41X and the first divisional resonators 41Y in the z direction. In third conductor 40, the unit resonator and the divisional resonators in each layer at least partially overlap in the z direction to constitute one unit resonator 40X. The unit resonator 40X includes at least one unit resonator in each layer.

When the first unit resonator 41X includes a resonator of the line type or the patch type, the first conductive layer 41 includes at least one first unit conductor 411. The first unit conductor 411 can be configured to function as the first unit resonator 41X or the first divisional resonator 41Y. The first conductive layer 41 includes a plurality of first unit conductors 411 arranged in "n" number of rows and "m" number of columns in the x and y directions. Herein, "n" and "m" are mutually independent natural numbers of 1 or greater. In an example illustrated in FIGS. 1 to 9 and the like, the first conductive layer 41 includes six first unit conductors 411 arranged in form of a grid of two rows and three columns. The first unit conductors 411 can be arranged in a form of a square grid, an oblique grid, a rectangular grid, or a hexagonal grid. The first unit conductors 411 that are equivalent to the first divisional resonators 41Y are positioned at the end portions in the x-y plane of the first conductive layer 41.

When the first unit resonator 41X is a resonator of the slot type, at least one conductive layer of the first conductive layer 41 extends in the x and y directions. The first conductive layer 41 includes at least one first unit slot 412. The first unit slot 412 can be configured to function as the first unit resonator 41X or the first divisional resonator 41Y. The first conductive layer 41 can include a plurality of first unit slots 412 arranged in "n" number of rows and "m" number of columns in the x and y directions. Herein, "n" and "m" are mutually independent natural numbers of 1 or greater. In an example illustrated in FIGS. 6 to 9 and the like, the first conductive layer 41 includes six first unit slots 412 arranged in a gird of two rows and three columns. The first unit slots 412 can be arranged in a square grid, an oblique grid, a rectangular grid, or a hexagonal grid. The first unit slots 412 that are equivalent to the first divisional resonators 41Y are positioned at the end portions in the x-y plane of the first conductive layer 41.

When the second unit resonator 42X includes a resonator of the line type or the patch type, the second conductive layer 42 includes at least one second unit conductor 421. The second conductive layer 42 can include a plurality of second unit conductors 421 arranged in the x and y directions. The second unit conductors 421 can be arranged in a form of a square grid, an oblique grid, a rectangular grid, or a hexagonal grid. The second unit conductor 421 can be configured to function as the second unit resonator 42X or the second divisional resonator 42Y. The second unit conductors 421 that are equivalent to the second divisional resonators 42Y are positioned at the end portions in the x-y plane of the second conductive layer 42.

The second unit conductor 421 at least partially overlaps with at least one of the first unit resonator 41X and the first divisional resonator 41Y in the z direction. The second unit conductor 421 can overlap with a plurality of first unit resonators 41X. The second unit conductor 421 can overlap with a plurality of first divisional resonators 41Y. The second unit conductor 421 can overlap with one first unit resonator 41X and four first divisional resonators 41Y. The second unit conductor 421 can overlap with only one first unit resonator 41X. The center of gravity of the second unit conductor 421 can overlap with one first unit resonator 41X. The center of gravity of the second unit conductor 421 can be positioned between a plurality of first unit resonators 41X and the first divisional resonators 41Y. The center of gravity of the second unit conductor 421 can be positioned between two first unit resonators 41X arranged in the x direction or the y direction.

The second unit conductor 421 can at least partially overlap with two first unit conductors 411. The second unit conductor 421 can overlap with only one first unit conductor 411. The center of gravity of the second unit conductor 421 can be positioned between two first unit conductors 411. The center of gravity of the second unit conductor 421 can overlap with one first unit conductor 411. The second unit conductor 421 can at least partially overlap with the first unit slot 412. The second unit conductor 421 can overlap with only one first unit slot 412. The center of gravity of the second unit conductor 421 can be positioned between two first unit slots 412 arranged in the x direction or the y direction. The center of gravity of the second unit conductor 421 can overlap with one first unit slot 412.

When the second unit resonator 42X is a resonator of the slot type, at least one conductive layer of the second conductive layer 42 extends along the x-y plane. The second conductive layer 42 includes at least one second unit slot 422. The second unit slot 422 can be configured to function as the second unit resonator 42X or the second divisional resonator 42Y. The second conductive layer 42 can include a plurality of second unit slots 422 arranged in the x-y plane. The second unit slots 422 can be arranged in form of a square grid, an oblique grid, a rectangular grid, or a hexagonal grid. The second unit slots 422 that are equivalent to the second divisional resonators 42Y are positioned at the end portions in the x-y plane of the second conductive layer 42.

The second unit slot 422 at least partially overlaps with at least one of the first unit resonator 41X and the first divisional resonators 41Y in the y direction. The second unit slot 422 can overlap with a plurality of first unit resonators 41X. The second unit slot 422 can overlap with a plurality of first divisional resonators 41Y. The second unit slot 422 can overlap with one first unit resonator 41X and four first divisional resonators 41Y. The second unit slot 422 can overlap with only one first unit resonator 41X. The center of gravity of the second unit slot 422 can overlap with one first unit resonator 41X. The center of gravity of the second unit slot 422 can be positioned between a plurality of first unit resonators 41X. The center of gravity of the second unit slot 422 can be positioned between two first unit resonators 41X and the first divisional resonators 41Y arranged in the x direction or the y direction.

The second unit slot 422 can at least partially overlap with two first unit conductors 411. The second unit slot 422 can overlap with only one first unit conductor 411. The center of gravity of the second unit slot 422 can be positioned between two first unit conductors 411. The center of gravity of the second unit slot 422 can overlap with one first unit conductor 411. The second unit slot 422 can at least partially overlap with the first unit slot 412. The second unit slot 422 can overlap with only one first unit slot 412. The center of gravity of the second unit slot 422 can be positioned between two first unit slots 412 in the x direction or the y direction. The center of gravity of the second unit slot 422 can overlap with one first unit slot 412.

The unit resonator 40X includes at least one first unit resonator 41X and at least one second unit resonator 42X. The unit resonator 40X can include one first unit resonator 41X. The unit resonator 40X can include a plurality of first unit resonators 41X. The unit resonator 40X can include one first divisional resonator 41Y. The unit resonator 40X can include a plurality of first divisional resonators 41Y. The unit resonator 40X can include a part of the first unit resonator 41X. The unit resonator 40X can include one or more partial first unit resonators 41X. The unit resonator 40X includes a plurality of partial resonators from among one or more partial first unit resonators 41X and one or more first divisional resonators 41Y. The partial resonators included in the unit resonator 40X are fit in at least one first unit resonator 41X. The unit resonator 40X can include a plurality of first divisional resonators 41Y without including the first unit resonator 41X. The unit resonator 40X can include, for example, four first divisional resonators 41Y. The unit resonator 40X can include only a plurality of partial first unit resonators 41X. The unit resonator 40X can include one or more partial first unit resonators 41X and one or more first divisional resonators 41Y. The unit resonator 40X can include, for example, two partial first unit resonators 41X and two first divisional resonators 41Y. In the unit resonator 40X, the first conductive layers 41 included therein at both ends in the x direction can have a substantially identical mirror image. In the unit resonator 40X, the first conductive layers 41 included therein can be substantially symmetrical with respect to a center line extending in the z direction.

The unit resonator 40X can include one second unit resonator 42X. The unit resonator 40X can include a plurality of second unit resonators 42X. The unit resonator 40X can include one second divisional resonator 42Y. The unit resonator 40X can include a plurality of second divisional resonators 42Y. The unit resonator 40X can include a part of the second unit resonator 42X. The unit resonator 40X can include one or more partial second unit resonators 42X. The unit resonator 40X includes a plurality of partial resonators from one or more partial second unit resonators 42X and one or more second divisional resonators 42Y. The partial resonators included in the unit resonator 40X are fit in at least one second unit resonator 42X. The unit resonator 40X can include a plurality of second divisional resonators 42Y without including the second unit resonator 42X. The unit resonator 40X can include, for example, four second divisional resonators 42Y. The unit resonator 40X can include only a plurality of partial second unit resonators 42X. The unit resonator 40X can include one or more partial second unit resonators 42X and one or more second divisional resonators 42Y. The unit resonator 40X can include, for example, two partial second unit resonators 42X and two second divisional resonators 42Y. In the unit resonator 40X, the second conductive layers 42 included therein at both ends in the x direction can have a substantially identical mirror image. In the unit resonator 40X, the second conductive layers 42 included therein can be substantially symmetrical with respect to a center line extending in the y direction.

In an example according to embodiments, the unit resonator 40X includes one first unit resonator 41X and a plurality of partial second unit resonators 42X. For example, the unit resonator 40X includes one first unit resonator 41X and half of four second unit resonators 42X. Thus, the unit resonator 40X includes one first unit resonator 41X and two second unit resonators 42X. However, the configuration of the unit resonator 40X is not limited to that example.

The resonator 10 can include at least one unit structure 10X. Thus, the resonator 10 can include a plurality of unit structures 10X. The plurality of unit structures 10X can be arranged in the x-y plane. The plurality of unit structures 10X can be arranged in form of a square grid, an oblique grid, a rectangular grid, or a hexagonal grid. The unit structures 10X include any of repeated units of a square grid, an oblique grid, a rectangular grid, and a hexagonal grid. The unit structures 10X arranged infinitely along the x-y plane can be configured to function as an artificial magnetic conductor (AMC).

The unit structure 10X can include at least a part of the base 20, at least a part of the third conductor 40, and at least a part of the fourth conductor 50. The parts of the base 20, the third conductor 40, and the fourth conductor 50 that are included in the unit structure 10X overlap in the z direction. The unit structure 10X includes the unit resonator 40X, a part of the base 20 that overlaps with the unit resonator 40X in the z direction, and the fourth conductor 50 that overlaps with the unit resonator 40X in the z direction. For example, the resonator 10 can include six unit structures 10X in two rows and three columns.

The resonator 10 can include at least one unit structure 10X between two pair conductors 30 facing each other in the x direction. From the unit structure 10X, the two pair conductors 30 are seen as electric conductors extending in the y-z plane. The unit structure 10X electrically open at the ends in the y direction. The unit structure 10X has high impedance in the z-x planes at both ends in the y direction. From the unit structure 10X, the z-x planes at both ends in the y direction are seen as magnetic conductors. The unit structures 10X can be arranged in a repeated manner so as to be axisymmetric with respect to the z direction. The unit structure 10X surrounded by two electric conductors and two high-impedance surfaces (magnetic conductors) has an artificial magnetic conductor character in the z direction.

The unit structure 10X surrounded by two electric conductors and two high-impedance surfaces (magnetic conductors) has a finite number of artificial magnetic conductor characters.

The operating frequency of the resonator 10 can be different from the operating frequency of the first unit resonator 41X. The operating frequency of the resonator 10 can be different from the operating frequency of the second unit resonator 42X. The operating frequency of the resonator 10 can vary depending on the coupling of the first unit resonator 41X and the second unit resonator 42X constituting the unit resonator 40X.

The third conductor 40 can include the first conductive layer 41 and the second conductive layer 42. The first conductive layer 41 includes at least one first unit conductor 411. The first unit conductor 411 includes a first connecting conductor 413 and a first floating conductor 414. The first connecting conductor 413 is connected to any one of the pair conductors 30. The first floating conductor 414 is not connected to the pair conductors 30. The second conductive layer 42 includes at least one second unit conductor 421. The second unit conductor 421 includes a second connecting conductor 423 and a second floating conductor 424. The second connecting conductor 423 is connected to any of the pair conductors 30. The second floating conductor 424 is not connected to the pair conductors 30. The third conductor 40 can include the first unit conductor 411 and the second unit conductor 421.

The length of the first connecting conductor 413 along the x direction can be greater than the length of the first floating conductor 414. The length of the first connecting conductor 413 along the x direction can be smaller than the length of the first floating conductor 414. The first connecting conductor 413 can have half of the length of the first floating conductor 414 along the x direction. The length of the second connecting conductor 423 along the x direction can be greater than the length of the second floating conductor 424. The length of the second connecting conductor 423 along the x direction can be smaller than the length of the second floating conductor 424. The second connecting conductor 423 can have half of the length along the x direction as compared to the length of the second floating conductor 424.

The third conductor 40 can include a current path 40I that, when the resonator 10 is resonating, serves as a current path between the first conductor 31 and the second conductor 32. The current path 40I can be connected to the first conductor 31 and the second conductor 32. The current path 40I has capacitance between the first conductor 31 and the second conductor 32. The capacitance of the current path 40I is electrically connected in series between the first conductor 31 and the second conductor 32. In the current path 40I, conductors are separated between the first conductor 31 and the second conductor 32. The current path 40I can include a conductor connected to the first conductor 31 and a conductor connected to the second conductor 32.

According to embodiments, in the current path 40I, the first unit conductor 411 and the second unit conductor 421 partially face each other in the z direction. In the current path 40I, the first unit conductor 411 and the second unit conductor 421 are capacitively coupled. The first unit conductor 411 includes a capacitance component at an end portion in the x direction. The first unit conductor 411 can include a capacitance component at an end portion in the y direction that faces the second unit conductor 421 in the z direction. The first unit conductor 411 can include capacitance components at an end portion in the x direction that faces the second unit conductor 421 in the z direction and at an end portion in the y direction. The second unit conductor 421 includes a capacitance component at an end portion in the x direction. The second unit conductor 421 can include a capacitance component at an end portion in the y direction that faces the first unit conductor 411 in the z direction. The second unit conductor 421 can include capacitance components at an end portion in the x direction that faces the first unit conductor 411 in the z direction and at an end portion in the y direction.

In the resonator 10, a resonance frequency can be lowered by increasing the capacitive coupling in the current path 40I. In achieving a desired operating frequency, in the resonator 10, the capacitive coupling in the current path 40I can be increased so as to shorten its length along of the x direction. The third conductor 40 is configured in such a way that the first unit conductor 411 and the second unit conductor 421 face each other in a stacking direction of the base 20 and are capacitively coupled. In the third conductor 40, the capacitance between the first unit conductor 411 and the second unit conductor 421 can be adjusted by the area of a portion where the first unit conductor 411 and the second unit conductor 421 face each other.

According to embodiments, the length of the first unit conductor 411 in the y direction is different from the length of the second unit conductor 421 in the y direction. In the resonator 10, when a relative position of the first unit conductor 411 and the second unit conductor 421 shifts along the x-y plane from the ideal position, since the first unit conductor 411 and the second unit conductor 421 have different lengths along a third direction, the variation in the magnitude of the capacitance can be reduced.

According to embodiments, the current path 40I is made of one conductor, which is spatially separated from the first conductor 31 and the second conductor 32 and is configured to be capacitively coupled with the first conductor 31 and the second conductor 32.

According to embodiments, the current path 40I includes the first conductive layer 41 and the second conductive layer 42. The current path 40I includes at least one first unit conductor 411 and at least one second unit conductor 421. The current path 40I includes either two first connecting conductors 413, or two second connecting conductors 423, or one first connecting conductor 413 and one second connecting conductor 423. In the current path 40I, the first unit conductors 411 and the second unit conductors 421 can be alternately arranged along a first direction.

According to embodiments, the current path 40I includes the first connecting conductor 413 and the second connecting conductor 423. The current path 40I includes at least one first connecting conductor 413 and at least one second connecting conductor 423. In the current path 40I, the third conductor 40 has capacitance between the first connecting conductor 413 and the second connecting conductor 423. In an example according to embodiments, the first connecting conductor 413 can face the second connecting connector 423 to have capacitance. In an example according to embodiments, the first connecting conductor 413 can be configured to be capacitively connected to the second connecting conductor 423 via another conductor.

According to embodiments, the current path 40I includes the first connecting conductor 413 and the second floating conductor 424. The current path 40I includes two first connecting conductors 413. In the current path 40I, the third conductor 40 has capacitance between the two first connecting conductors 413. In an example according to embodiments, the two first connecting conductors 413 can be configured to be capacitively connected via at least one second floating conductor 424. In an example according to embodiments, the two first connecting conductors 413 can be configured to be capacitively connected via at least one first floating conductor 414 and a plurality of second floating conductors 424.

According to embodiments, the current path 40I includes the first floating conductor 414 and the second connecting conductor 423. The current path 40I includes two second connecting conductors 423. In the current path 40I, the third conductor 40 has capacitance between two second connecting conductors 423. In an example according to embodiments, the two second connecting conductors 423 can be configured to be capacitively connected via at least one first floating conductor 414. In an example according to embodiments, the two second connecting conductors 423 can be configured to be capacitively connected via a plurality of first floating conductors 414 and at least one second floating conductor 424.

According to embodiments, each of the first connecting conductor 413 and the second connecting conductor 423 can have a length equal to one-fourth of the wavelength $\lambda$ at a resonance frequency. Each of the first connecting conductor 413 and the second connecting conductor 423 can be configured to function as a resonator having half of the length of the wavelength $\lambda$. Each of the first connecting conductor 413 and the second connecting conductor 423 can oscillate in an odd mode or an even mode due to capacitive coupling of the respective resonators. The resonator 10 can have a resonance frequency in the even mode after capacitive coupling as the operating frequency.

The current path 40I can be connected to the first conductor 31 at a plurality of points. The current path 40I can be connected to the second conductor 32 at a plurality of points. The current path 40I can include a plurality of conductive paths that independently transmit electricity from the first conductor 31 to the second conductor 32.

In the second floating conductor 424 that is capacitively coupled with the first connecting conductor 413, the end of the second floating conductor 424 on the side of the capacitive coupling has a shorter distance to the first connecting conductor 413 than the distance to the pair conductors 30. In the first floating conductor 414 that is capacitively coupled with the second connecting conductor 423, the end of the first floating conductor 414 on the side of the capacitive coupling has a shorter distance to the second connecting conductor 423 than the distance to the pair conductors 30.

In the resonator 10 according to a plurality of embodiments, the conductive layers of the third conductor 40 can have mutually different lengths in the y direction. The conductive layer of the third conductor 40 is configured to be capacitively coupled with another conductive layer in the z direction. In the resonator 10, when the conductive layers have mutually different lengths in the y direction, even if the conductive layers shift in the y direction, change in the capacitance is small. In the resonator 10, since the conductive layers have mutually different lengths in the y direction, it becomes possible to widen an acceptable range of shifting of the conductive layers in the y direction.

In the resonator 10 according to embodiments, the third conductor 40 has capacitance attributed to capacitive coupling between the conductive layers. A plurality of capacitance portions having the capacitance can be arranged in the y direction. The plurality of capacitance portions arranged in the y direction can have an electromagnetically parallel relationship. The resonator 10 has a plurality of capacitance portions that are electrically arranged in parallel, so that the individual capacitance errors can be mutually complemented.

When the resonator 10 is in the resonating state, electric current flows through the pair conductors 30, the third conductors 40, and the fourth conductor 50 in a loop. When the resonator 10 is in the resonating state, an alternating current is flowing in the resonator 10. In the resonator 10, electric current flowing through the third conductors 40 is assumed to be a first current, and the electric current flowing to the fourth conductor 50 is assumed to be a second current. When the resonator 10 is in the resonating state, the first current and the second current flow in different directions along the x direction. For example, when the first current flows in the +x direction, the second current flows in the −x direction. For example, when the first current flows in the −x direction, the second current flows in the +x direction. That is, when the resonator 10 is in the resonating state, the loop electric current alternately flows in the +x direction and the −x direction. The resonator 10 is configured in such a way that electromagnetic waves are radiated as a result of repeated inversion of the loop electric current that creates the magnetic field.

According to embodiments, the third conductor 40 includes the first conductive layer 41 and the second conductive layer 42. In the third conductor 40, the first conductive layer 41 and the second conductive layer 42 are capacitively coupled. Hence, in the resonating state, the electric current is globally seen to be flowing in only one direction. According to embodiments, electric current flowing through each conductor has a higher density at the end portions in the y direction.

The resonator 10 is configured in such a way that the first current and the second current flow in a loop via the pair conductors 30. In the resonator 10; the first conductor 31, the second conductor 32, the third conductors 40, and the fourth conductor 50 serve as the resonance circuit. The resonance frequency of the resonator 10 represents the resonance frequency of the unit resonators. When the resonator 10 includes one unit resonator or when the resonator 10 includes a part of a unit resonator, the resonance frequency of the resonator 10 varies depending on the base 20, the pair conductors 30, the third conductors 40, and the fourth conductor 50 as well as the electromagnetic coupling between the resonator 10 and the surroundings. For example, when the third conductors 40 have poor periodicity, the entire resonator 10 serves as one unit resonator or serves as a part of one unit resonator. For example, the resonance frequency of the resonator 10 varies depending on the lengths of the first conductor 31 and the second conductor 32 in the z direction, the lengths of the third conductors 40 and the fourth conductor 50 in the x direction, and the capacitance of the third conductors 40 and the fourth conductor 50. For example, the resonator 10 has a large capacitance between the first unit conductor 411 and the second unit conductor 421, the resonance frequency can be lowered while shortening the lengths of the first conductor 31 and the second conductor 32 in the z direction and shortening the lengths of the third conductors 40 and the fourth conductor 50 in the x direction.

According to embodiments, in the resonator 10, the first conductive layer 41 serves as an effective radiation surface of electromagnetic waves in the z direction. According to embodiments, in the resonator 10, a first area of the first conductive layer 41 is greater than a first area of the other conductive layers. In the resonator 10, if the first area of the first conductive layer 41 is increased, the radiation of electromagnetic waves can be increased.

According to embodiments, in the resonator 10, the first conductive layer 41 serves as an effective radiation surface of electromagnetic waves in the z direction. In the resonator 10, if the first area of the first conductive layer 41 is increased, the radiation of electromagnetic waves can be increased. In combination with that, in the resonator 10, even if a plurality of unit resonators is included, the resonance frequency does not change. Using such characteristics, in the resonator 10, it is easier to increase the first area of the first conductive layer 41, as compared to the case in which only one unit resonator resonates.

According to embodiments, the resonator 10 can include one or more impedance elements 45. Each impedance element 45 has an impedance value among a plurality of terminals. The impedance element 45 varies the resonance frequency of the resonator 10. The impedance element 45 can include a resistor, a capacitor, and an inductor. The impedance element 45 can also include a variable element whose impedance value can vary. The variable element can vary the impedance value using electric signals. The variable element can vary the impedance value using a physical mechanism.

The impedance element 45 can be connected to two unit conductors of the third conductor 40 arranged in the x direction. The impedance element 45 can be connected to two first unit conductors 411 that are arranged in the x direction. The impedance element 45 can be connected to the first connecting conductor 413 and the first floating conductor 414 that are arranged in the x direction. The impedance element 45 can be connected to the first conductor 31 and the first floating conductor 414. The impedance element 45 is connected to a unit conductor of the third conductor 40 at the central portion in the y direction. The impedance element 45 is connected to the central portion of two first unit conductors 411 in the y direction.

The impedance element 45 is electrically connected in series between two conductors arranged in the x direction in the x-y plane. The impedance element 45 can be electrically connected in series between the first connecting conductor 413 and the first floating conductor 414 that are arranged in the x direction. The impedance element 45 can be electrically connected in series between the first conductor 31 and the first floating conductor 414.

The impedance element 45 can be electrically connected in parallel to two first unit conductors 411 and the second unit conductor 421 that overlap in the z direction and that have capacitance. The impedance element 45 can be electrically connected in parallel to the second connecting conductor 423 and the first floating conductor 414 that overlap in the z direction and that have capacitance.

In the resonator 10, the resonance frequency can be lowered by adding a capacitor as the impedance element 45. In the resonator 10, the resonance frequency can be increased by adding an inductor as the impedance element 45. The resonator 10 can include the impedance elements 45 having different impedance values. The resonator 10 can include capacitors having difference capacitances as the impedance elements 45. The resonator 10 can include inductors having different inductances as the impedance elements 45. In the resonator 10, as a result of adding the impedance elements 45 having different impedance values, an adjustment range of the resonance frequency increases. The resonator 10 can simultaneously include a capacitor and an inductor as the impedance elements 45. In the resonator 10, as a result of simultaneously adding a capacitor and an inductor as the impedance elements 45, the adjustment range of the resonance frequency increases. As a result of including the impedance elements 45, the entire resonator 10 can serve as one unit resonator or as a part of one unit resonator.

According to embodiments, the resonator 10 can include one or more conductive components 46. Each conductive component 46 is a functional component having a conductor inside. The functional component can include a processor, a memory, and a sensor. The conductive component 46 is arranged adjacent to the resonator 10 in the y direction. In the conductive component 46, the ground terminal can be configured to be electrically connected to the fourth conductor 50. However, the conductive component 46 is not limited to be configured in such a way that the ground terminal is electrically connected to the fourth conductor 50, and can be electrically independent from the resonator 10. As a result of placing the resonator 10 and the conductive component 46 adjacent in the y direction, the resonance frequency becomes higher. If the resonator 10 is placed adjacent to a plurality of conductive components 46 in the y direction, the resonance frequency goes further higher. In the resonator 10, greater the length of the conductive components 46 along the z direction, the more is the increase in the resonance frequency. If the conductive components 46 have a greater length in the z direction than the resonator 10, there is a decrease in the amount of change in the resonance frequency for every increment in the unit length.

According to embodiments, the resonator 10 can include one or more dielectric components 47. The dielectric component 47 faces the third conductors 40 in the z direction. The dielectric component 47 is an object that, in at least a part of the portion facing the third conductor 40, does not include a conductor and that has a greater permittivity than the atmospheric air. In the resonator 10, the dielectric component 47 faces the third conductors 40 in the z direction, so that the resonance frequency decreases. In the resonator 10, shorter the distance to the dielectric component 47 in the z direction, the more is the decrease in the resonance frequency. In the resonator 10, greater an area over which the third conductor 40 and the dielectric component 47 face each other, the more is the decrease in the resonance frequency.

Figure 1:
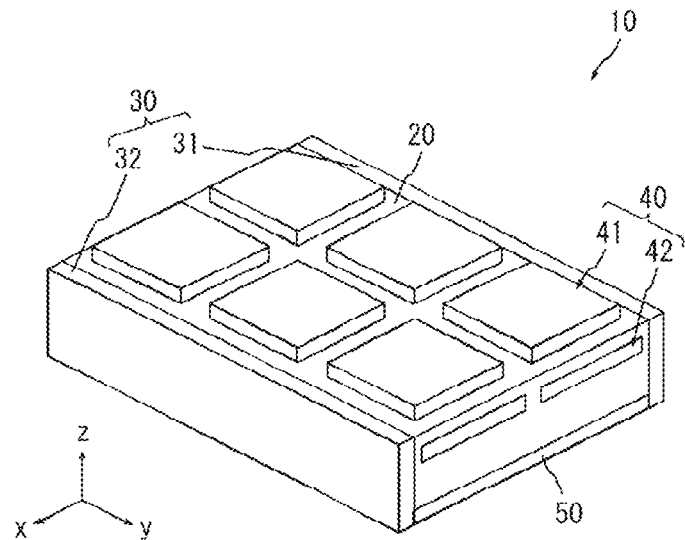
FIG. 1 is a perspective view of a resonator according to embodiments.
Figure 2:
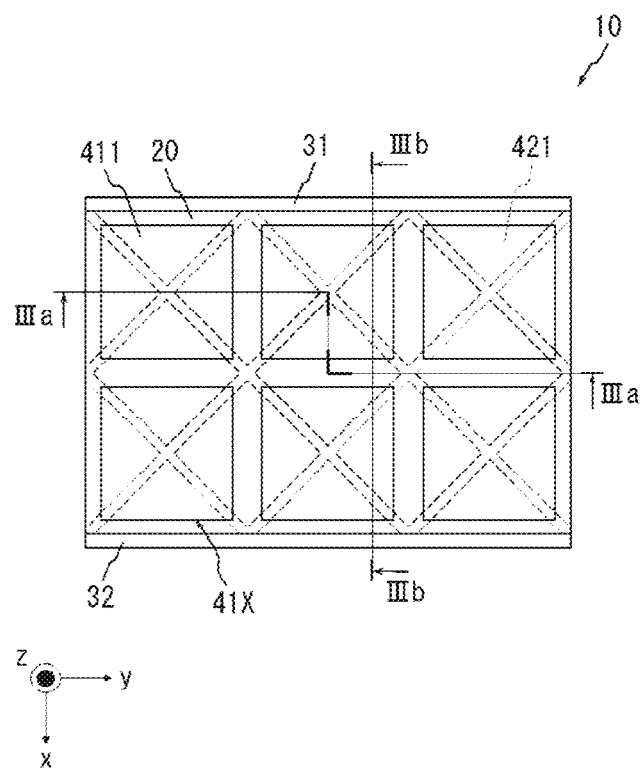
FIG. 2 is a planar view of the resonator illustrated in FIG. 1.
Figure 3A:
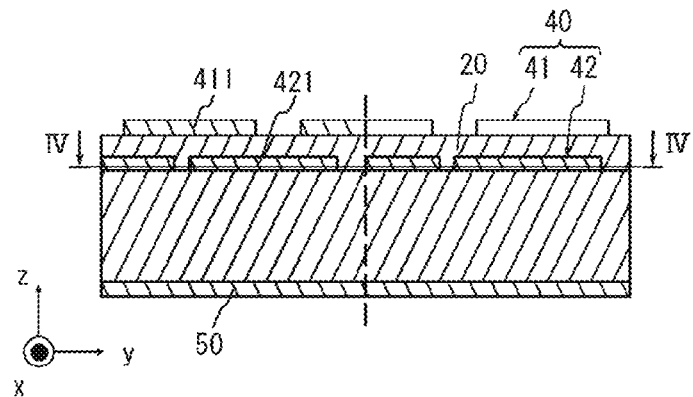
FIG. 3A is a cross-sectional view of the resonator illustrated in FIG. 1.
Figure 3B:
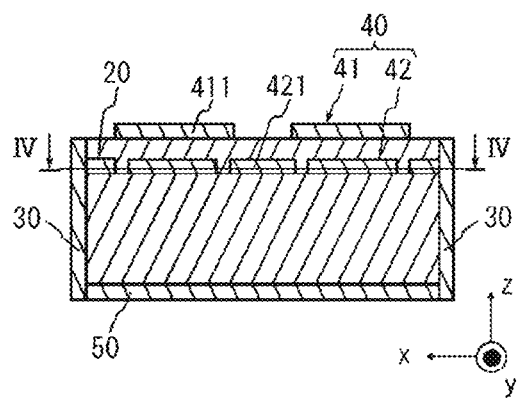
FIG. 3B is a cross-sectional view of the resonator illustrated in FIG. 1.
Figure 4:
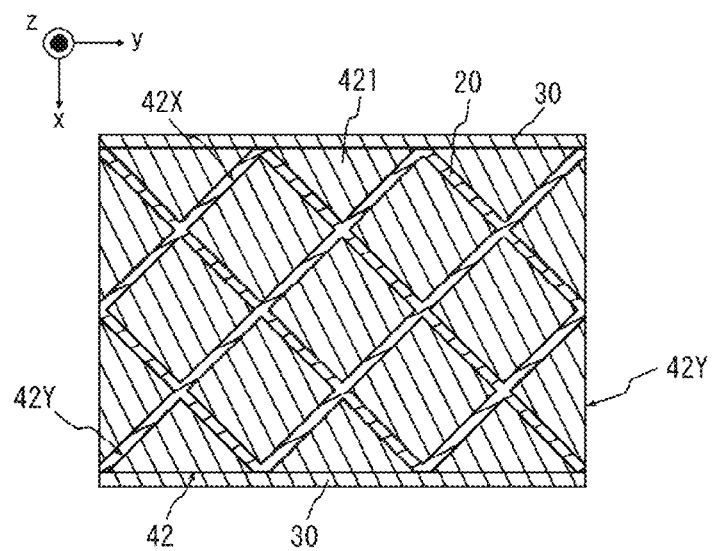
FIG. 4 is a cross-sectional view of the resonator illustrated in FIG. 1.
Figure 5:
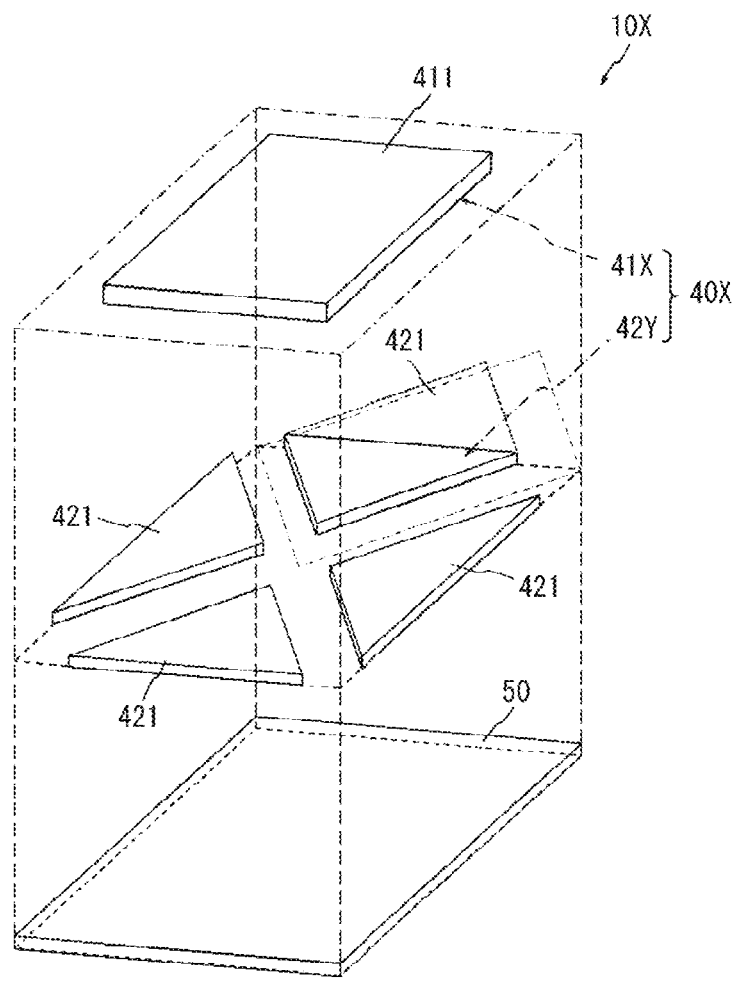
FIG. 5 is a conceptual diagram illustrating a unit structure of the resonator illustrated in FIG. 1.

FIGS. 1 to 5 are diagrams illustrating the resonator 10 representing an example according to embodiments. FIG. 1 is a schematic view of the resonator 10. FIG. 2 is a planar view of the x-y plane when viewed from the z direction. FIG. 3A is a cross-sectional view taken along IIIa-IIIa line illustrated in FIG. 2. FIG. 3B is a cross-sectional view taken along IIIb-IIIb line illustrated in FIG. 2. FIG. 4 is a cross-sectional view taken along IV-IV line illustrated in FIGS. 3A and 3B. FIG. 5 is a conceptual diagram illustrating the unit structure 10X representing an example according to embodiments.

In the resonator 10 illustrated in FIGS. 1 to 5, the first conductive layer 41 includes a patch resonator that serves as the first unit resonator 41X. The second conductive layer 42 includes a patch resonator that serves as the second unit resonator 42X. The unit resonator 40X includes one first unit resonator 41X and four second divisional resonators 42Y. The unit structure 10X includes the unit resonator 40X, and includes a part of the base 20 and a part of the fourth conductor 50 that overlap with the unit resonator 40X in the z direction.

Figure 6:
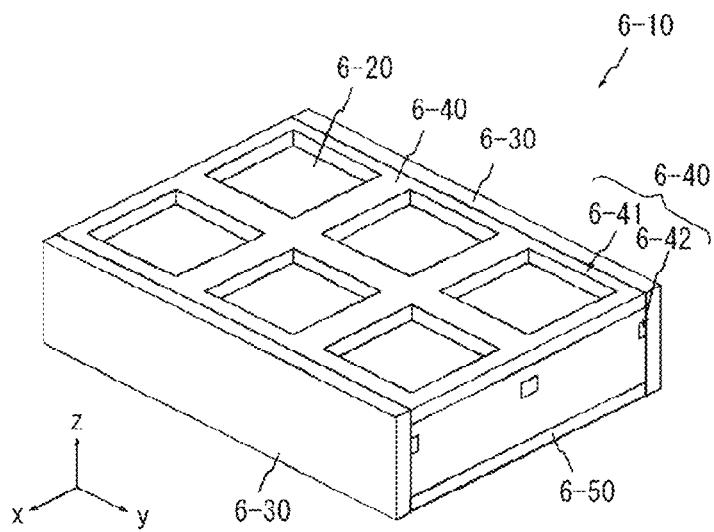
FIG. 6 is a perspective view of a resonator according to embodiments.
Figure 7:
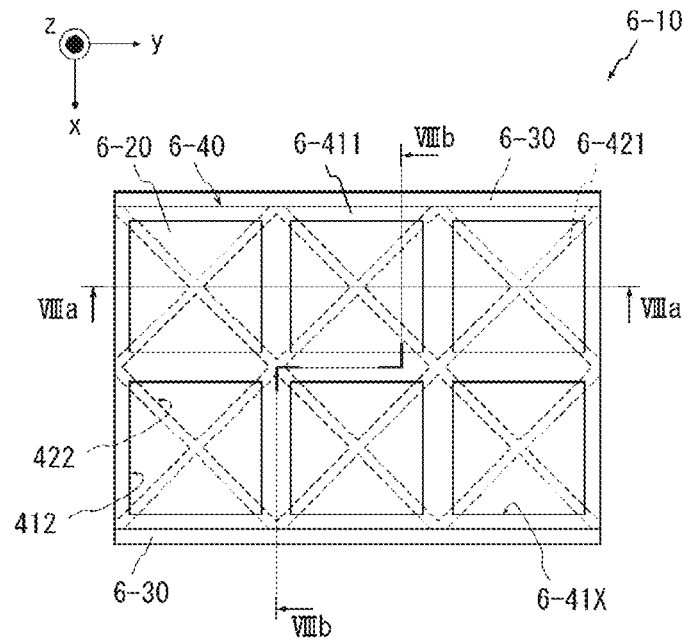
FIG. 7 is a planar view of the resonator illustrated in FIG. 6.
Figure 8A:
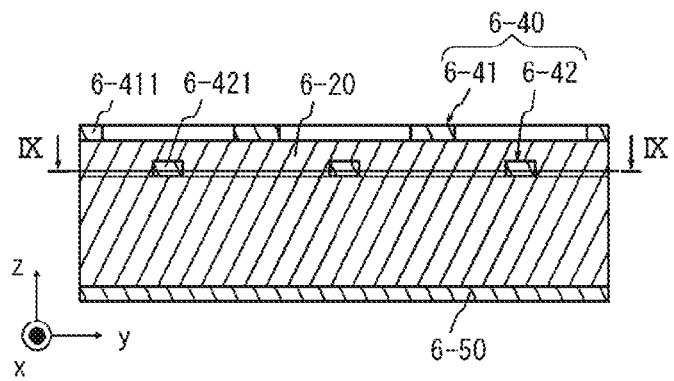
FIG. 8A is a cross-sectional view of the resonator illustrated in FIG. 6.
Figure 8B:
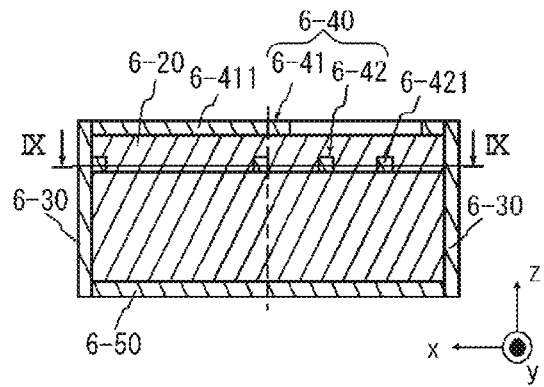
FIG. 8B is a cross-sectional view of the resonator illustrated in FIG. 6.
Figure 9:
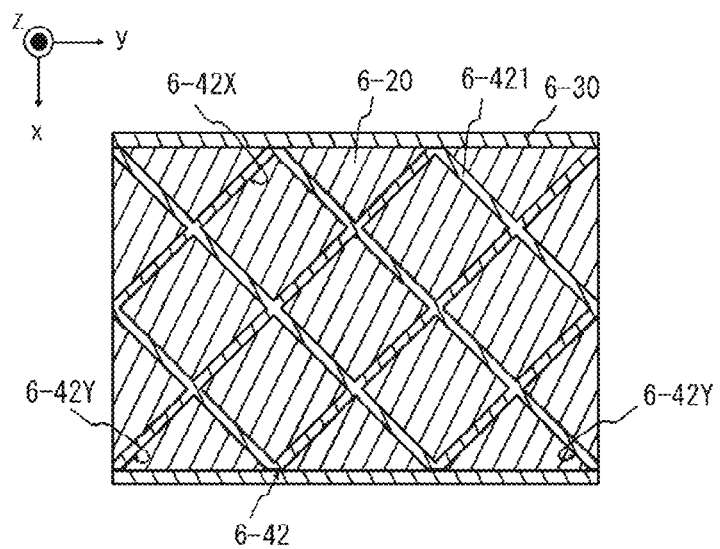
FIG. 9 is a cross-sectional view of the resonator illustrated in FIG. 6.

FIGS. 6 to 9 are diagrams illustrating a resonator 6-10 representing an example according to embodiments. FIG. 6 is a schematic view of the resonator 6-10. FIG. 7 is a planar view of the x-y plane when viewed from the z direction. FIG. 8A is a cross-sectional view taken along VIIIa-VIIIa line illustrated in FIG. 7. FIG. 8B is a cross-sectional view taken along VIIIb-VIIIb line illustrated in FIG. 7. FIG. 9 is a cross-sectional view taken along IX-IX line illustrated in FIGS. 8A and 8B.

In the resonator 6-10, a first conductive layer 6-41 includes a slot resonator that serves as a first unit resonator 6-41X. A second conductive layer 6-42 includes a slot resonator that serves as a second unit resonator 6-42X. A unit resonator 6-40X includes one first unit resonator 6-41X and four second divisional resonators 6-42Y. A unit structure 6-10X includes the unit resonator 6-40X, and includes a part of a base 6-20 and a part of a fourth conductor 6-50 that overlap with the unit resonator 6-40X in the z direction.

Figure 10:
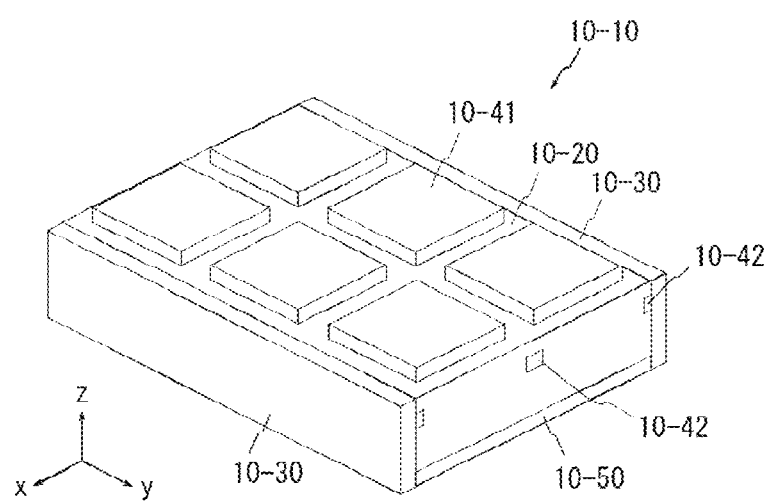
FIG. 10 is a perspective view of a resonator according to embodiments.
Figure 11:
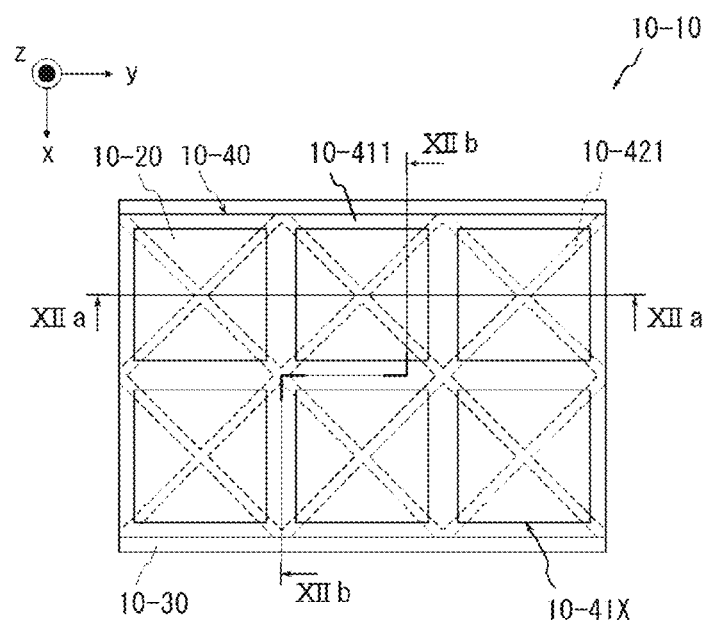
FIG. 11 is a planar view of the resonator illustrated in FIG. 10.
Figure 12A:
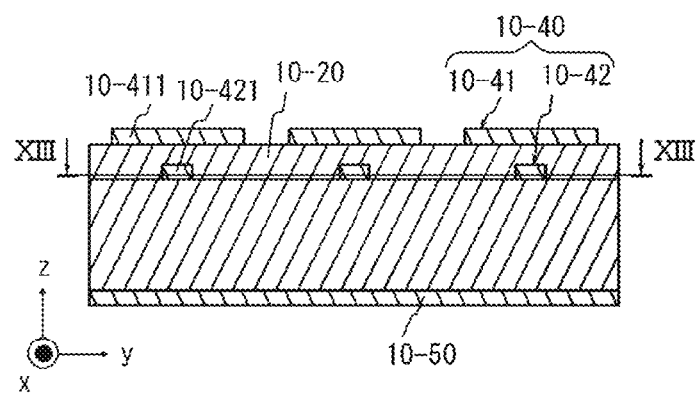
FIG. 12A is a cross-sectional view of the resonator illustrated in FIG. 10.
Figure 12B:
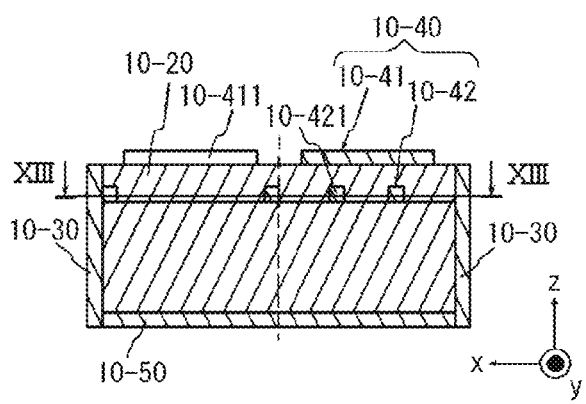
FIG. 12B is a cross-sectional view of the resonator illustrated in FIG. 10.
Figure 13:
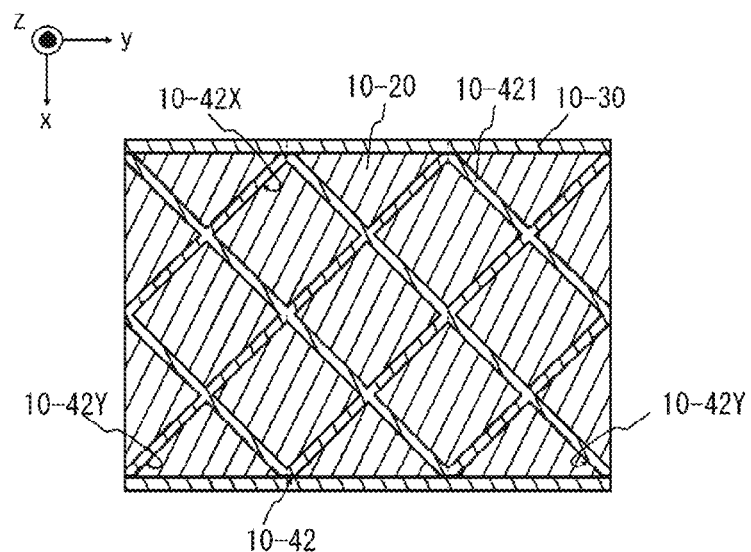
FIG. 13 is a cross-sectional view of the resonator illustrated in FIG. 10.

FIGS. 10 to 13 are diagrams illustrating a resonator 10-10 representing an example according to embodiments. FIG. 10 is a schematic view of the resonator 10-10. FIG. 11 is a planar view of the x-y plane when viewed from the z direction. FIG. 12A is a cross-sectional view taken along XIIa-XIIa line illustrated in FIG. 11. FIG. 12B is a cross-sectional view taken along XIIb-XIIb line illustrated in FIG. 11. FIG. 13 is a cross-sectional view taken along XIII-XIII line illustrated in FIGS. 12A and 12B.

In the resonator 10-10, a first conductive layer 10-41 includes a patch resonator that serves as a first unit resonator 10-41X. A second conductive layer 10-42 includes a slot resonator that serves as a second unit resonator 10-42X. A unit resonator 10-40X includes one first unit resonator 10-41X and four second divisional resonators 10-42Y. A unit structure 10-10X includes the unit resonator 10-40X, and includes a part of a base 10-20 and a part of a fourth conductor 10-50 that overlap with the unit resonator 10-40X in the z direction.

Figure 14:
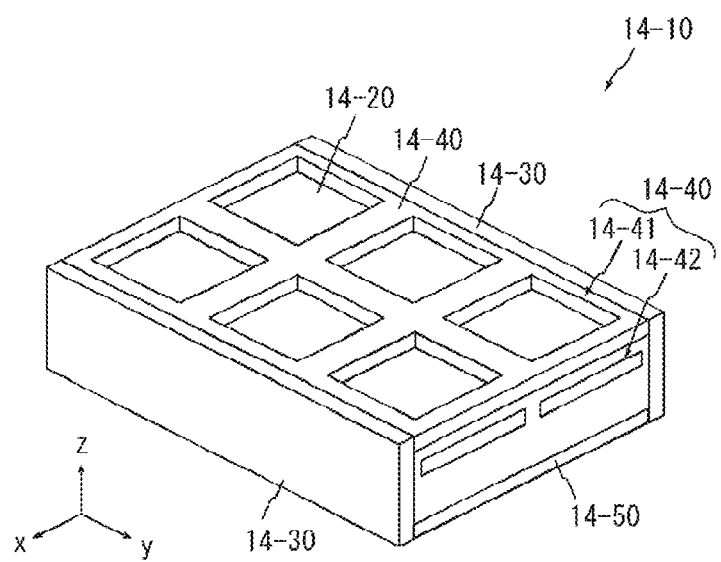
FIG. 14 is a perspective view of a resonator according to embodiments.
Figure 15:
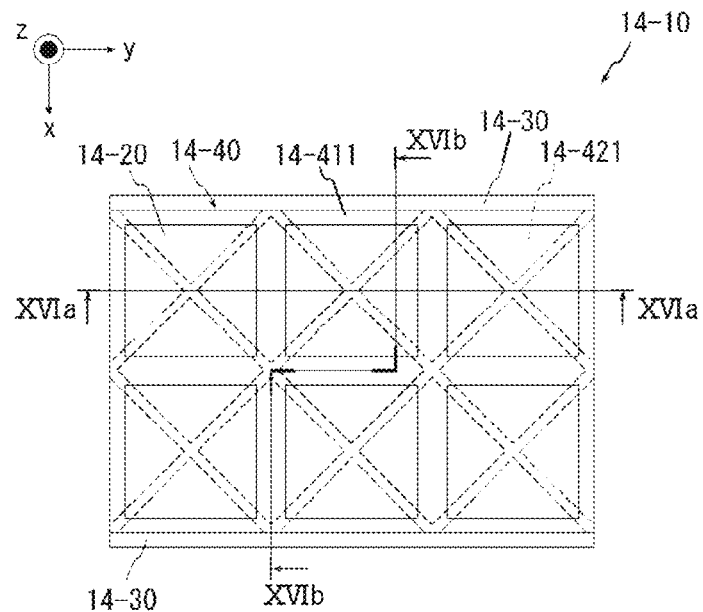
FIG. 15 is a planar view of the resonator illustrated in FIG. 14.
Figure 16A:
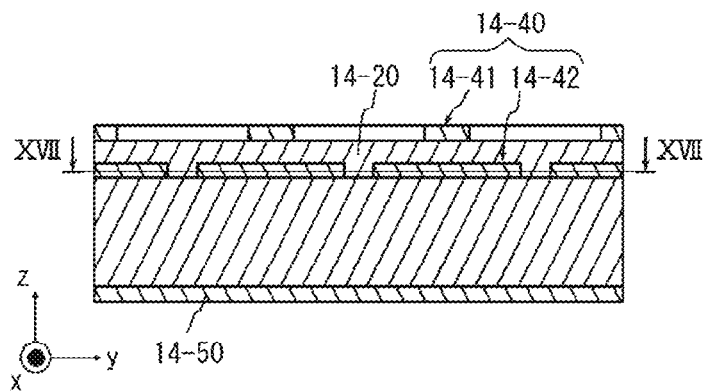
FIG. 16A is a cross-sectional view of the resonator illustrated in FIG. 14.
Figure 16B:
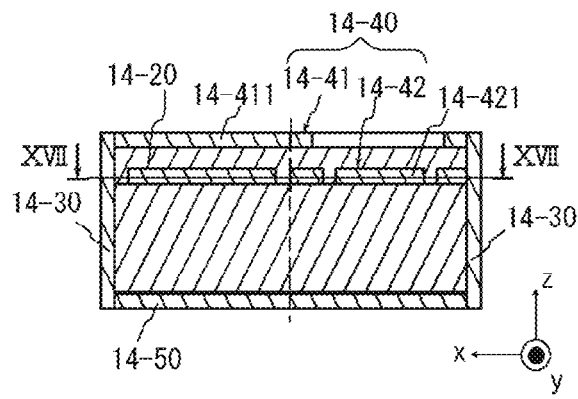
FIG. 16B is a cross-sectional view of the resonator illustrated in FIG. 14.
Figure 17:
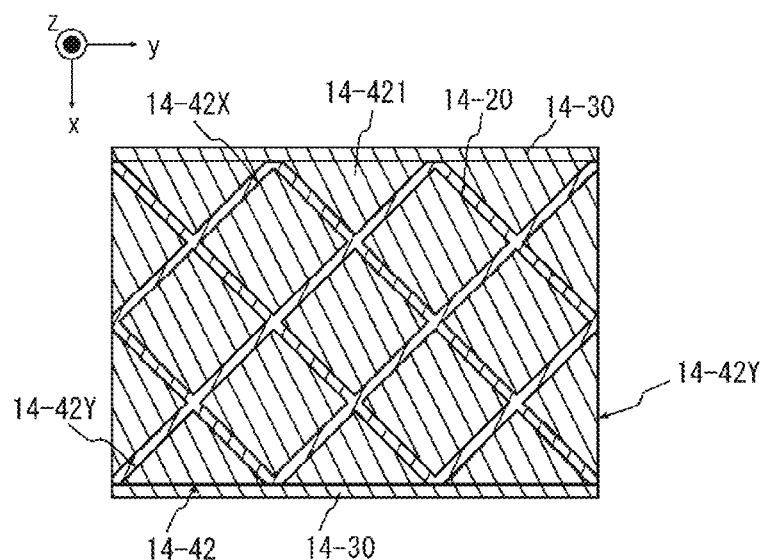
FIG. 17 is a cross-sectional view of the resonator illustrated in FIG. 14.

FIGS. 14 to 17 are diagrams illustrating a resonator 14-10 representing an example according to embodiments. FIG. 14 is a schematic view of the resonator 14-10. FIG. 15 is a planar view of the x-y plane when viewed from the z direction. FIG. 16A is a cross-sectional view taken along XVIa-XVIa line illustrated in FIG. 15. FIG. 16B is a cross-sectional view taken along XVIb-XVIb line illustrated in FIG. 15. FIG. 17 is a cross-sectional view taken along XVII-XVII line illustrated in FIGS. 16A and 16B.

In the resonator 14-10, a first conductive layer 14-41 includes a slot resonator that serves as a first unit resonator 14-41X. A second conductive layer 14-42 includes a patch resonator that serves as a second unit resonator 14-42X. A unit resonator 14-40X includes one first unit resonator 14-41X and four second divisional resonators 14-42Y. A unit structure 14-10X includes the unit resonator 14-40X, and includes a part of a base 14-20 and a part of a fourth conductor 14-50 that overlap with the unit resonator 14-40X in the z direction.

Figure 18:
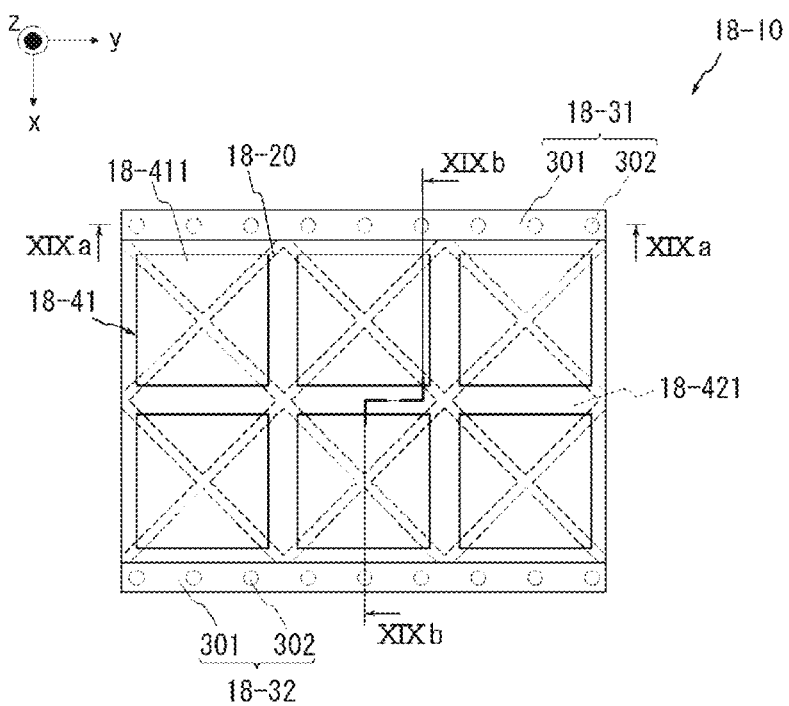
FIG. 18 is a planar view of a resonator according to embodiments.
Figure 19A:
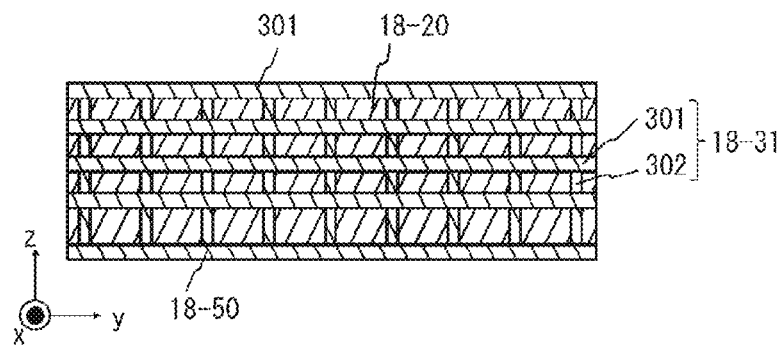
FIG. 19A is a cross-sectional view of the resonator illustrated in FIG. 18.
Figure 19B:
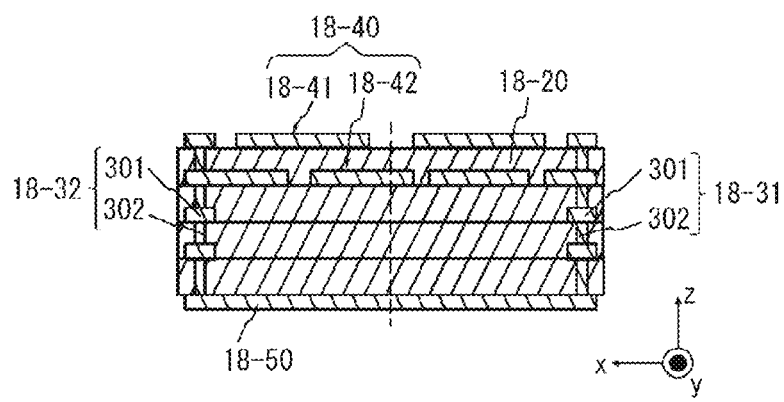
FIG. 19B is a cross-sectional view of the resonator illustrated in FIG. 18.

The resonators 10 illustrated in FIGS. 1 to 17 are only exemplary. The configuration of the resonator 10 is not limited to the structures illustrated in FIGS. 1 to 17. FIG. 18 is a diagram illustrating a resonator 18-10 that includes pair conductors 18-30 having another configuration. FIG. 19A is a cross-sectional view taken along XIXa-XIXa line illustrated in FIG. 18. FIG. 19B is a cross-sectional view taken along XIXb-XIXb line illustrated in FIG. 18.

Figure 20:
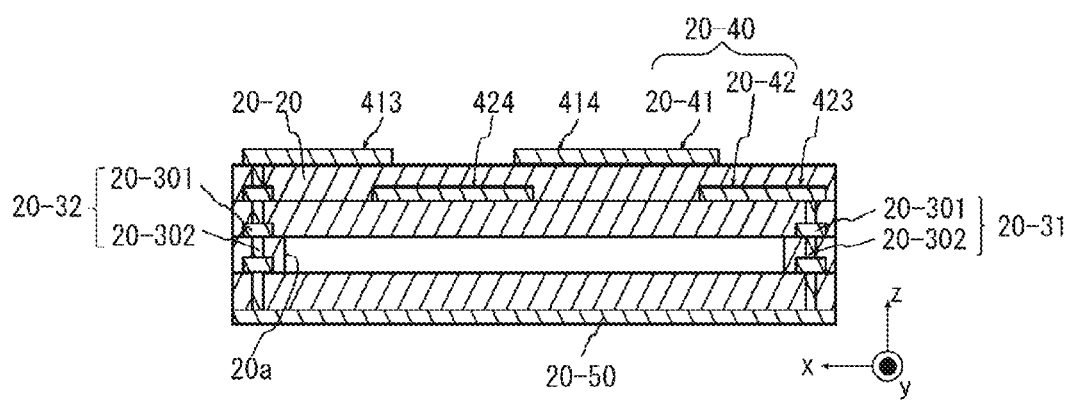
FIG. 20 is a cross-sectional view of a resonator according to embodiments.

The base 20 illustrated in FIGS. 1 to 19 is only exemplary. That is, the configuration of the base 20 is not limited to the configuration illustrated in FIGS. 1 to 19. As illustrated in FIG. 20, a base 20-20 can have a cavity 20a therein. In the z direction, the cavity 20a is positioned between third conductors 20-40 and a fourth conductor 20-50. The permittivity of the cavity 20a is lower than the permittivity of the base 20-20. As a result of having the cavity 20a in the base 20-20, the electromagnetic distance between the third conductors 20-40 and the fourth conductor 20-50 can be shorter.

Figure 21:
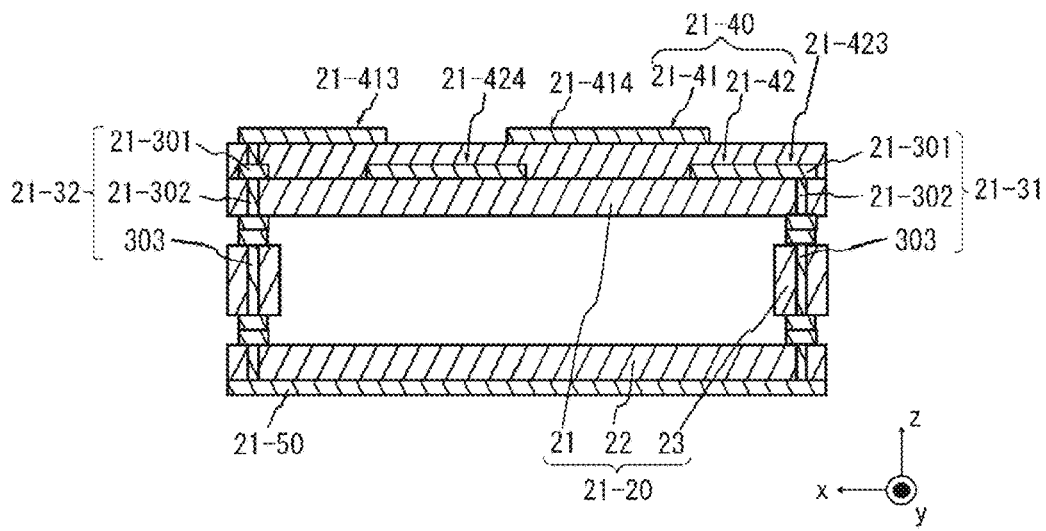
FIG. 21 is a planar view of a resonator according to embodiments.

As illustrated in FIG. 21, a base 21-20 includes a plurality of members. The base 21-20 can include a first base 21-21, a second base 21-22, and connectors 21-23. The first base 21-21 and the second base 21-22 can be mechanically connected via the connectors 21-23. Each connector 21-23 can have a sixth conductor 303 therein. The sixth conductor 303 is electrically connected to the fifth conductive layer 21-301 or the fifth conductor 21-302. In combination with the fifth conductive layer 21-301 and the fifth conductor 21-302, the sixth conductor 303 serves as a first conductor 21-31 or a second conductor 21-32.

Figure 22A:
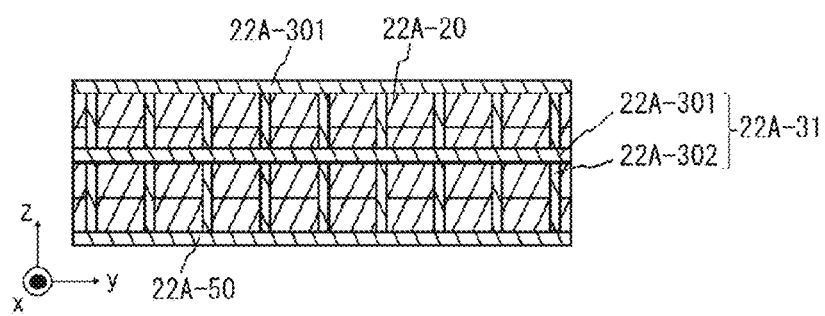
FIG. 22A is a cross-sectional view of a resonator according to embodiments.
Figure 22B:
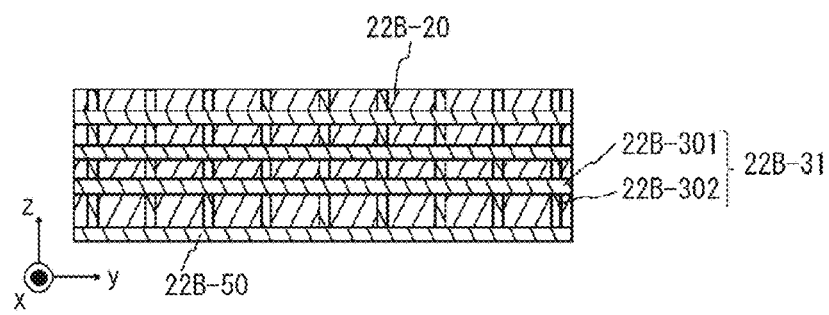
FIG. 22B is a cross-sectional view of a resonator according to embodiments.
Figure 22C:
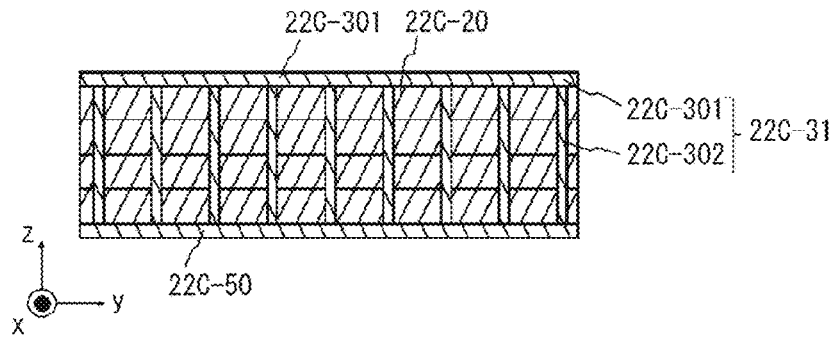
FIG. 22C is a cross-sectional view of a resonator according to embodiments.

The pair conductors 30 illustrated in FIGS. 1 to 21 are only exemplary. The configuration of the pair conductors 30 is not limited to the configuration illustrated in FIGS. 1 to 21. FIGS. 22A to 28 are diagrams illustrating the resonator 10 that includes the pair conductors 30 having other configurations. FIGS. 22A to 22C each are a cross-sectional view corresponding to FIG. 19A. As illustrated in FIG. 22A, the number of fifth conductive layers 22A-301 can change as appropriate. As illustrated in FIG. 22B, a fifth conductive layer 22B-301 need not be positioned on a base 22B-20. As illustrated in FIG. 22C, a fifth conductive layer 22C-301 need not be positioned in a base 22C-20.

Figure 23:
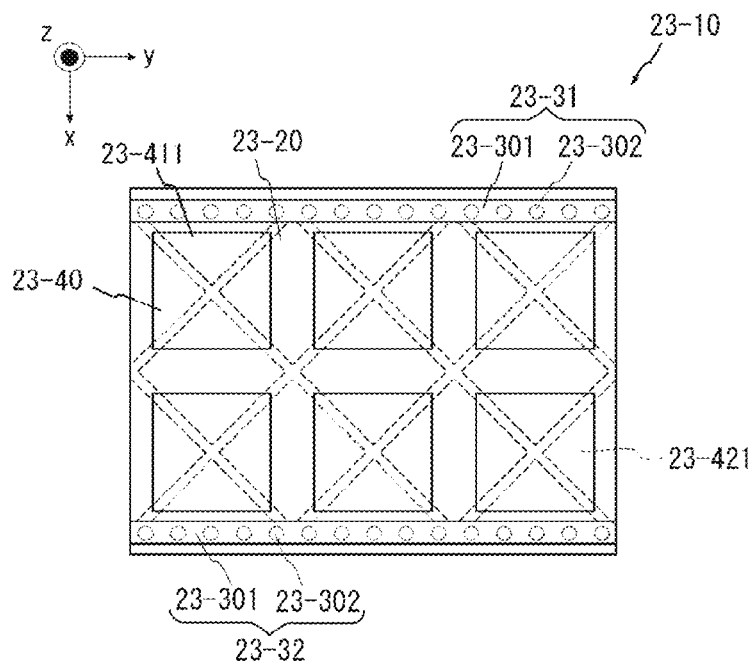
FIG. 23 is a planar view of a resonator according to embodiments.
Figure 24:
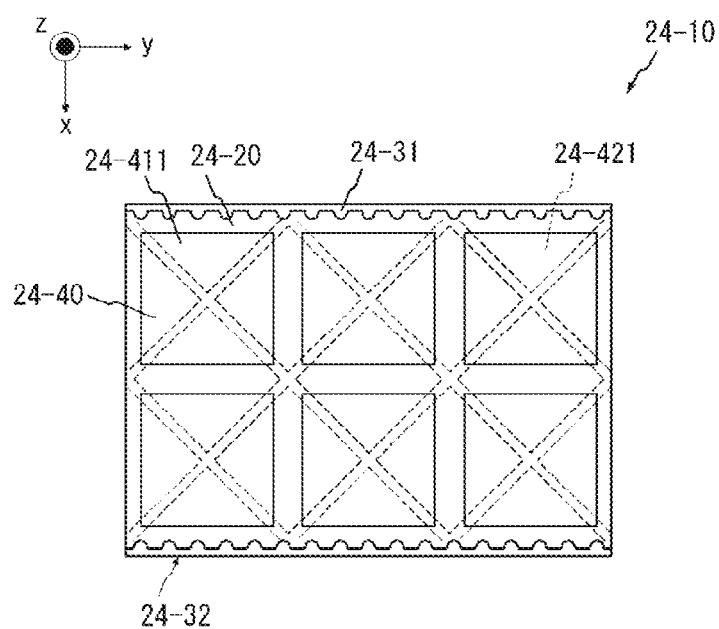
FIG. 24 is a planar view of a resonator according to embodiments.

FIG. 23 is a planar view corresponding to FIG. 18. As illustrated in FIG. 23, in a resonator 23-10, fifth conductors 23-302 can be separated from the boundary of a unit resonator 23-40X. FIG. 24 is a planar view corresponding FIG. 18. As illustrated in FIG. 24, a first conductor 24-31 as well as a second conductor 24-32 can include protrusions protruding toward the first conductor 24-31 or the second conductor 24-32 to be paired. Such a resonator 10 can be manufactured, for example, by applying a metallic paste on the base 20 having recesses and curing the metal paste. In the examples illustrated in FIGS. 18 to 23, the recesses are round in shape. However, the recesses are not limited to have the round shape, and can have a round-edged polygonal shape or an elliptical shape.

Figure 25:
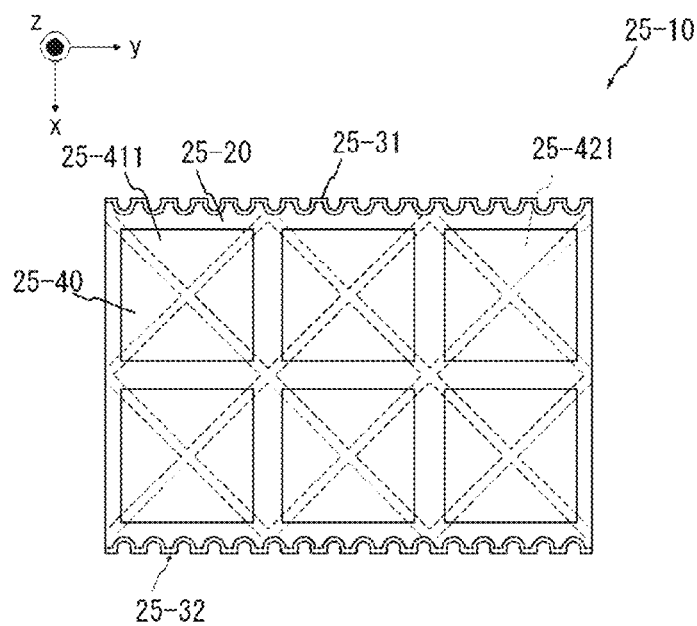
FIG. 25 is a planar view of a resonator according to embodiments.

FIG. 25 is a diagram corresponding to FIG. 18. As illustrated in FIG. 25, a base 25-20 can have concave portions. As illustrated in FIG. 25, a first conductor 25-31 and a second conductor 25-32 have recesses that are recessed inward in the x direction from an outer surface. As illustrated in FIG. 25, the first conductor 25-31 and the second conductor 25-32 extend along the surface of the base 25-20. Such a resonator 10 can be manufactured, for example, by spraying a fine metallic material onto the base 25-20 having recesses.

Figure 26:
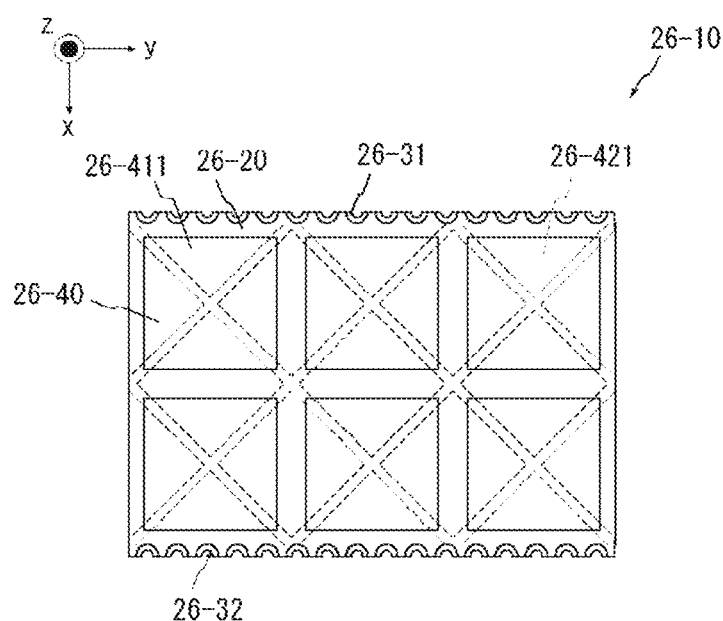
FIG. 26 is a planar view of a resonator according to embodiments.

FIG. 26 is a planar view corresponding to FIG. 18. As illustrated in FIG. 26, a base 26-20 can have recesses. As illustrated in FIG. 26, a first conductor 26-31 and a second conductor 26-32 have recesses that are recessed inward in the x direction from an outer surface. As illustrated in FIG. 26, the first conductor 26-31 and the second conductor 26-32 extend along the surface of the base 26-20. Such a resonator 10 can be manufactured, for example, by partitioning a mother substrate along an arrangement of through-hole conductors. The first conductor 26-31 and the second conductor 26-32 can be referred to as edge-face through holes.

Figure 27:
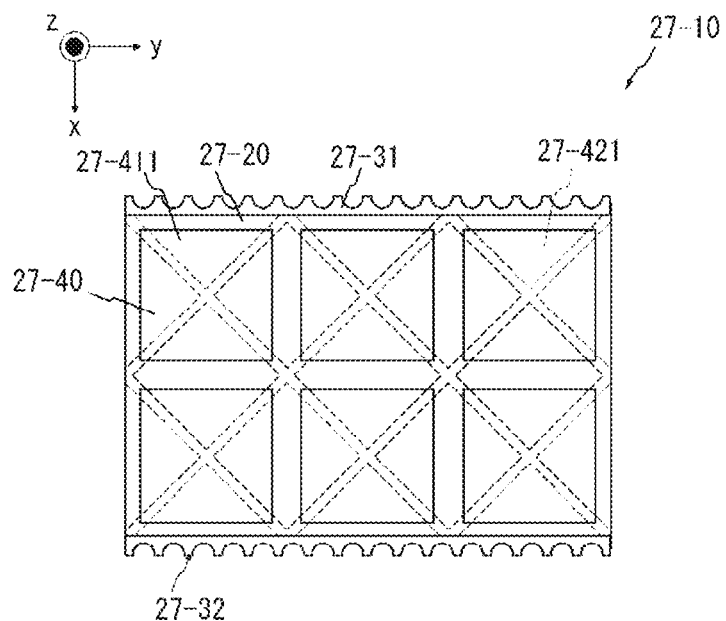
FIG. 27 is a planar view of a resonator according to embodiments.

FIG. 27 is a planar view corresponding to FIG. 18. As illustrated in FIG. 27, a base 27-20 can have recesses. As illustrated in FIG. 27, a first conductor 27-31 and a second conductor 27-32 have recesses that are recessed inward in the x direction from an outer surface. A resonator 27-10 can be manufactured, for example, by partitioning a mother substrate along an arrangement of through-hole conductors. The first conductor 27-31 and the second conductor 27-32 can be referred to as edge-face through holes. In the examples illustrated in FIGS. 24 to 27, the recesses have a semicircular shape. However, the recesses are not limited to have the semicircular shape, and can have a round-edged polygonal shape or an arc of an elliptical shape. For example, using a part along the long axis direction of the elliptical shape, a larger area of the y-z plane can be secured with a smaller number of edge-face through holes.

Figure 28:
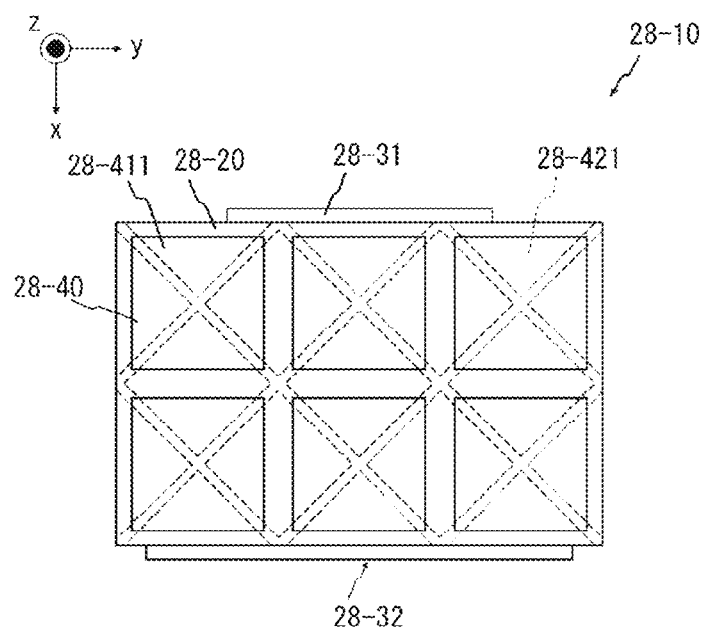
FIG. 28 is a planar view of a resonator according to embodiments.

FIG. 28 is a planar view corresponding to FIG. 18. As illustrated in FIG. 28, a first conductor 28-31 and a second conductor 28-32 are shorter in length in the x direction as compared to a base 28-20. However, the configuration of the first conductor 28-31 and the second conductor 28-32 is not limited to this example. In the example illustrated in FIG. 28, although the pair conductors 30 have different lengths in the x direction, they can also have the same length. Either one or both of the pair conductors 30 can be shorter in length in the x direction as compared to the third conductors 40. The pair conductors 30 that are shorter in length in the x direction as compared to the base 20 can have a structure as illustrated in FIGS. 18 to 27. The pair conductors 30 that are shorter in length in the x direction as compared to the third conductors 40 can have a structure as illustrated in FIGS. 18 to 27. The pair conductors 30 can have mutually different configurations. For example, one of the pair conductors 30 can include the fifth conductive layer 301 and the fifth conductors 302; while the other pair conductors 30 can have edge-face through holes.

Figure 29A:
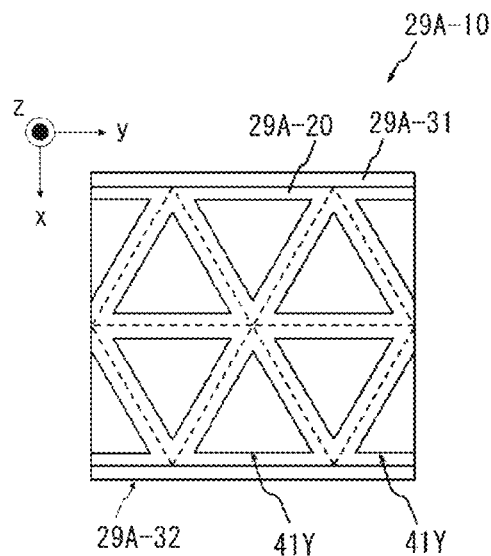
FIG. 29A is a planar view of a resonator according to embodiments.
Figure 29B:
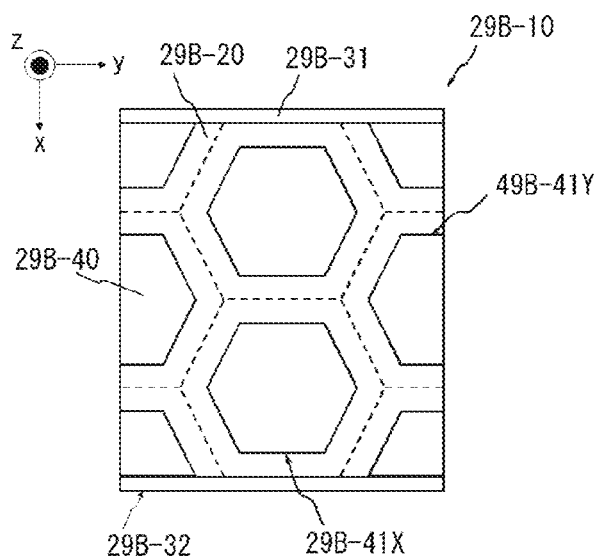
FIG. 29B is a planar view of a resonator according to embodiments.
Figure 30:
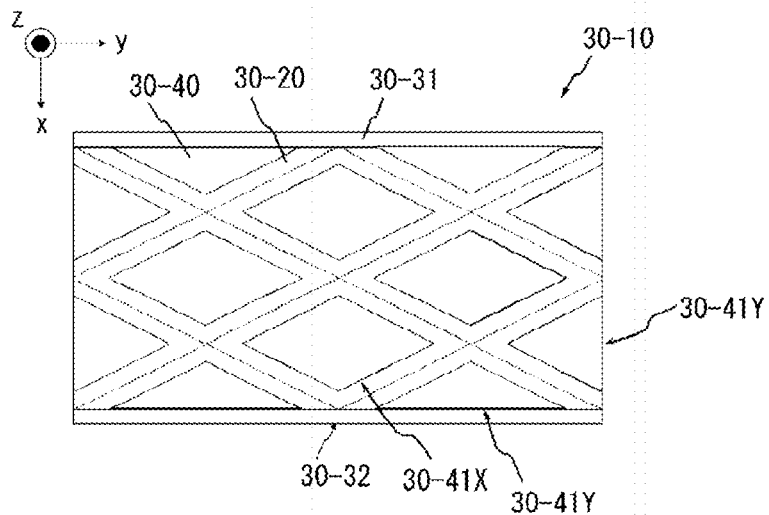
FIG. 30 is a planar view of a resonator according to embodiments.

The third conductors 40 illustrated in FIGS. 1 to 28 are only exemplary. The configuration of the third conductors 40 is not limited to the configuration illustrated in FIGS. 1 to 28. The unit resonator 40X, the first unit resonator 41X, and the second unit resonator 42X are not limited to have a rectangular shape. The unit resonator 40X, the first unit resonator 41X, and the second unit resonator 42X can be referred to as the unit resonator 40X and the like. For example, the unit resonator 40X and the like can be triangular in shape as illustrated in FIG. 29A or can be hexagonal in shape as illustrated in FIG. 29B. As illustrated in FIG. 30, the edges of a unit resonator 30-40X and the like can extend in the directions different from the x direction and the y direction. In each third conductor 30-40, a second conductive layer 30-42 can be positioned on a base 30-20, and a first conductive layer 30-41 can be positioned in the base 30-20. In the third conductor 30-40, as compared to the first conductive layer 30-41, the second conductive layer 30-42 can be positioned at a greater distance from a fourth conductor 30-50.

Figure 31A:
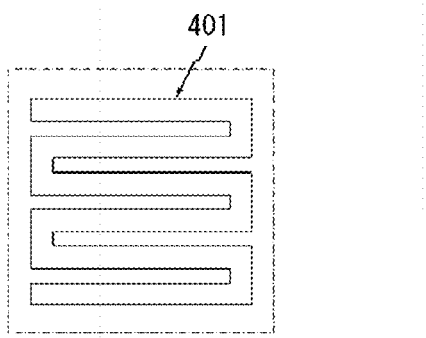
FIG. 31A is a schematic view of an exemplary resonator.
Figure 31B:
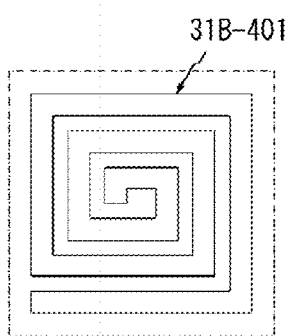
FIG. 31B is a schematic view of an exemplary resonator.
Figure 31C:
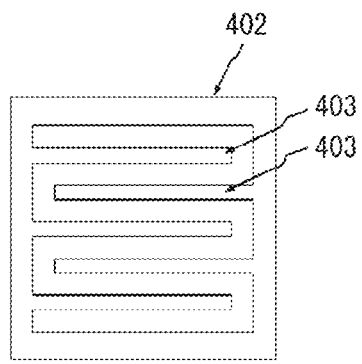
FIG. 31C is a schematic view of an exemplary resonator.
Figure 31D:
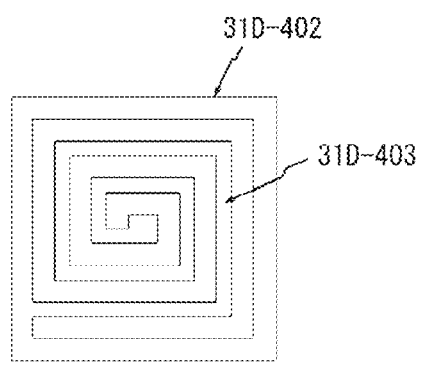
FIG. 31D is a schematic view of an exemplary resonator.
Figure 32A:
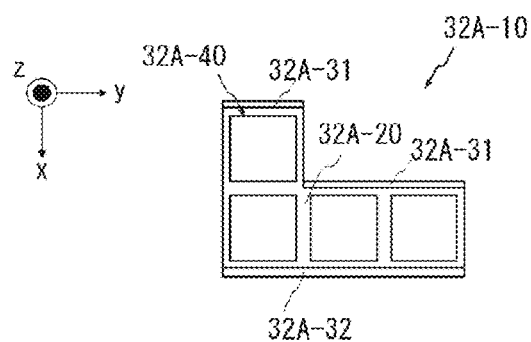
FIG. 32A is a planar view of a resonator according to embodiments.
Figure 32B:
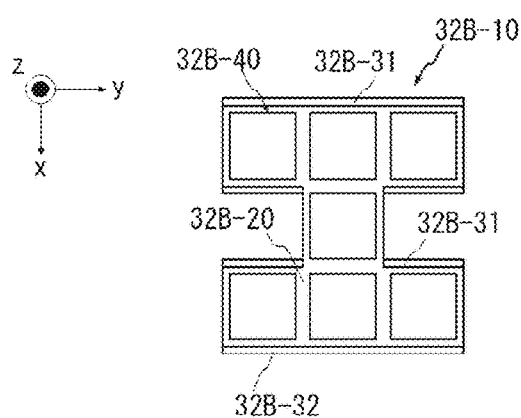
FIG. 32B is a planar view of a resonator according to embodiments.
Figure 32C:
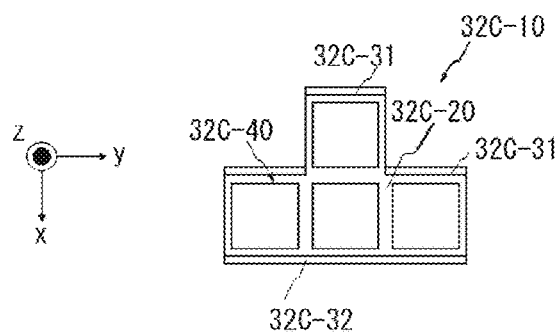
FIG. 32C is a planar view of a resonator according to embodiments.
Figure 32D:
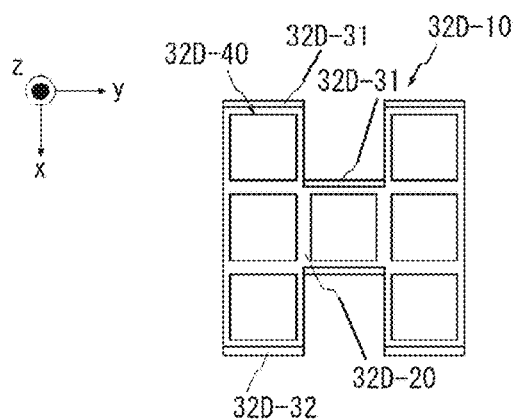
FIG. 32D is a planar view of a resonator according to embodiments.
Figure 33A:
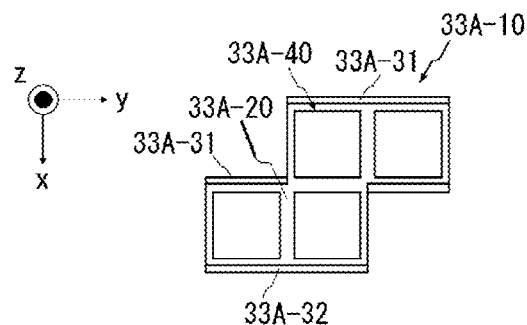
FIG. 33A is a planar view of a resonator according to embodiments.
Figure 33B:
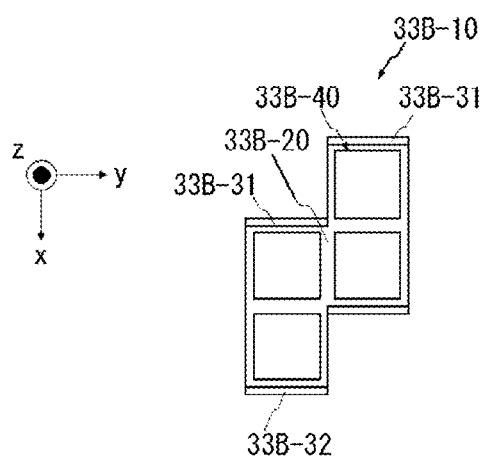
FIG. 33B is a planar view of a resonator according to embodiments.
Figure 33C:
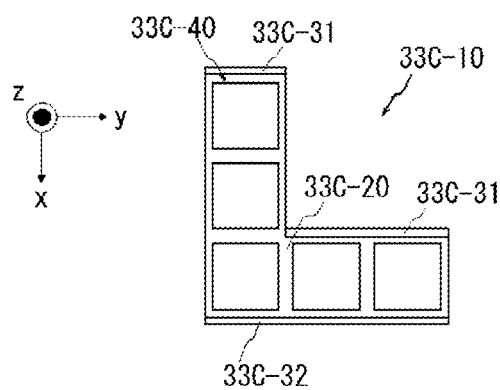
FIG. 33C is a planar view of a resonator according to embodiments.
Figure 33D:
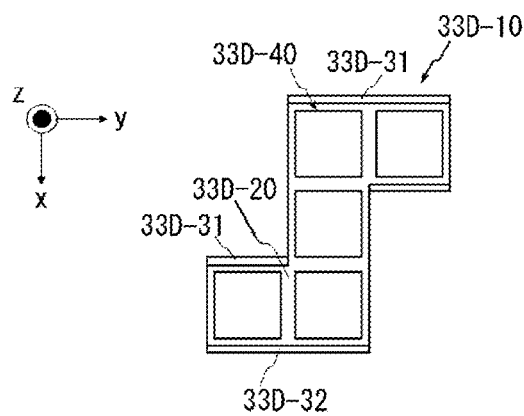
FIG. 33D is a planar view of a resonator according to embodiments.
Figure 34A:
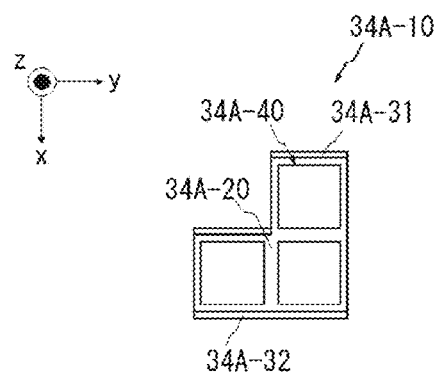
FIG. 34A is a planar view of a resonator according to embodiments.
Figure 34B:
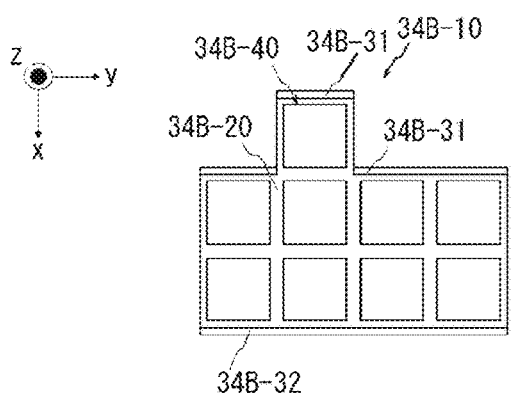
FIG. 34B is a planar view of a resonator according to embodiments.
Figure 34C:
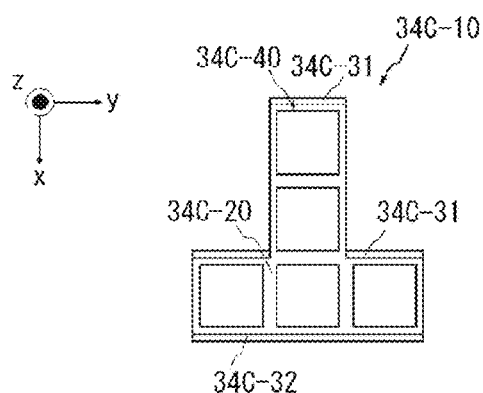
FIG. 34C is a planar view of a resonator according to embodiments.
Figure 34D:
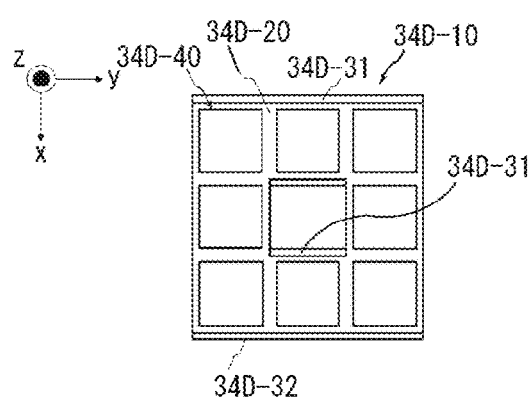
FIG. 34D is a planar view of a resonator according to embodiments.

The third conductors 40 illustrated in FIGS. 1 to 30 are only exemplary. That is, the configuration of the third conductors 40 is not limited to the configuration illustrated in FIGS. 1 to 30. The resonator that includes the third conductors 40 can be a resonator 401 of the line type. In FIG. 31A is illustrated the resonator 401 of the meander line type. In FIG. 31B is illustrated a resonator 31B-401 of the spiral type. The resonator that includes the third conductors 40 can be a resonator 402 of the slot type. The resonator 402 of the slot type can include, within an opening, one or more seventh conductors 403. The seventh conductors 403 in the opening are configured to have one end that is opened and the other end that is electrically connected to a conductor defining the opening. In a unit slot illustrated in FIG. 31C, five seventh conductors 403 are positioned in the opening. Due to the seventh conductors 403, the unit slot has a shape corresponding to meander lines. In a unit slot illustrated in FIG. 31D, one seventh conductor 31D-403 is positioned in the opening. Due to the seventh conductor 31D-403, the unit slot has a shape corresponding to a spiral.

The configurations of the resonator 10 illustrated in FIGS. 1 to 31 are only exemplary. The configuration of the resonator 10 is not limited to the configurations illustrated in FIGS. 1 to 31. For example, the resonator 10 can include three or more pair conductors 30. For example, one pair conductor 30 can face two pair conductors 30 in the x direction. The two pair conductors 30 have different distances to the one pair conductor 30. For example, the resonator 10 can include two pairs of pair conductors 30. The two pairs of pair conductors 30 can have different distances and different lengths. The resonator 10 can include five or more first conductors. In the resonator 10, the unit structure 10X can be arranged with other unit structures 10X in the y direction. In the resonator 10, the unit structure 10X can be arranged with other unit structures 10X in the x direction without involving the pair conductors 30. FIGS. 32A to 34D are diagrams illustrating examples of the resonator 10. In the resonator 10 illustrated in FIGS. 32A to 34D, although the unit resonator 40X of the unit structure 10X is illustrated to have the square shape, but the unit resonator is not limited to this shape.

Figure 35:
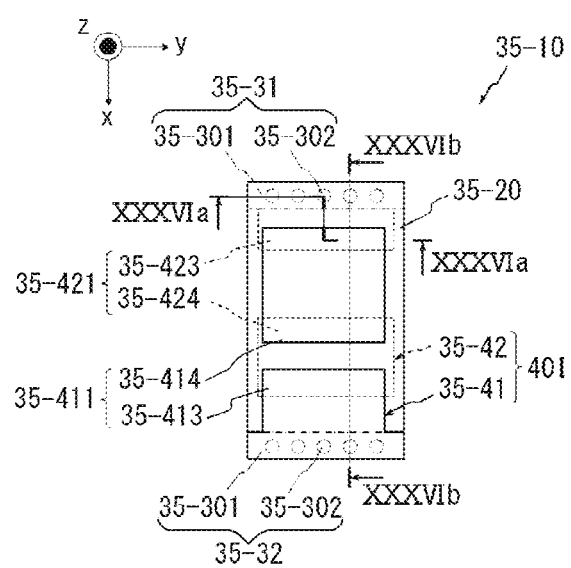
FIG. 35 is a planar view of a resonator according to embodiments.
Figure 36A:
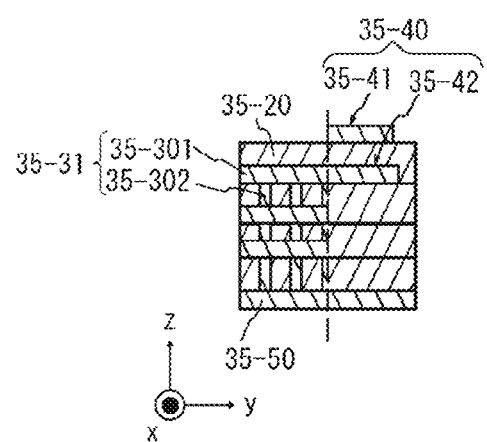
FIG. 36A is a cross-sectional view of the resonator illustrated in FIG. 35.
Figure 36B:
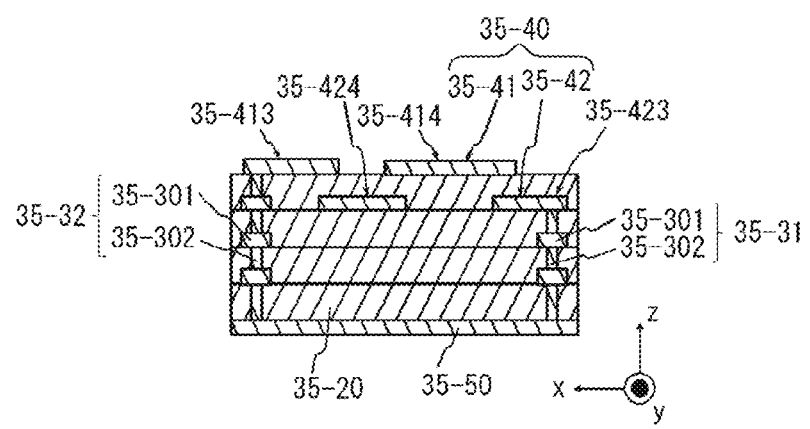
FIG. 36B is a cross-sectional view of the resonator illustrated in FIG. 35.

The configurations of the resonator 10 illustrated in FIGS. 1 to 34 are only exemplary. The configuration of the resonator 10 is not limited to the configurations illustrated in FIGS. 1 to 34. FIG. 35 is a planar view of the x-y plane when viewed from the z direction. FIG. 36A is a cross-sectional view taken along XXXVIa-XXXVIa line illustrated in FIG. 35. FIG. 36B is a cross-sectional view taken along XXXVIb-XXXVIb line illustrated in FIG. 35.

In a resonator 35-10, a first conductive layer 35-41 includes half of a patch resonator as a first unit resonator 35-41X. A second conductive layer 35-42 includes half of a patch resonator as a second unit resonator 35-42X. A unit resonator 35-40X includes one first divisional resonator 35-41Y and one second divisional resonator 35-42Y. A unit structure 35-10X includes the unit resonator 35-40X, and includes a part of a base 35-20 and a part of a fourth conductor 35-50 that overlap with the unit resonator 35-40X in the z direction. In the resonator 35-10, three unit resonators 35-40X are arranged in the x direction. A first unit conductor 35-411 and a second unit conductor 35-421 included in the three unit resonators 35-40X constitute one current path 35-40I.

Figure 37:
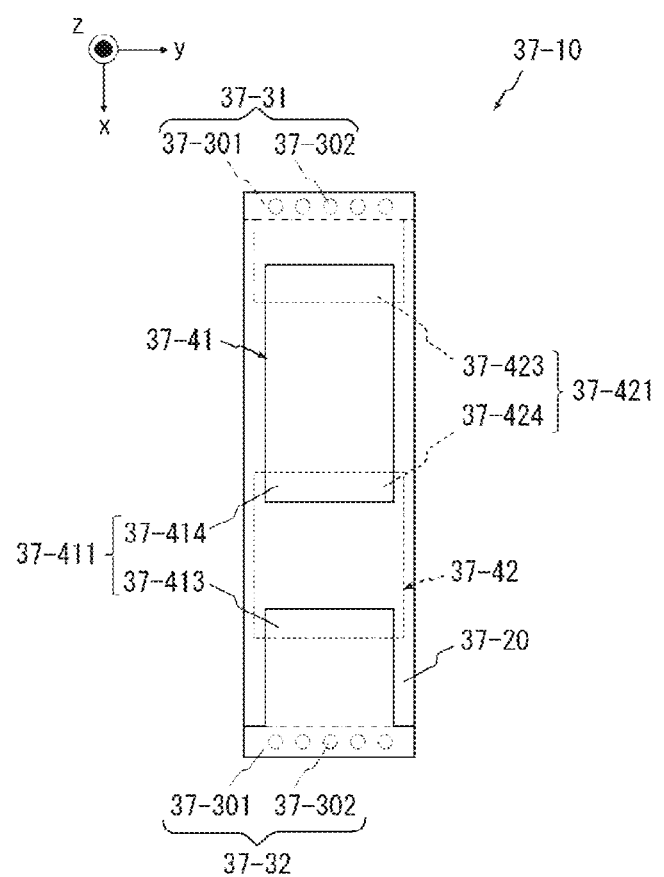
FIG. 37 is a planar view of a resonator according to embodiments.
Figure 38:
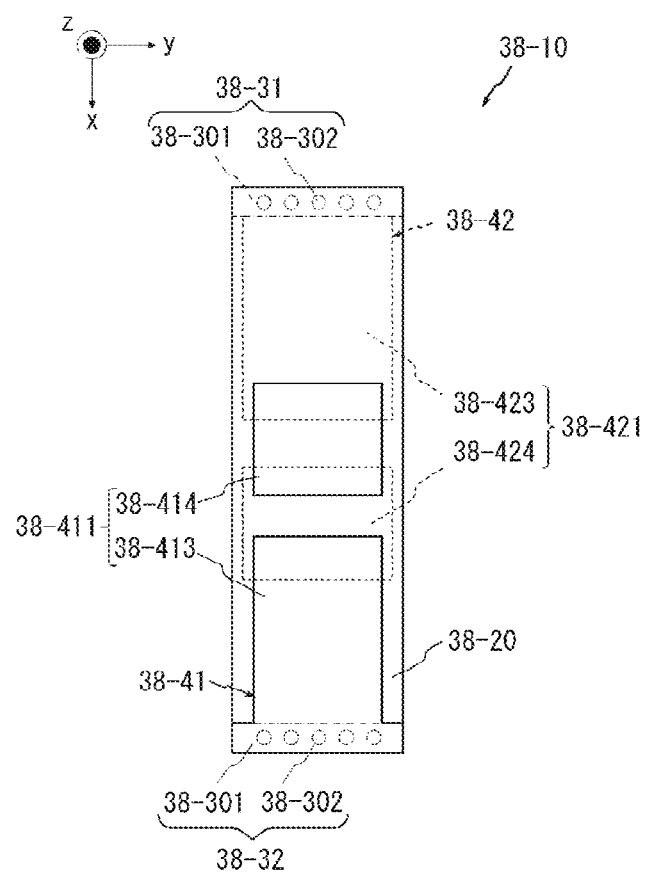
FIG. 38 is a planar view of a resonator according to embodiments.

In FIG. 37 is illustrated another example of the resonator 35-10 illustrated in FIG. 35. A resonator 37-10 illustrated in FIG. 37 is longer in the x direction as compared to the resonator 35-10. However, the dimensions of the resonator 10 are not limited to the dimensions of the resonator 37-10, and can be appropriated varied. In the resonator 37-10, a first connecting conductor 37-413 has a length in the x direction that is different from a first floating conductor 37-414. In the resonator 37-10, the first connecting conductor 37-413 has a smaller length in the x direction than the first floating conductor 37-414. In FIG. 38 is illustrated still another example of the resonator 35-10. In a resonator 38-10 illustrated in FIG. 38, a third conductor 38-40 has different lengths in the x direction. In the resonator 38-10, a first connecting conductor 38-413 has a greater length in the x direction than a first floating conductor 38-414.

Figure 39:
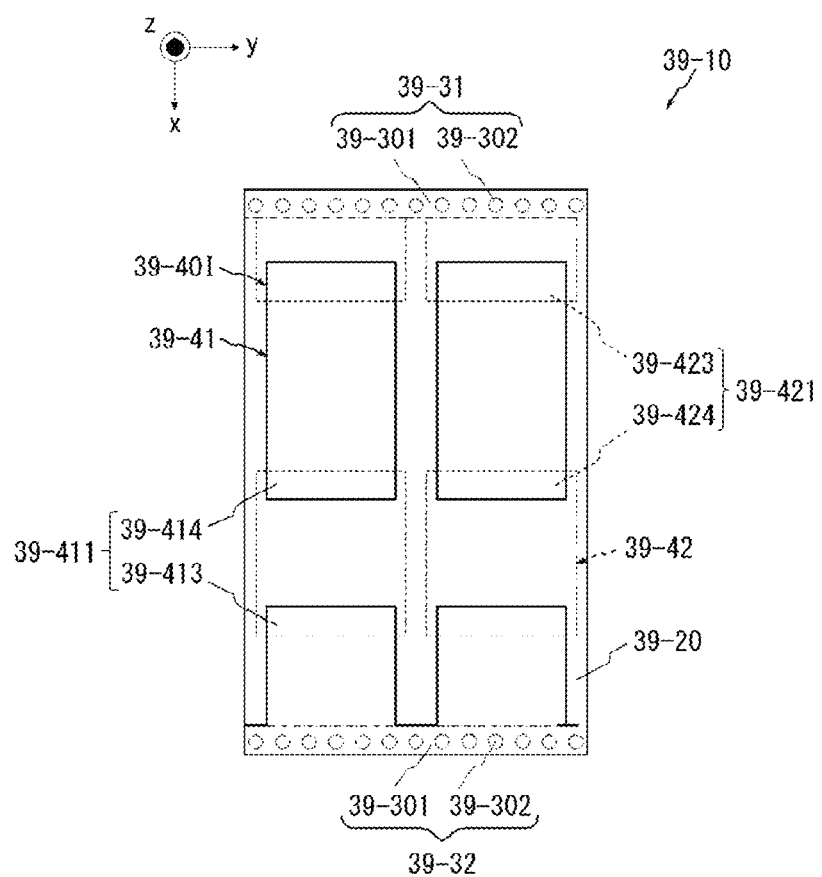
FIG. 39 is a planar view of a resonator according to embodiments.

In FIG. 39 is illustrated still another example of the resonator 10. In FIG. 39 is illustrated another example of the resonator 37-10 illustrated in FIG. 37. According to embodiments, the resonator 10 is configured in such a way that a plurality of first unit conductors 411 and a plurality of second unit conductors 421 arranged in the x direction are capacitively coupled. In the resonator 10, two current paths 40I can be arranged in the y direction in which no current flows from one side to the other side.

Figure 40:
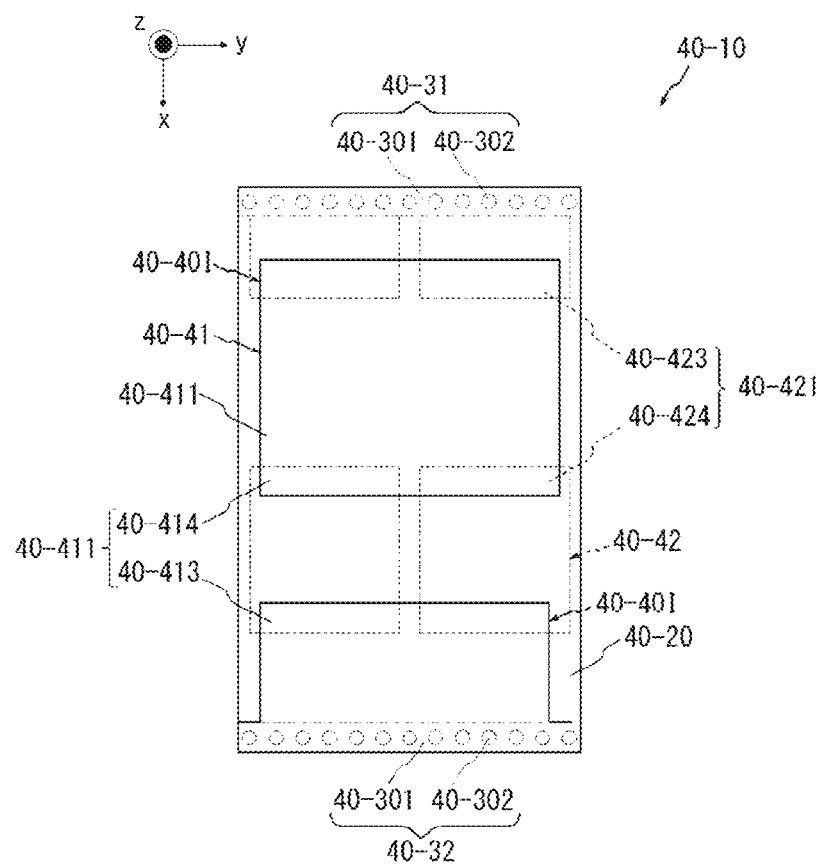
FIG. 40 is a planar view of a resonator according to embodiments.

In FIG. 40 is illustrated still another example of the resonator 10. In FIG. 40 is illustrated another example of a resonator 39-10 illustrated in FIG. 39. According to embodiments, in the resonator 10, the number of conductors connected to the first conductor 31 can be different from the number of conductors connected to the second conductor 32. In a resonator 40-10 illustrated in FIG. 40, the configuration is such that one first connecting conductor 40-413 is capacitively coupled with two second floating conductors 40-424. In the resonator 40-10 illustrated in FIG. 40, the configuration is such that two second connecting conductors 40-423 are capacitively coupled with one first floating conductor 40-414. According to embodiments, the number of first unit conductors 411 can be different from the number of second unit conductors 421, which are capacitively coupled with the first unit conductors 411.

Figure 41:
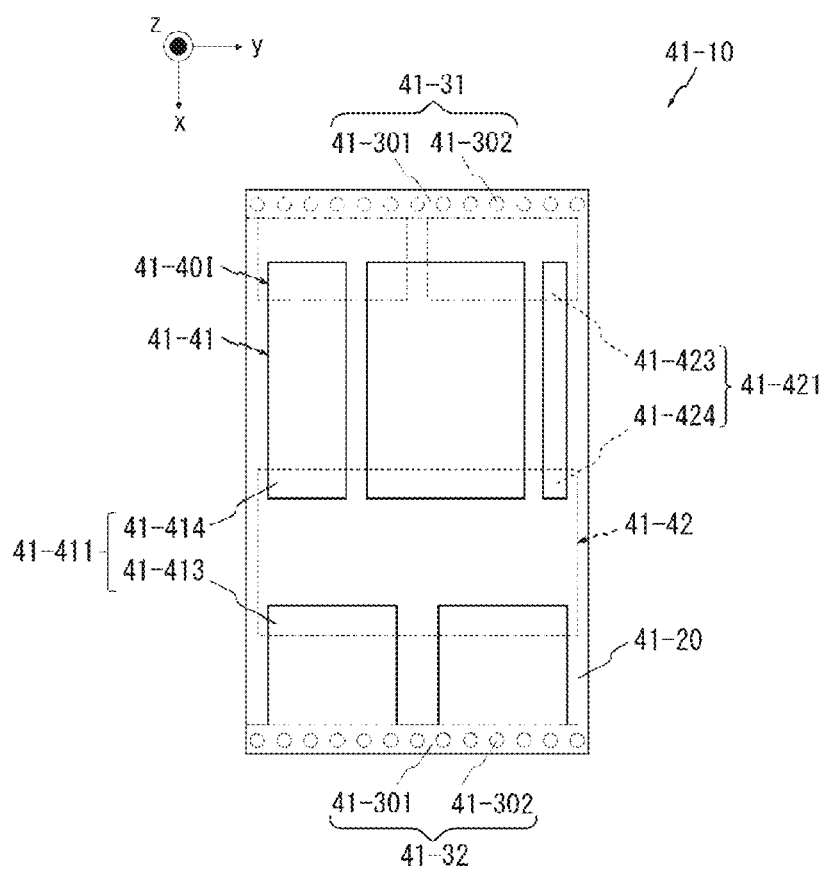
FIG. 41 is a planar view of a resonator according to embodiments.

In FIG. 41 is illustrated still another example of the resonator 39-10 illustrated in FIG. 39. According to embodiments, the number of second unit conductors 421 that are capacitively coupled with the first end portion of the first unit conductor 411 in the x direction can be different from the number of second unit conductors 421 that are capacitively coupled with the second end portion of the first unit conductor 411 in the x direction. In a resonator 41-10 illustrated in FIG. 41, one second floating conductor 41-424 has two first connecting conductors 41-413 capacitively coupled with the first end portion in the x direction and has three second floating conductors 41-424 capacitively coupled with the second end portion in the x direction. According to embodiments, a plurality of conductors arranged in the y direction can have different lengths in the y direction. In the resonator 41-10 illustrated in FIG. 41, three first floating conductors 41-414 arranged in the y direction have different lengths in the y direction.

Figure 42:
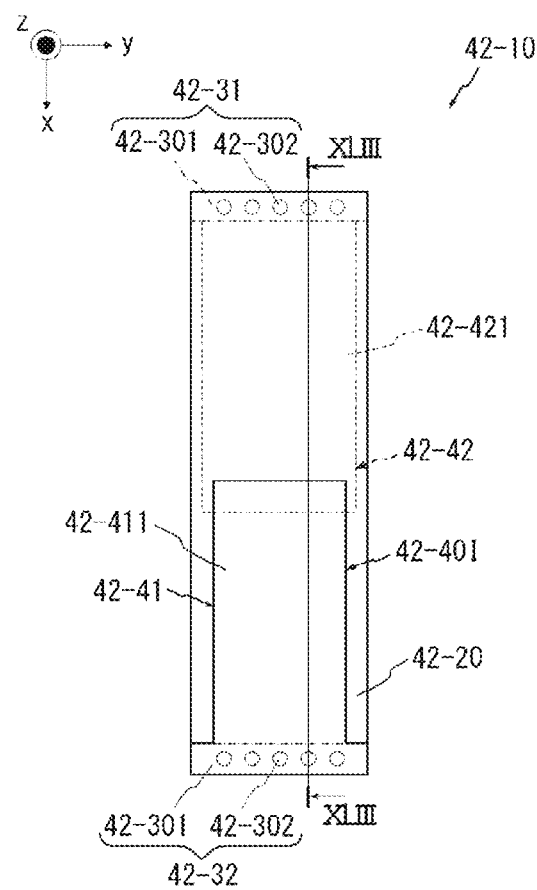
FIG. 42 is a planar view of a resonator according to embodiments.
Figure 43:
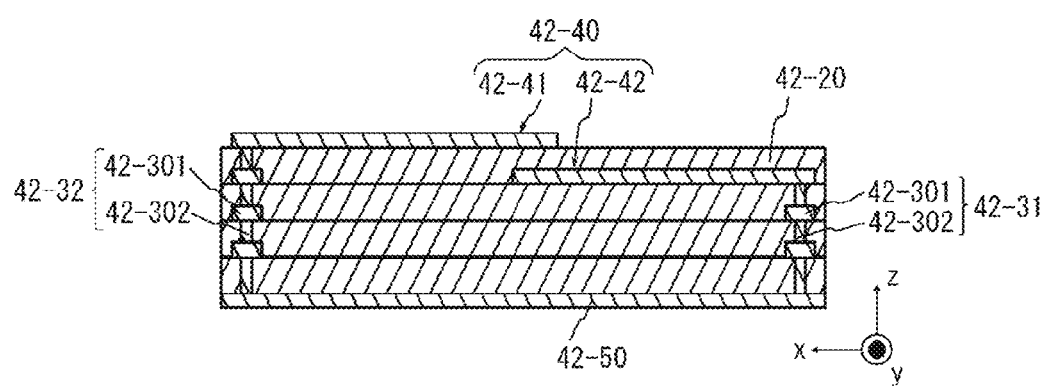
FIG. 43 is a cross-sectional view of the resonator illustrated in FIG. 42.

In FIG. 42 is illustrated still another example of the resonator 10. FIG. 43 is a cross-sectional view taken along XLIII-XLIII line illustrated in FIG. 42. In a resonator 42-10 illustrated in FIGS. 42 and 43, a first conductive layer 42-41 includes half of a patch resonator as a first unit resonator 42-41X. A second conductive layer 42-42 includes half of a patch resonator as a second unit resonator 42-42X. A unit resonator 42-40X includes one first divisional resonator 42-41Y and one second divisional resonator 42-42Y. A unit structure 42-10X includes the unit resonator 42-40X, and includes a part of a base 42-20 and a part of a fourth conductor 42-50 that overlap with the unit resonator 42-40X in the z direction. The resonator 42-10 illustrated in FIG. 42 has one unit resonator 42-40X extending in the x direction.

Figure 44:
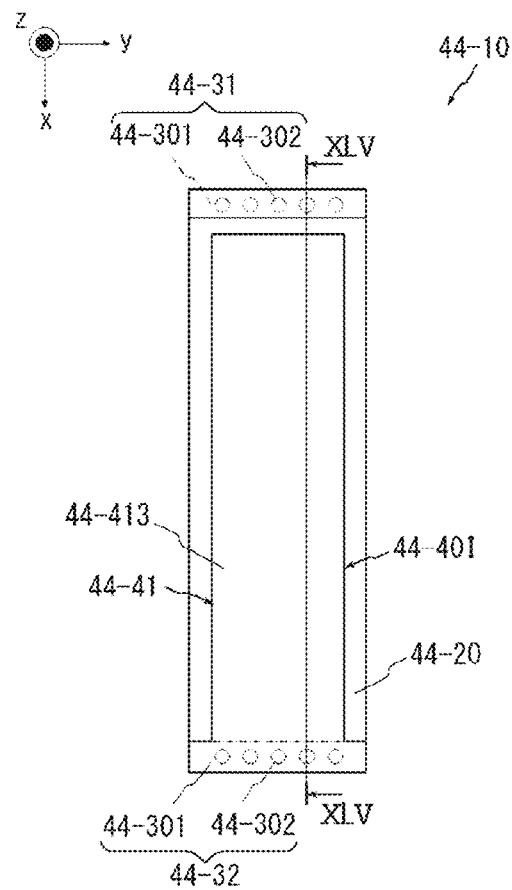
FIG. 44 is a planar view of a resonator according to embodiments.
Figure 45:
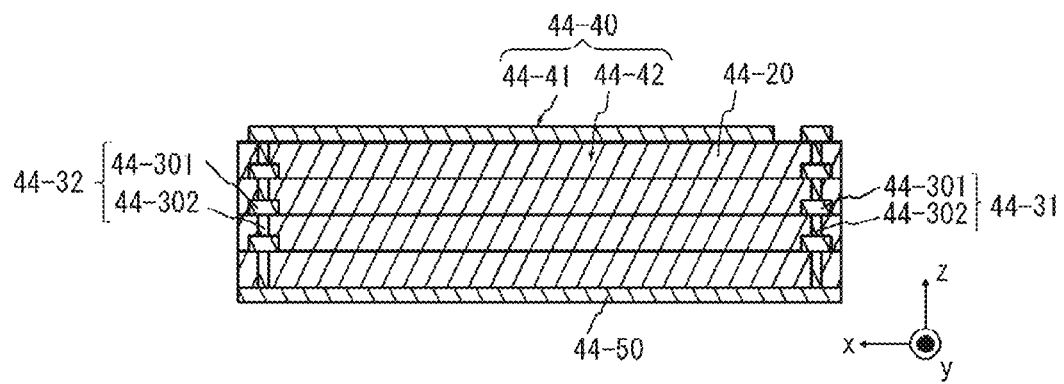
FIG. 45 is a cross-sectional view of the resonator illustrated in FIG. 44.

In FIG. 44 is illustrated still another example of the resonator 10. FIG. 45 is a cross-sectional view taken along XLV-XLV line illustrated in FIG. 44. In a resonator 44-10 illustrated in FIGS. 44 and 45, a third conductor 44-40 includes only a first connecting conductor 44-413. The first connecting conductor 44-413 faces a first conductor 44-31 in the x-y plane. The first connecting conductor 44-413 is configured to be capacitively coupled with the first conductor 44-31.

Figure 46:
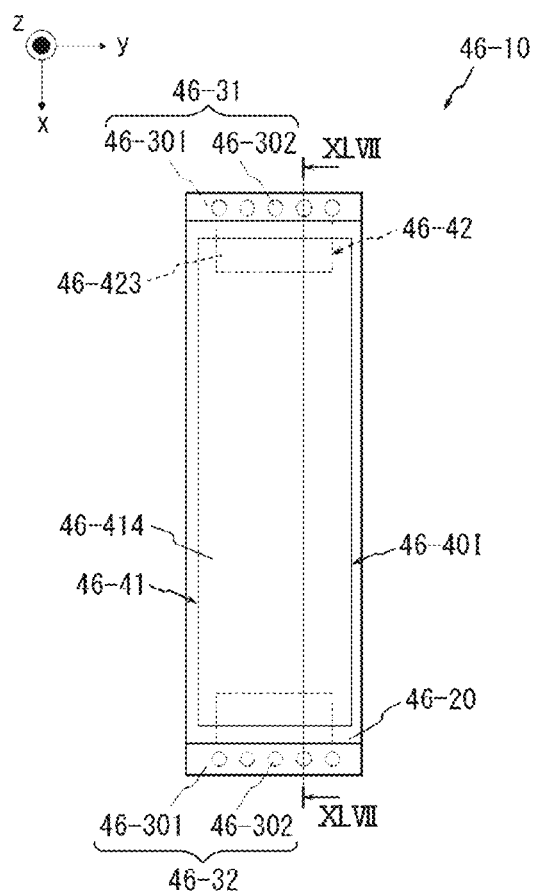
FIG. 46 is a planar view of a resonator according to embodiments.
Figure 47:
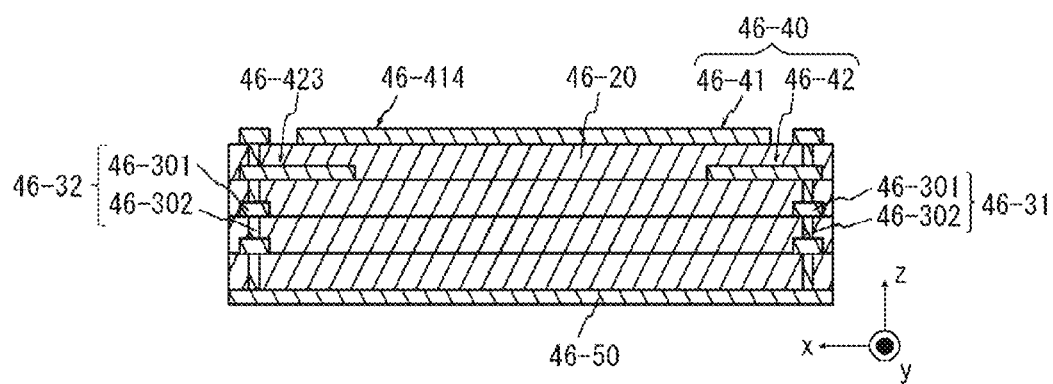
FIG. 47 is a cross-sectional view of the resonator illustrated in FIG. 46.

In FIG. 46 is illustrated still another example of the resonator 10. FIG. 47 is a cross-sectional view taken along XLVII-XLVII line illustrated in FIG. 46. In a resonator 46-10 illustrated in FIGS. 46 and 47, a third conductor 46-40 includes a first conductive layer 46-41 and a second conductive layer 46-42. The first conductive layer 46-41 includes one first floating conductor 46-414. The second conductive layer 46-42 includes two second connecting conductors 46-423. The first conductive layer 46-41 faces pair conductors 46-30 in the x-y plane. The two second connecting conductors 46-423 overlap with the single first floating conductor 46-414 in the z direction. The single first floating conductor 46-414 is configured to be capacitively coupled with the two second connecting conductors 46-423.

Figure 48:
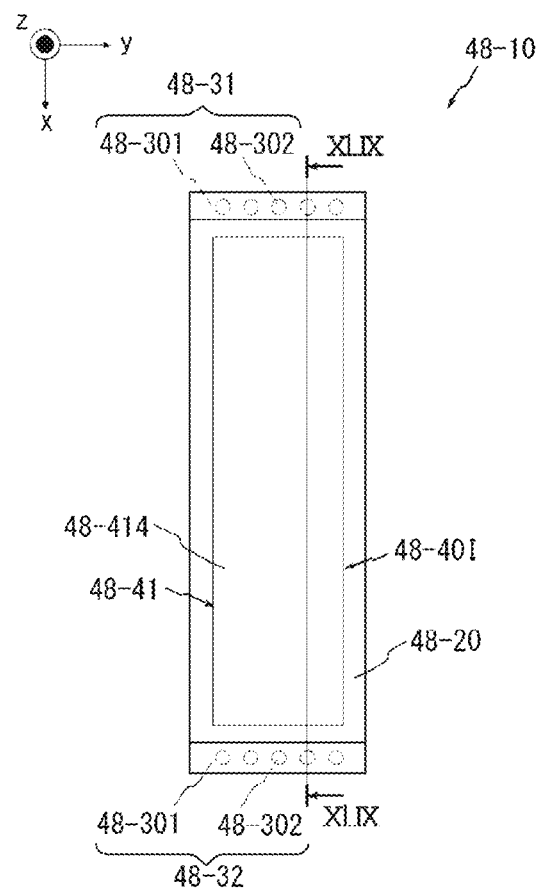
FIG. 48 is a planar view of a resonator according to embodiments.
Figure 49:
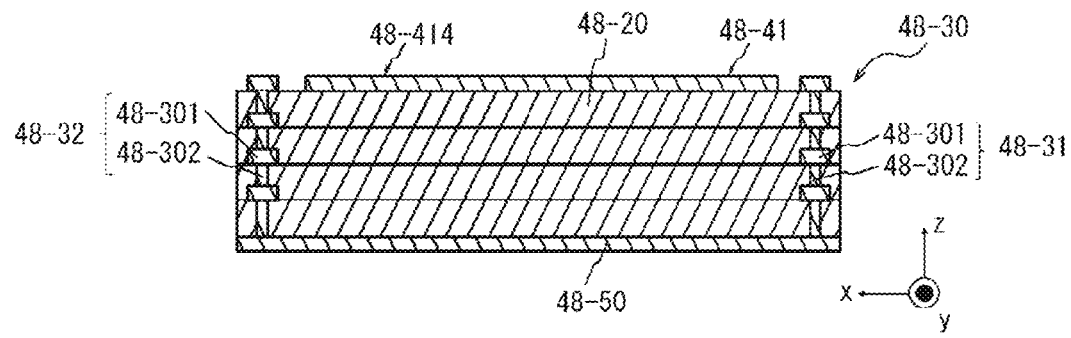
FIG. 49 is a cross-sectional view of the resonator illustrated in FIG. 48.

In FIG. 48 is illustrated still another example of the resonator 10. FIG. 49 is a cross-sectional diagram taken along XLIX-XLIX line illustrated in FIG. 48. In a resonator 48-10 illustrated in FIGS. 48 and 49, the third conductor 48-40 includes only one first floating conductor 48-414. The first floating conductor 48-414 faces pair conductors 48-30 in the x-y plane. The first floating conductor 48-414 is configured to be capacitively coupled with the pair conductors 48-30.

Figure 50:
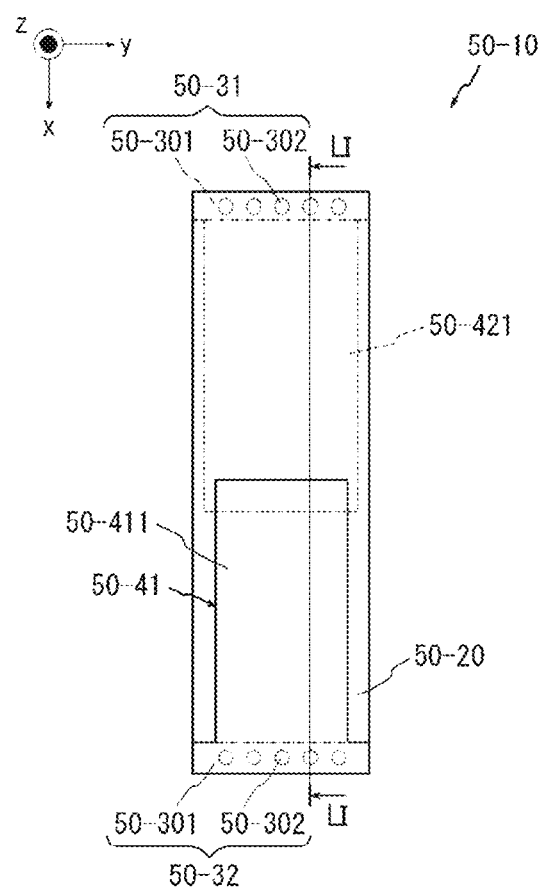
FIG. 50 is a planar view of a resonator according to embodiments.
Figure 51:
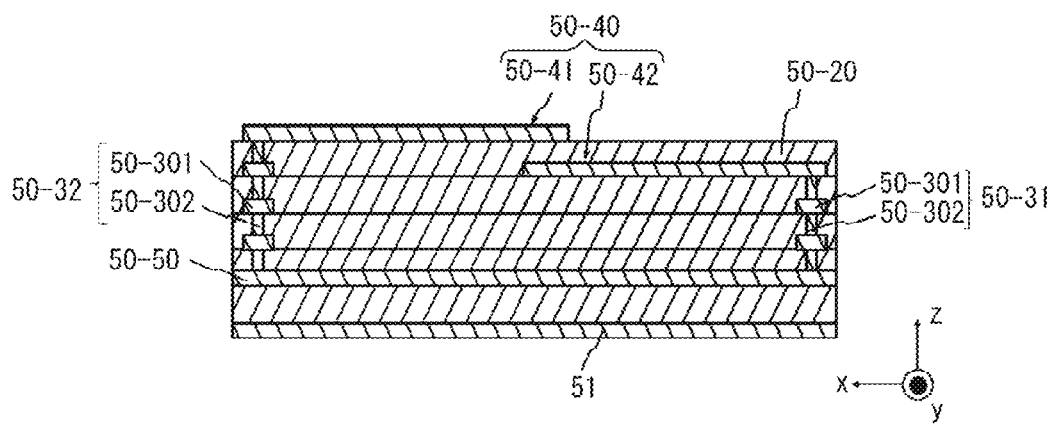
FIG. 51 is a cross-sectional view of the resonator illustrated in FIG. 50.

In FIG. 50 is illustrated still another example of the resonator 10. FIG. 51 is a cross-sectional view taken along LI-LI line illustrated in FIG. 50. A resonator 50-10 illustrated in FIGS. 50 and 51 is different from the resonator 42-10 illustrated in FIGS. 42 and 43 in the configuration of the fourth conductor 50. The resonator 50-10 includes a fourth conductor 50-50 and the reference potential layer 51. The reference potential layer 51 is configured to be electrically connected to the ground of the device that includes the resonator 50-10. The reference potential layer 51 faces third conductors 50-40 via the fourth conductor 50-50. The fourth conductor 50-50 is positioned between the third conductors 50-40 and the reference potential layer 51. The distance between the reference potential layer 51 and the fourth conductor 50-50 is shorter than the distance between the third conductors 50-40 and the fourth conductor 50-50.

Figure 52:
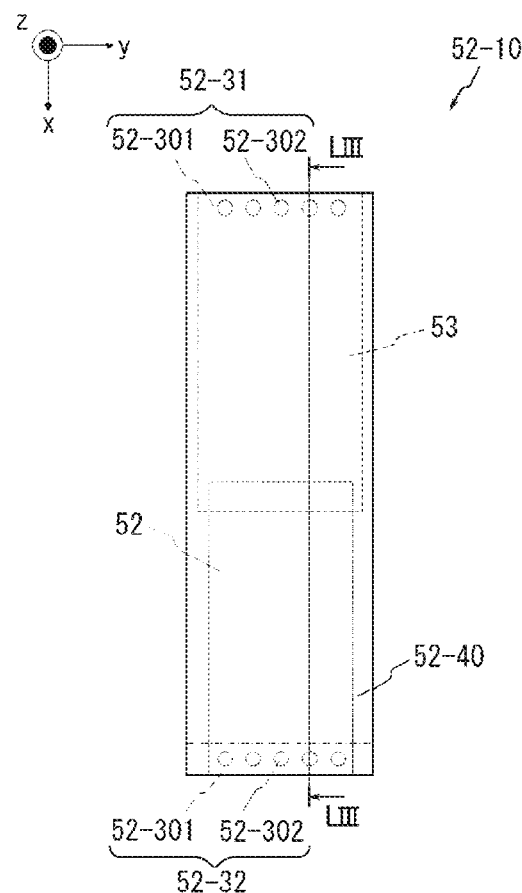
FIG. 52 is a planar view of a resonator according to embodiments.
Figure 53:
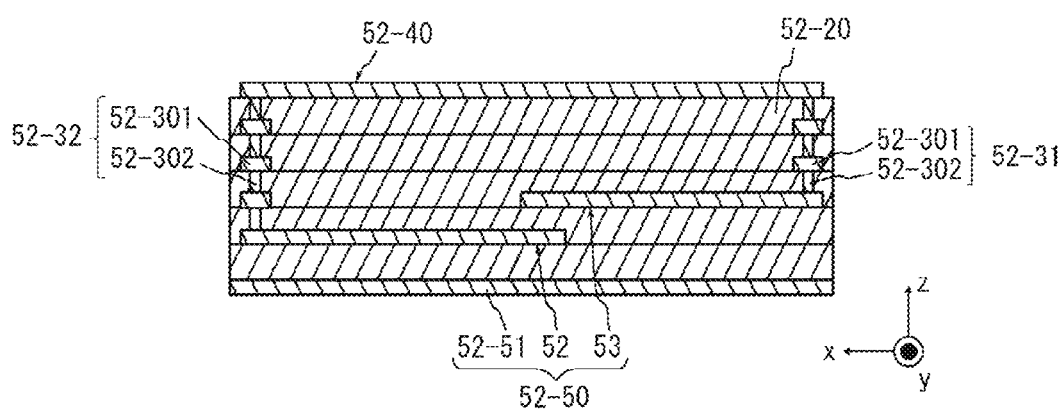
FIG. 53 is a cross-sectional view of the resonator illustrated in FIG. 52.

In FIG. 52 is illustrated still another example of the resonator 10. FIG. 53 is a cross-sectional view taken along LIII-LIII line illustrated in FIG. 52. A resonator 52-10 includes a fourth conductor 52-50 and a reference potential layer 52-51. The reference potential layer 52-51 is configured to be electrically connected to the ground of the device that includes the resonator 52-10. The fourth conductor 52-50 includes a resonator. The fourth conductor 52-50 includes the third conductive layer 52 and the fourth conductive layer 53. The third conductive layer 52 and the fourth conductive layer 53 are capacitively coupled with each other. The third conductive layer 52 and the fourth conductive layer 53 face each other in the z direction. The distance between the third conductive layer 52 and the fourth conductive layer 53 is shorter than the distance between the fourth conductive layer 53 and the reference potential layer 52-51. The distance between the third conductive layer 52 and the fourth conductive layer 53 is shorter than the distance between the fourth conductor 52-50 and the reference potential layer 52-51. Herein, third conductors 52-40 constitutes one conductive layer.

Figure 54:
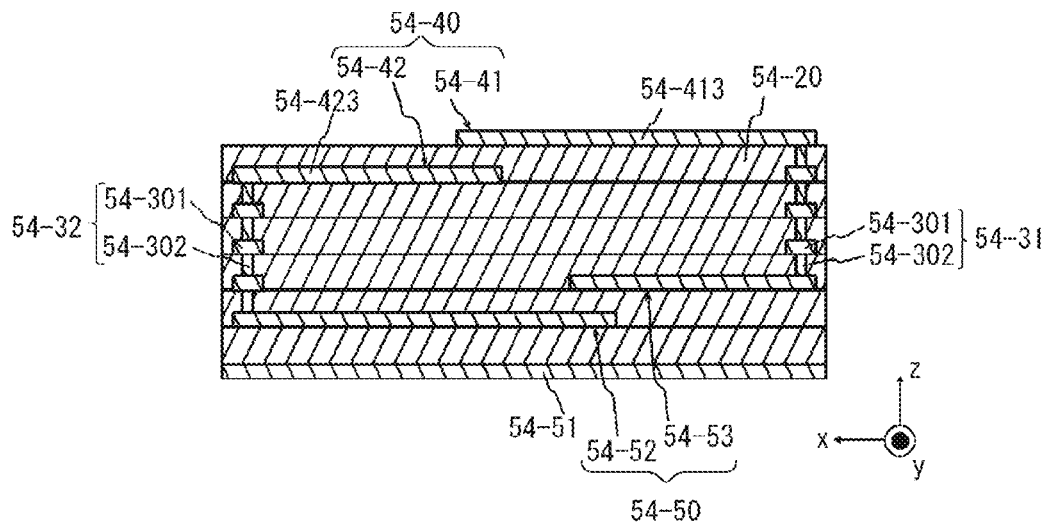
FIG. 54 is a cross-sectional view of a resonator according to embodiments.

In FIG. 54 is illustrated another example of a resonator 53-10 illustrated in FIG. 53. A resonator 54-10 illustrated in FIG. 54 includes a third conductor 54-40, a fourth conductor 54-50, and a reference potential layer 54-51. The third conductor 54-40 includes a first conductive layer 54-41 and a second conductive layer 54-42. The first conductive layer 54-41 includes a first connecting conductor 54-413. The second conductive layer 54-42 includes a second connecting conductor 54-423. The first connecting conductor 54-413 is configured to be capacitively coupled with the second connecting conductor 54-423. The reference potential layer 54-51 is configured to be electrically connected to the ground of the device that includes the resonator 54-10. The fourth conductor 54-50 includes a third conductive layer 54-52 and a fourth conductive layer 54-53. The third conductive layer 54-52 and the fourth conductive layer 54-53 are capacitively coupled with each other. The third conductive layer 54-52 and the fourth conductive layer 54-53 face each other in the z direction. The distance between the third conductive layer 54-52 and the fourth conductive layer 54-53 is shorter than the distance between the fourth conductive layer 54-53 and the reference potential layer 54-51. The distance between the third conductive layer 54-52 and the fourth conductive layer 54-53 is shorter than the distance between the fourth conductor 54-50 and the reference potential layer 54-51.

Figure 55:
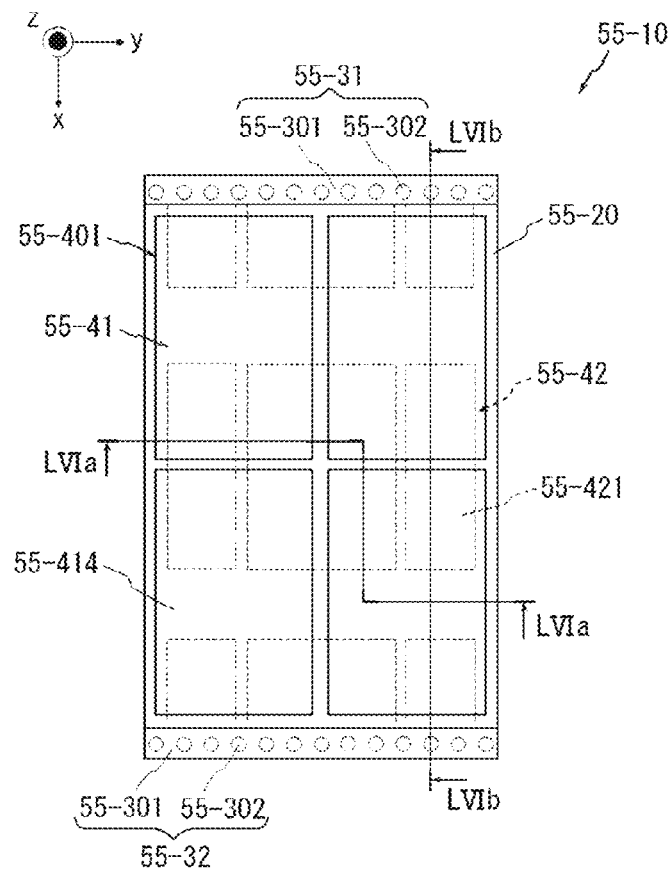
FIG. 55 is a planar view of a resonator according to embodiments.
Figure 56A:
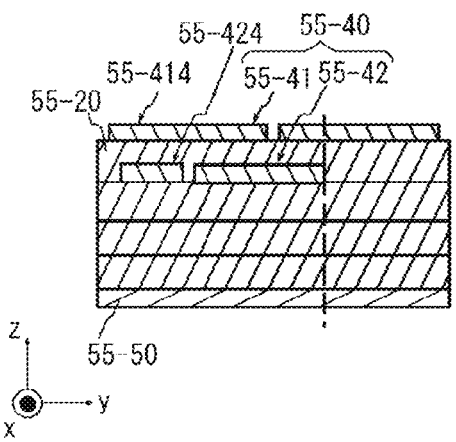
FIG. 56A is a cross-sectional view of the resonator illustrated in FIG. 55.
Figure 56B:
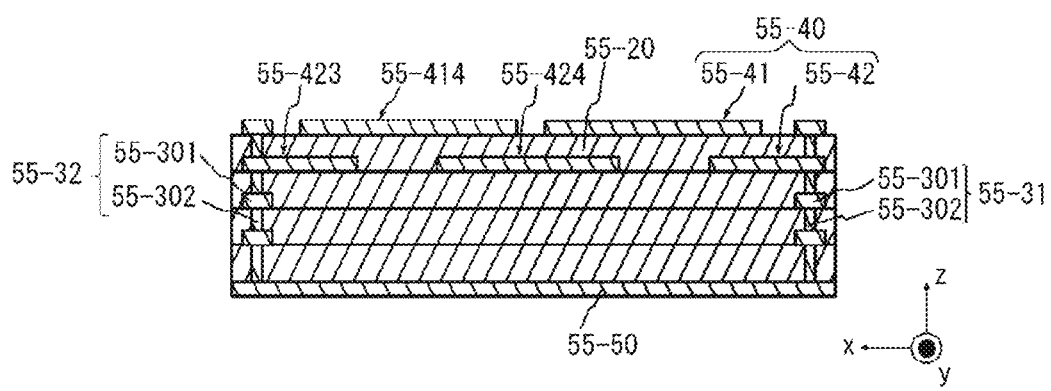
FIG. 56B is a cross-sectional view of the resonator illustrated in FIG. 55.

In FIG. 55 is illustrated still another example of the resonator 10. FIG. 56A is a cross-sectional view taken along LVIa-LVIa line illustrated in FIG. 55. FIG. 56B is a cross-sectional view taken along LVIb-LVIb line illustrated in FIG. 55. In a resonator 55-10 illustrated in FIG. 55, a first conductive layer 55-41 includes four first floating conductors 55-414. The first conductive layer 55-41 does not include any first connecting conductor 55-413. In the resonator 55-10, a second conductive layer 55-42 includes six second connecting conductors 55-423 and three second floating conductors 55-424. Two of the second connecting conductors 55-423 are configured to be capacitively coupled with two of the first floating conductors 55-414. One second floating conductor 55-424 is configured to be capacitively coupled with four first floating conductors 414. Two second floating conductors 55-424 are configured to be capacitively coupled with two first floating conductors 55-414.

Figure 57:
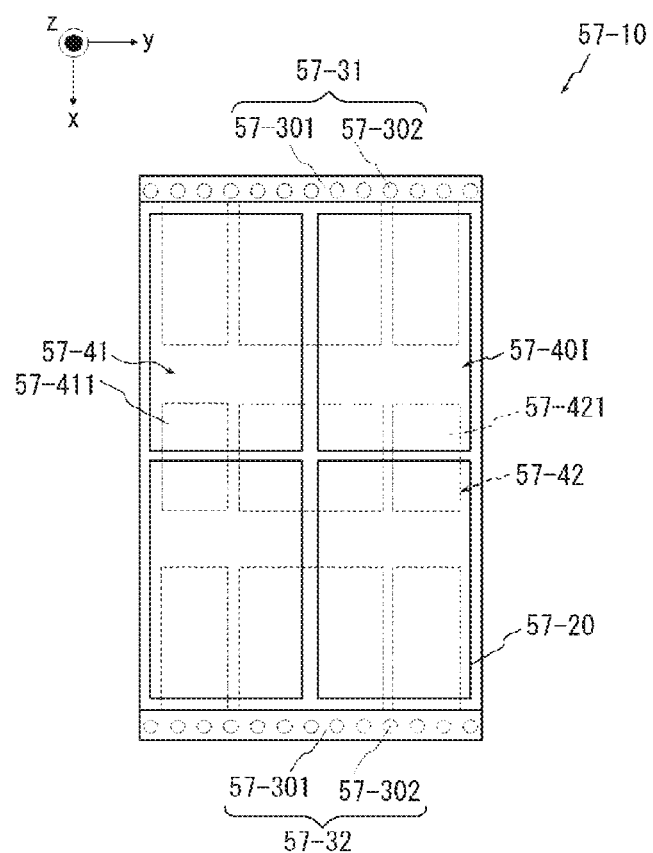
FIG. 57 is a planar view of a resonator according to embodiments.

In FIG. 57 is illustrated another example of the resonator 55-10 illustrated in FIG. 55. In a resonator 57-10 illustrated in FIG. 57, the size of a second conductive layer 57-42 is different from the size of the second conductive layer 55-42 in the resonator 55-10. In the resonator 57-10 illustrated in FIG. 57, the length of a second floating conductor 57-424 in the x direction is smaller than the length of a second connecting conductor 57-423 in the x direction.

Figure 58:
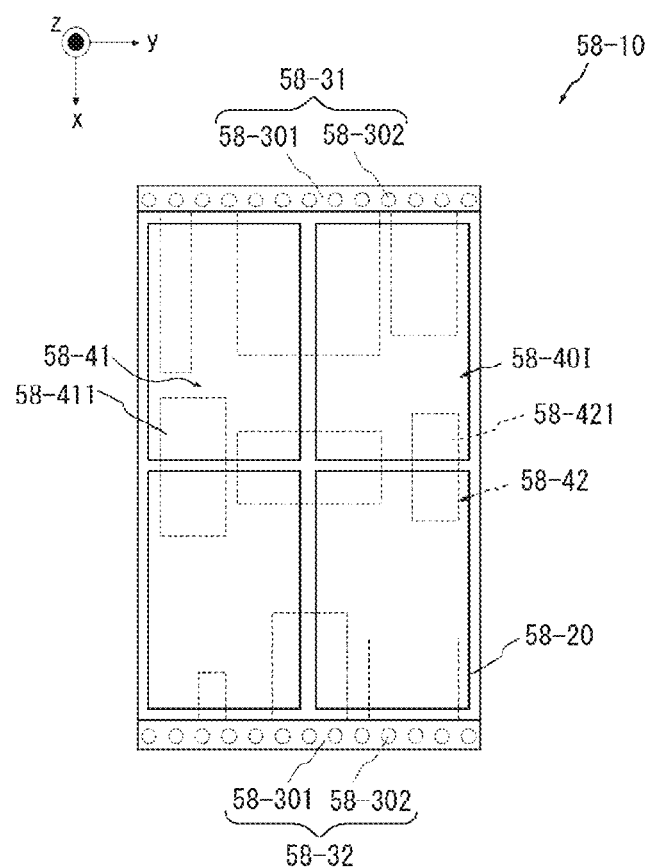
FIG. 58 is a planar view of a resonator according to embodiments.

In FIG. 58 is illustrated still another example of the resonator 55-10 illustrated in FIG. 55. In a resonator 58-10 illustrated in FIG. 58, the size of a second conductive layer 58-42 is different from the size of the second conductive layer 55-42 in the resonator 55-10. In the resonator 58-10, a plurality of second unit conductors 58-421 have different first areas. In the resonator 58-10 illustrated in FIG. 58, the plurality of second unit conductors 58-421 have different lengths in the x direction. In the resonator 58-10 illustrated in FIG. 58, the plurality of second unit conductors 58-421 have different lengths in the y direction. In FIG. 58, the second unit conductors 58-421 have mutually different first surface areas, mutually different lengths, and mutually different widths, but is not limited thereto. In FIG. 58, the plurality of second unit conductors 58-421 can be different from each other in some of the first area, the length, and the width. The plurality of second unit conductors 58-421 can match each other in some or all of the first surface area, the length, and the width. The plurality of second unit conductors 58-421 can be different from each other in some or all of the first area, the length, and the width. The plurality of second unit conductors 58-421 can match each other in some or all of the first area, the length, and the width. Some of the plurality of second unit conductors 58-421 can match each other in some or all of the first area, the length, and the width.

In the resonator 58-10 illustrated in FIG. 58, a plurality of second connecting conductors 58-423 arranged in the y direction have mutually different first areas. In the resonator 58-10 illustrated in FIG. 58, the plurality of second connecting conductors 58-423 arranged in the y direction have mutually different lengths in the x direction. In the resonator 58-10 illustrated in FIG. 58, the plurality of second connecting conductors 58-423 have mutually different lengths in the y direction. In FIG. 58, the second connecting conductors 58-423 have mutually different first areas, mutually different lengths, and mutually different widths, but is not limited thereto. In FIG. 58, the plurality of second connecting conductors 58-423 can be different from each other in some of the first area, the length, and the width. The plurality of second connecting conductors 58-423 can match each other in some or all of the first area, the length, and the width. The plurality of second connecting conductors 58-423 can be different from each other in some or all of the first area, the length, and the width. The plurality of second connecting conductors 58-423 can match each other in some or all of the first area, the length, and the width. Some of the plurality of second connecting conductors 58-423 can match each other in some or all of the first area, the length, and the width.

In the resonator 58-10, a plurality of second floating conductors 58-424 arranged in the y direction has mutually different first areas. In the resonator 58-10, the plurality of second floating conductors 58-424 arranged in the y direction has mutually different lengths in the z direction. In the resonator 58-10, the plurality of second floating conductors 58-424 arranged in the y direction has mutually different lengths in the y direction. The second floating conductors 58-424 have mutually different first areas, mutually different lengths, and mutually different widths, but is not limited thereto. The plurality of second floating conductors 58-424 can be different from each other in some of the first area, the length, and the width. The plurality of second floating conductors 58-424 can match each other in some or all of the first area, the length, and the width. The plurality of second floating conductors 58-424 can be different from each other in some or all of the first area, the length, and the width. The plurality of second floating conductors 58-424 can match each other in some or all of the first area, the length, and the width. Some of the plurality of second floating conductors 58-424 can match each other in some or all of the first area, the length, and the width.

Figure 59:
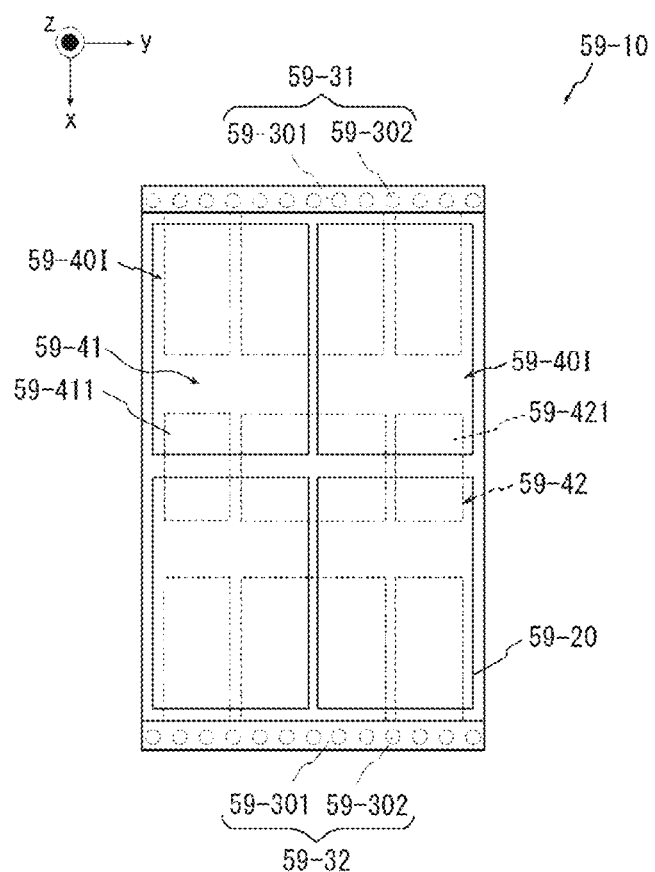
FIG. 59 is a planar view of a resonator according to embodiments.

FIG. 59 is a diagram illustrating another example of the resonator 57-10 illustrated in FIG. 57. In a resonator 59-10 illustrated in FIG. 59, the distance between first unit conductors 59-411 in the y direction is different from the distance between first unit conductors 57-411 in the y direction in the resonator 57-10. In the resonator 59-10, the distance between the first unit conductors 59-411 in the y direction is shorter than the distance between the first unit conductors 59-411 in the x direction. In the resonator 59-10, since pair conductors 59-30 can function as electric conductors, the electric current flows in the x direction. In the resonator 59-10, the electric current flowing in a third conductor 59-40 in the y direction is ignorable. The distance between the first unit conductors 59-411 in the y direction can be shorter than the distance between the first unit conductors 59-411 in the x direction. As a result of setting a shorter distance between the first unit conductors 59-411 in the y direction, the area of the first unit conductors 59-411 can be increased.

Figure 60:
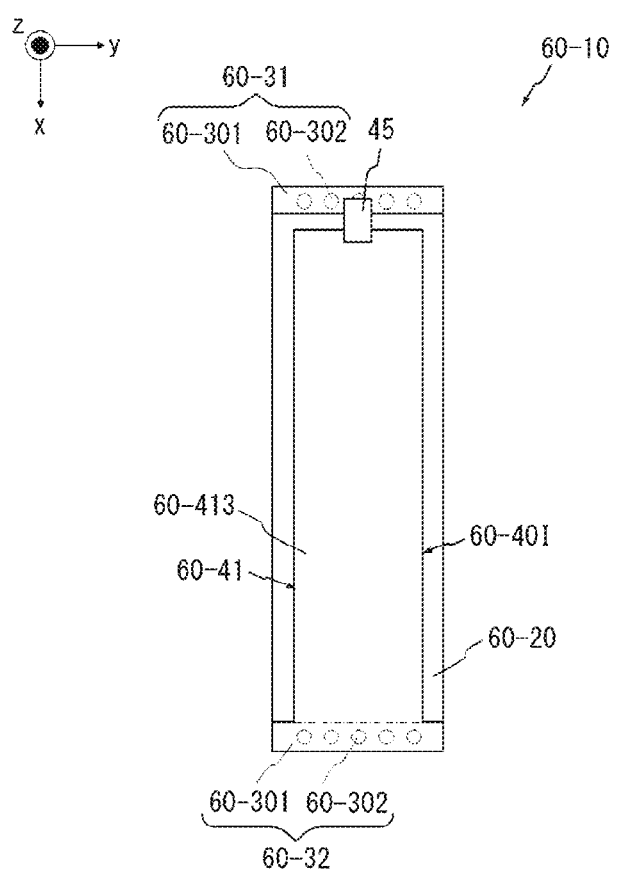
FIG. 60 is a planar view of a resonator according to embodiments.
Figure 61:
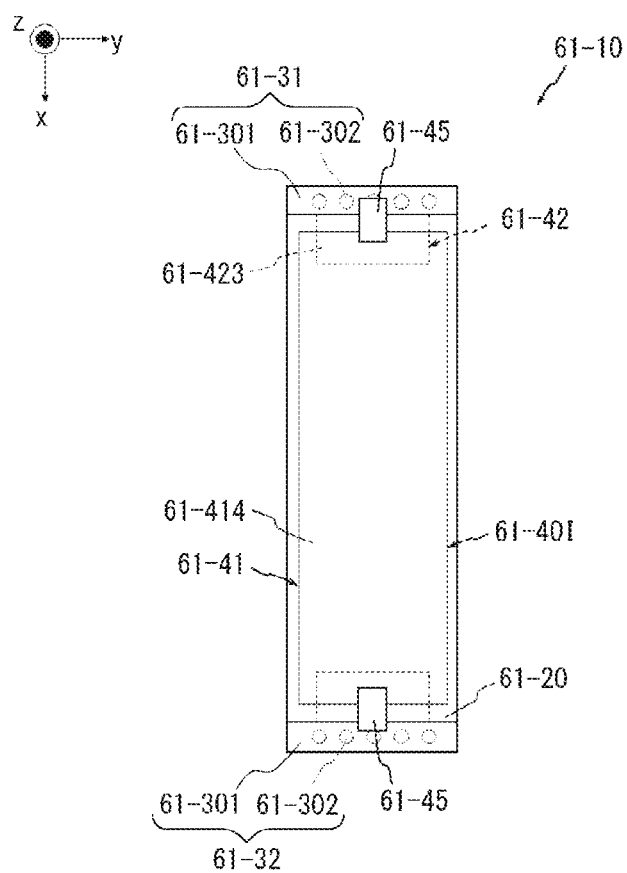
FIG. 61 is a planar view of a resonator according to embodiments.
Figure 62:
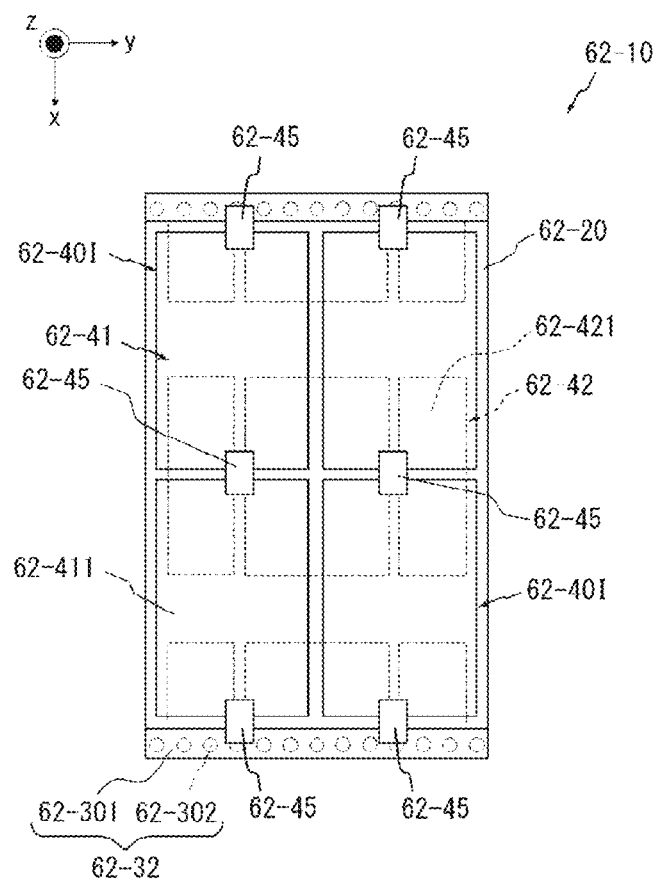
FIG. 62 is a planar view of a resonator according to embodiments.

FIGS. 60 to 62 are diagrams illustrating still other examples of the resonator 10. These resonators 10 include the impedance elements 45. The unit conductors to which the impedance elements 45 are connected are not limited to the examples illustrated in FIGS. 60 to 62. Some of the impedance elements 45 illustrated in FIGS. 60 to 62 can be omitted. The impedance elements 45 can have the capacitance characteristics. The impedance elements 45 can have the inductance characteristics. The impedance elements 45 can be mechanical variable elements or electrical variable elements. The impedance element 45 can connect two different conductors located in the same layer.

Figure 63:
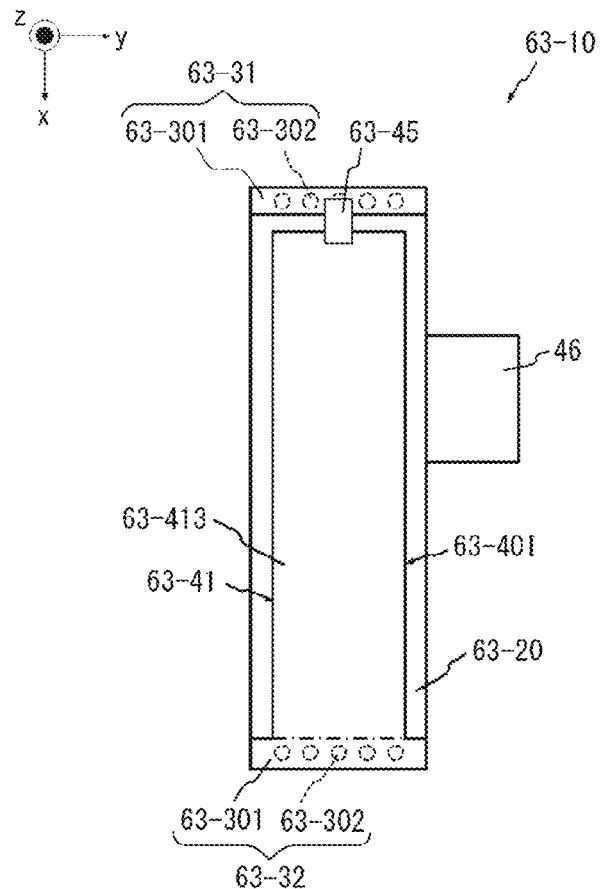
FIG. 63 is a planar view of a resonator according to embodiments.

FIG. 63 is a planar view illustrating still another example of the resonator 10. A resonator 63-10 includes the conductive component 46. The resonator 63-10 including the conductive component 46 is not limited to have this structure. The resonator 10 can include a plurality of conductive components 46 on one side in the y direction. The resonator 10 can include one or more conductive components 46 on both sides in the y direction.

Figure 64:
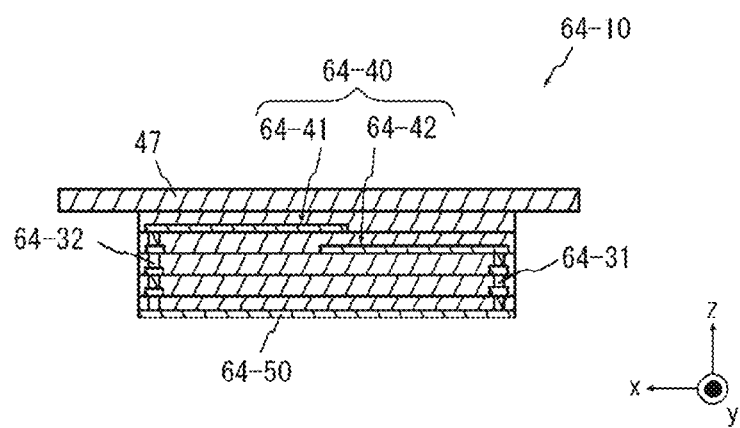
FIG. 64 is a planar view of a resonator according to embodiments.

FIG. 64 is a cross-sectional view illustrating still another example of the resonator 10. A resonator 64-10 includes the dielectric component 47. In the resonator 64-10, the dielectric component 47 overlaps with a third conductor 64-40 in the z direction. The resonator 64-10 including the dielectric component 47 is not limited to have this structure. In the resonator 10, the dielectric component 47 can overlap with only some part of the third conductor 40.

An antenna has at least one of a function of radiating electromagnetic waves and a function of receiving electromagnetic waves. An antenna according to the present disclosure includes a first antenna 60 and a second antenna 70, but is not limited thereto.

The first antenna 60 includes the base 20, the pair conductors 30, the third conductors 40, the fourth conductor 50, and a first feeding line 61. As an example, the first antenna 60 includes a third base 24 on the base 20. The third base 24 can have a different composition from the base 20. The third base 24 can be positioned on the third conductors 40. FIGS. 65 to 78 are diagrams illustrating the first antenna 60 representing an example according to embodiments.

The first feeding line 61 is configured to feed electric power to at least one of the resonators that are arranged periodically as artificial magnetic conductors. In the case of feeding electric power to a plurality of resonators, the first antenna 60 can include a plurality of first feeding lines. The first feeding line 61 can be configured to be electromagnetically connected to any of the resonators arranged periodically as artificial magnetic conductors. The first feeding line 61 can be configured to be electromagnetically connected to any of a pair of conductors seen as electrical conductors from the resonators that are arranged periodically as artificial magnetic conductors.

The first feeding line 61 is configured to feed electric power to at least one of the first conductor 31, the second conductor 32, and the third conductors 40. In the case of feeding electric power to a plurality of parts of the first conductor 31, the second conductor 32, and the third conductors 40; the first antenna 60 can include a plurality of first feeding lines. The first feeding line 61 can be configured to be electromagnetically connected to any of the first conductor 31, the second conductor 32, and the third conductors 40. When the first antenna 60 includes the reference potential layer 51 in addition to including the fourth conductor 50, the first feeding line 61 can be configured to be electromagnetically connected to any of the first conductor 31, the second conductor 32, the third conductors 40, and the fourth conductor 50. The first feeding line 61 can be configured to be electrically connected to either the fifth conductive layer 301 or the fifth conductors 302 of the pair conductors 30. A part of the first feeding line 61 can be integrated with the fifth conductive layer 301.

The first feeding line 61 can be configured to be electromagnetically connected to the third conductors 40. For example, the first feeding line 61 is configured to be electromagnetically connected to one of the first unit resonators 41X. For example, the first feeding line 61 is configured to be electromagnetically connected to one of the second unit resonators 42X. The first feeding line 61 is configured to be electromagnetically connected to the unit conductor of the third conductor 40 at a point different from the center in the x direction. According to an embodiment, the first feeding line 61 is configured to supply electric power to at least one resonator included in the third conductors 40. According to an embodiment, the first feeding line 61 is configured to feed the electric power coming from at least one resonator included in the third conductors 40 to the outside. At least a part of the first feeding line 61 can be positioned in the base 20. The first feeding line 61 can be exposed to the outside from the two z-x planes of the base 20, or the two z-y planes of the base 20, or the two x-y planes of the base 20.

The first feeding line 61 can be connected to the third conductors 40 from the forward direction of the z direction or from the reverse direction of the z direction. The fourth conductor 50 can be omitted from around the first feeding line 61. The first feeding line 61 can be configured to be electromagnetically connected to the third conductors 40 through the opening of the fourth conductor 50. The first conductive layer 41 can be omitted from around the first feeding line 61. The first feeding line 61 can be connected to the second conductive layer 42 through the opening of the first conductive layer 41. The first feeding line 61 can be in contact with the third conductors 40 along the x-y plane. The pair conductors 30 can be omitted from around the first feeding line 61. The first feeding line 61 can be connected to the third conductors 40 through the opening of the pair conductors 30. The first feeding line 61 is connected to the unit conductors of the third conductors 40 at a distance from the central portion of the unit conductors.

Figure 65:
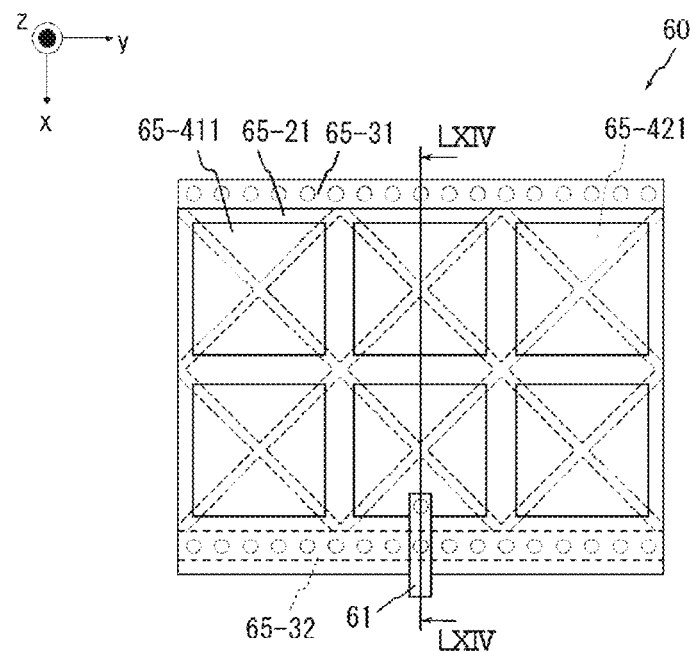
FIG. 65 is a planar view of an antenna according to embodiments.
Figure 66:
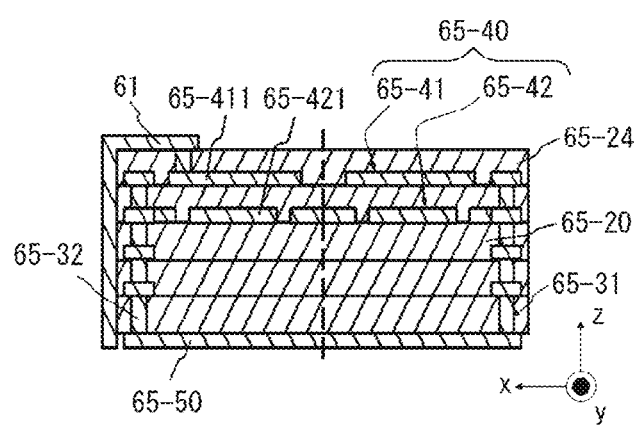
FIG. 66 is a cross-sectional view of the antenna illustrated in FIG. 65.

FIG. 65 is a planar view of the x-y plane when the first antenna 60 is viewed from the z direction. FIG. 66 is a cross-sectional view taken along LXIV-LXIV line illustrated in FIG. 65. The first antenna 60 illustrated in FIGS. 65 and 66 includes a third base 65-24 on a third conductor 65-40. The third base 65-24 has an opening on a first conductive layer 65-41. The first feeding line 61 is configured to be electrically connected to the first conductive layer 65-41 via the opening of the third base 65-24.

Figure 67:
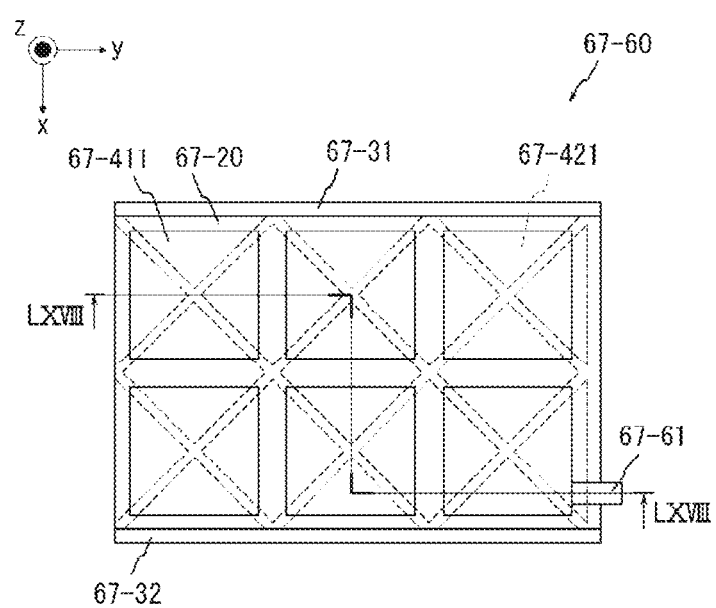
FIG. 67 is a planar view of an antenna according to embodiments.
Figure 68:
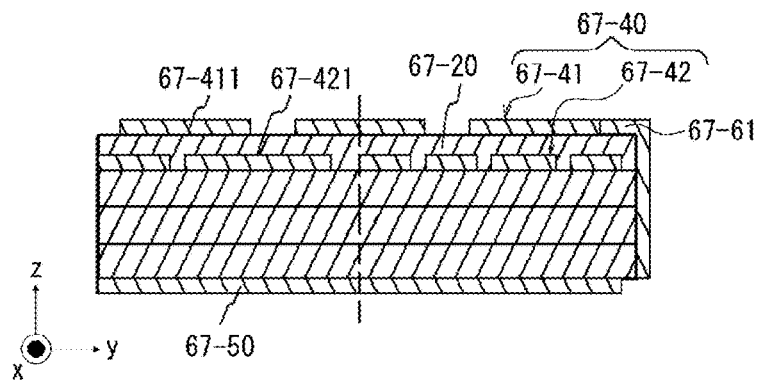
FIG. 68 is a cross-sectional view of the antenna illustrated in FIG. 67.

FIG. 67 is a planar view of the x-y plane when the first antenna 60 is viewed from the z direction. FIG. 68 is a cross-sectional view taken along LXVIII-LXVIII line illustrated in FIG. 67. In a first antenna 67-60 illustrated in FIGS. 67 and 68, a part of a first feeding line 67-61 is positioned on a base 67-20. The first feeding line 67-61 can be connected to a third conductor 67-40 in the x-y plane. The first feeding line 67-61 can be connected to a first conductive layer 67-41 in the x-y plane. According to an embodiment, the first feeding line 61 can be connected to the second conductive layer 42 in the x-y plane.

Figure 69:
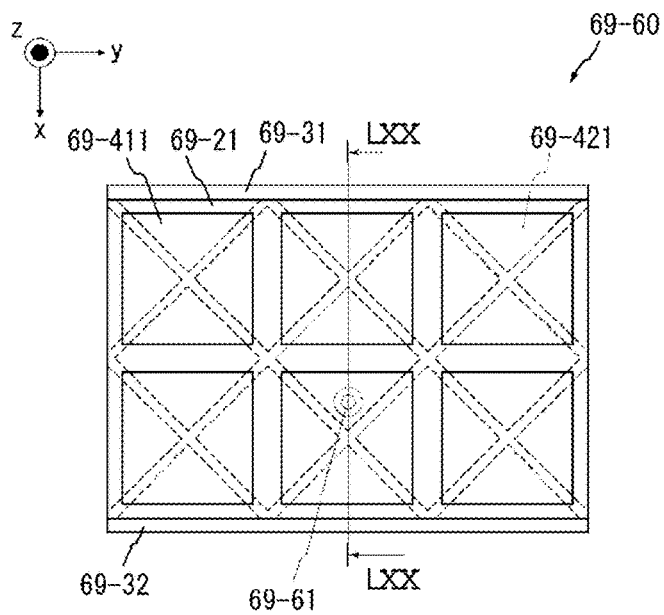
FIG. 69 is a planar view of an antenna according to embodiments.
Figure 70:
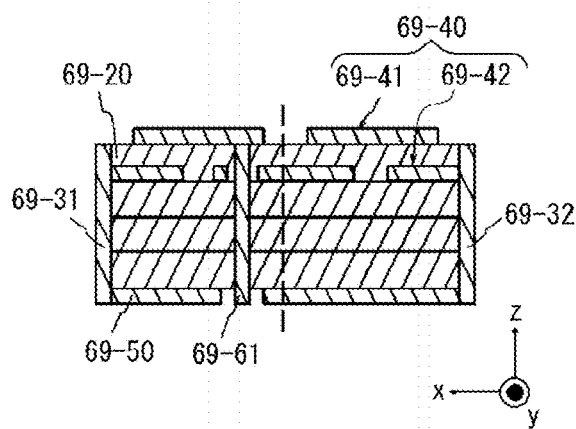
FIG. 70 is a cross-sectional view of the antenna illustrated in FIG. 69.

FIG. 69 is a planar view of the x-y plane when the first antenna 60 is viewed from the z direction. FIG. 70 is a cross-sectional view taken along LXX-LXX line illustrated in FIG. 69. In the first antenna 60 illustrated in FIGS. 69 and 70, a first feeding line 69-61 is positioned in a base 69-20. The first feeding line 69-61 can be connected to a third conductor 69-40 from the reverse direction of the z direction. A fourth conductor 69-50 can have an opening. The fourth conductor 69-50 can have an opening at a position overlapping with the third conductor 69-40 in the z direction. The first feeding line 69-61 can be exposed to the outside of the base 20 via that opening.

Figure 71:
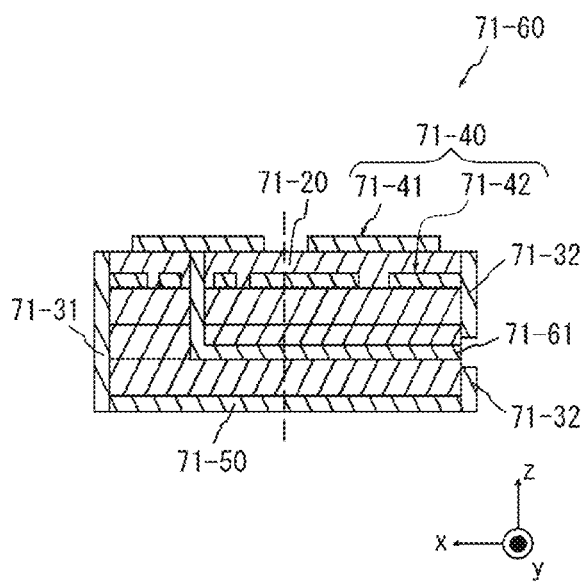
FIG. 71 is a cross-sectional view of an antenna according to embodiments.

FIG. 71 is a cross-sectional view of the y-z plane when the first antenna 60 is viewed from the x direction. Pair conductors 71-30 can have an opening. A first feeding line 71-61 can be exposed to the outside of a base 71-20 via that opening.

In the first plane, the electromagnetic waves radiated by the first antenna 60 have a greater polarized wave component in the x direction than the polarization component in the y direction. When a metallic place approaches the fourth conductor 50, the polarization component in the x direction has less attenuation than the horizontal polarization component. Thus, the first antenna 60 can maintain the radiation efficiency even when a metallic plate approaches from outside.

Figure 72:
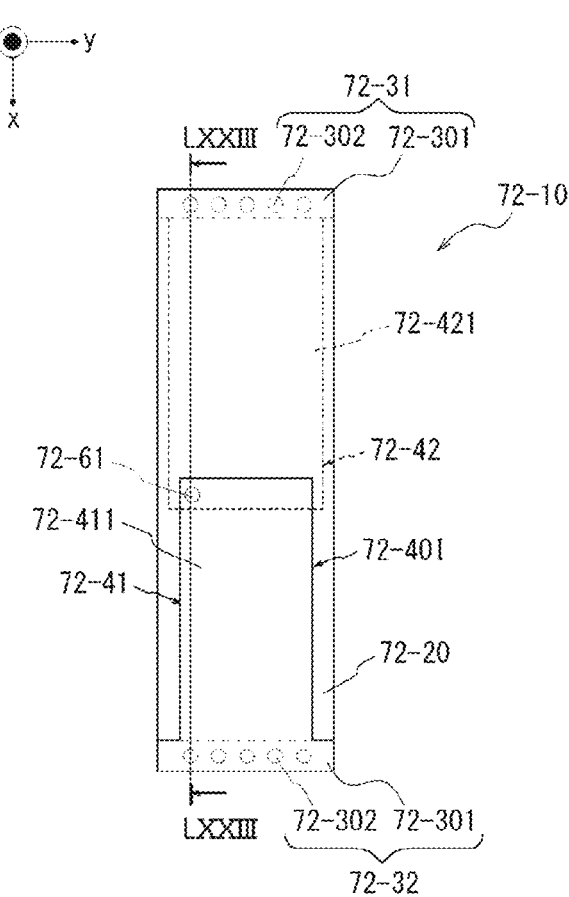
FIG. 72 is a planar view of an antenna according to embodiments.
Figure 73:
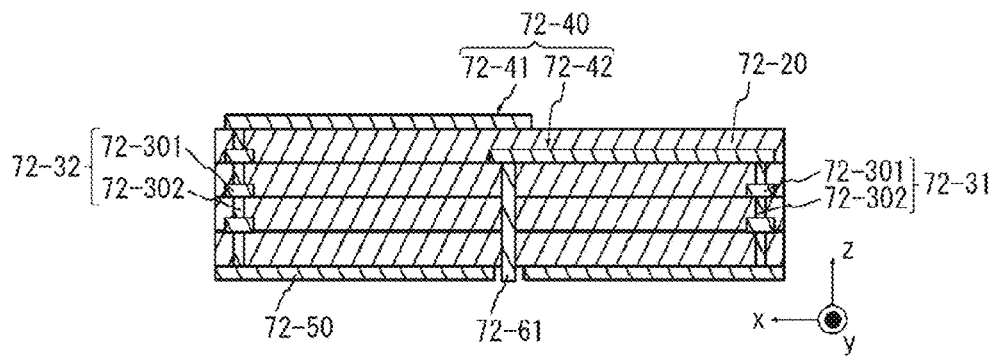
FIG. 73 is a cross-sectional view of the antenna illustrated in FIG. 72.
Figure 74:
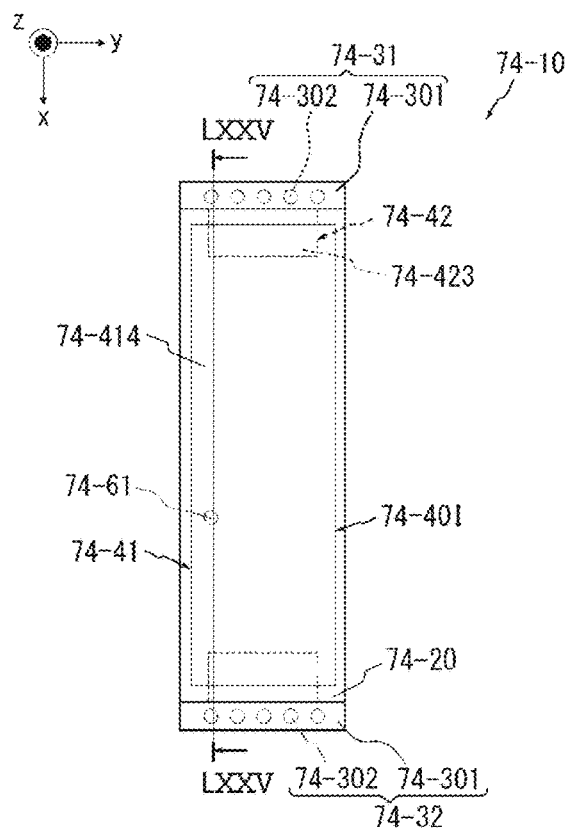
FIG. 74 is a planar view of an antenna according to embodiments.
Figure 75:
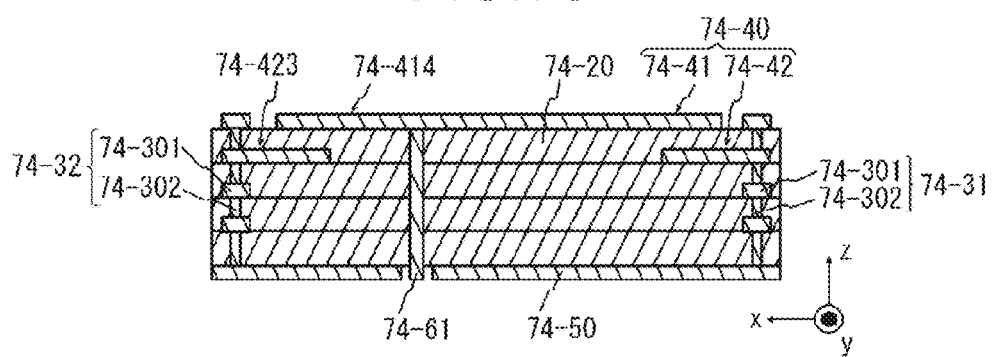
FIG. 75 is a cross-sectional view of the antenna illustrated in FIG. 74.
Figure 76:
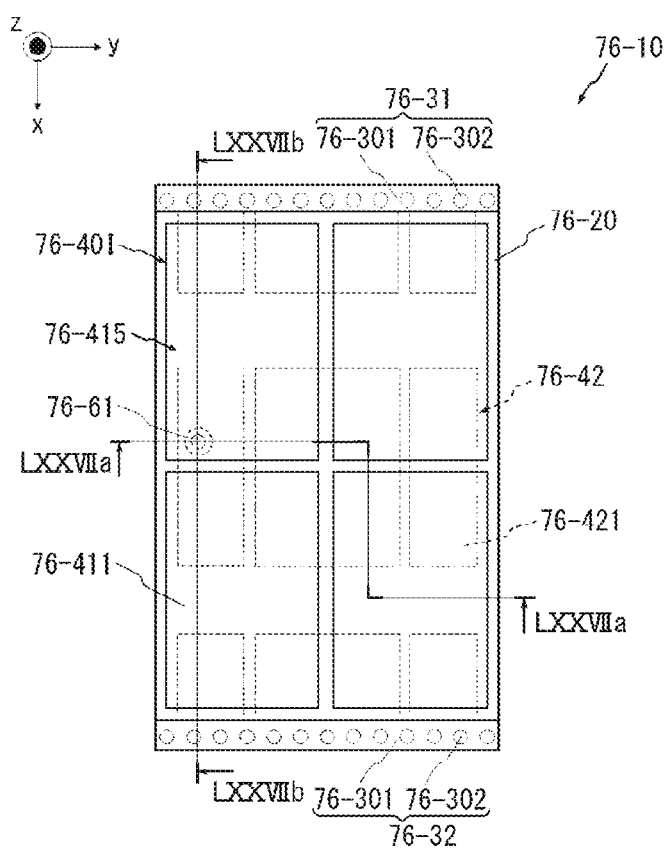
FIG. 76 is a planar view of an antenna according to embodiments.
Figure 77A:
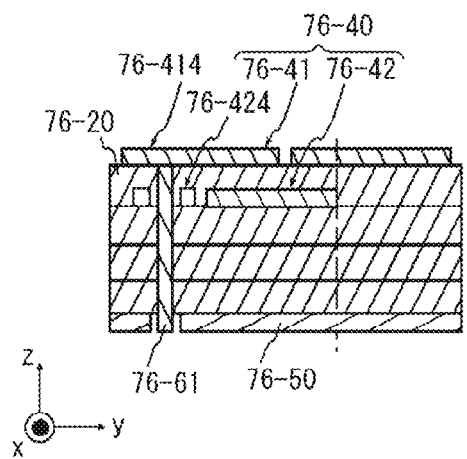
FIG. 77A is a cross-sectional view of the antenna illustrated in FIG. 76.
Figure 77B:
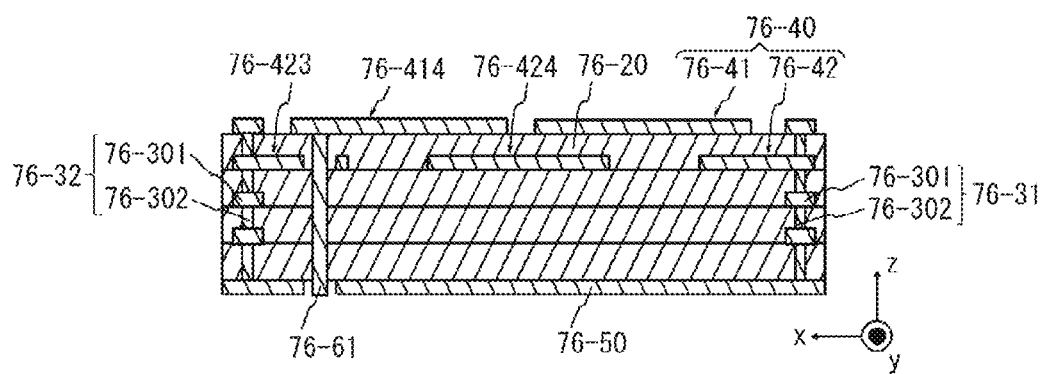
FIG. 77B is a cross-sectional view of the antenna illustrated in FIG. 76.
Figure 78:
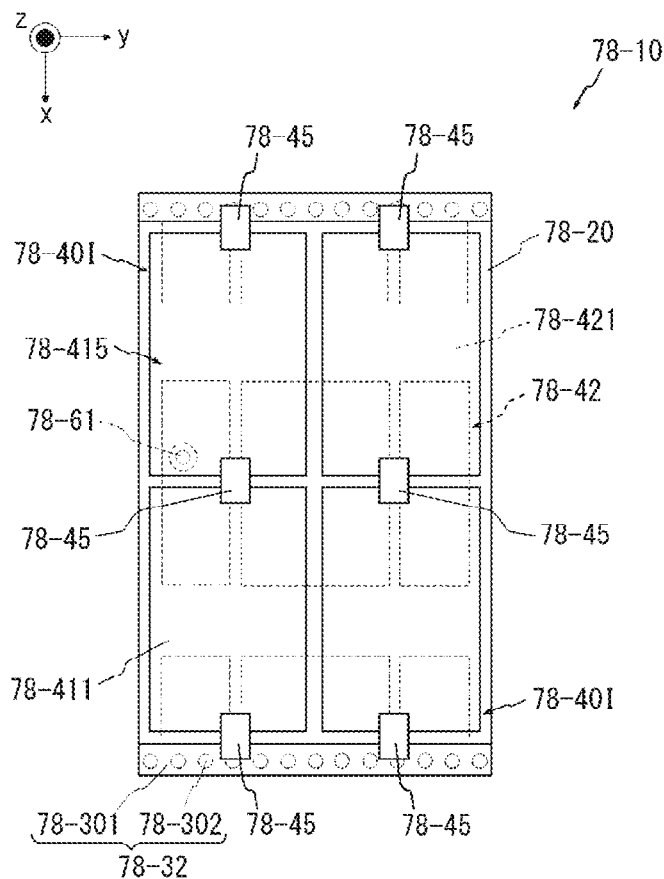
FIG. 78 is a planar view of an antenna according to embodiments.

In FIG. 72 is illustrated another example of the first antenna 60. FIG. 73 is a cross-sectional view taken along LXXIII-LXXIII line illustrated in FIG. 72. In FIG. 74 is illustrated still another example of the first antenna 60. FIG. 75 is a cross-sectional view taken along LXXV-LXXV line illustrated in FIG. 74. In FIG. 76 is illustrated still another example of the first antenna 60. FIG. 77A is a cross-sectional view taken along LXXVIIa-LXXVIIa line illustrated in FIG. 76. FIG. 77B is a cross-sectional view taken along LXXVIIb-LXXVIIb line illustrated in FIG. 76. In FIG. 78 is illustrated still another example of the first antenna 60. A first antenna 78-60 illustrated in FIG. 78 includes impedance elements 78-45.

The first antenna 60 is configured to change the operating frequency using the impedance elements 45. The first antenna 60 includes a first feeding conductor 415 connected to the first feeding line 61, and includes the first unit conductors 411 not connected to the first feeding line 61. When the impedance elements 45 is connected to the first feeding conductor 415 and the other conductors, the impedance matching undergoes a change. In the first antenna 60, the impedance matching can be adjusted by connecting the first feeding conductor 415 and the other conductors using the impedance elements 45. In the first antenna 60, in order to adjust the impedance matching, the impedance elements 45 can be inserted between the first feeding conductor 415 and the other conductors. In the first antenna 60, in order to adjust the operating frequency, the impedance elements 45 can be inserted between the two first unit conductors 411 not connected to the first feeding line 61. In the first antenna 60, in order to adjust the operating frequency, the impedance elements 45 can be inserted between the first unit conductors 411, which are not connected to the first feeding line 61, and one of the pair conductors 30.

The second antenna 70 includes the base 20, the pair conductors 30, the third conductors 40, the fourth conductor 50, a second feeding layer 71, and a second feeding line 72. As an example, the third conductors 40 are positioned in the base 20. As an example, the second antenna 70 includes the third base 24 on the base 20. The third base 24 can have a different composition from the base 20. The third base 24 can be positioned on the third conductors 40. The third base 24 can be positioned on the second feeding layer 71.

The second feeding layer 71 is positioned above the third conductors 40 with a gap therebetween. The base 20 or the third base 24 can be positioned between the second feeding layer 71 and the third conductors 40. The second feeding layer 71 includes resonators of the line type, or the patch type, or the slot type. The second feeding layer 71 can be called an antenna element. As an example, the second feeding layer 71 can be configured to be electromagnetically coupled with the third conductors 40. Due to the electromagnetic coupling with the third conductors 40, the resonance frequency of the second feeding layer 71 changes from the isolated resonance frequency. As an example, the second feeding layer 71 is configured to receive the transmission of electric power from the second feeding line 72 and resonate along with the third conductors 40. As an example, the second feeding layer 71 is configured to receive the transmission of electric power from the second feeding line 72 and resonate along with the third conductors 40 and the third conductor.

The second feeding line 72 is configured to be electrically connected to the second feeding layer 71. According to an embodiment, the second feeding line 72 is configured to transmit electric power to the second feeding layer 71. According to an embodiment, the second feeding line 72 is configured to transmit the electric power coming from the second feeding layer 71 to the outside.

Figure 79:
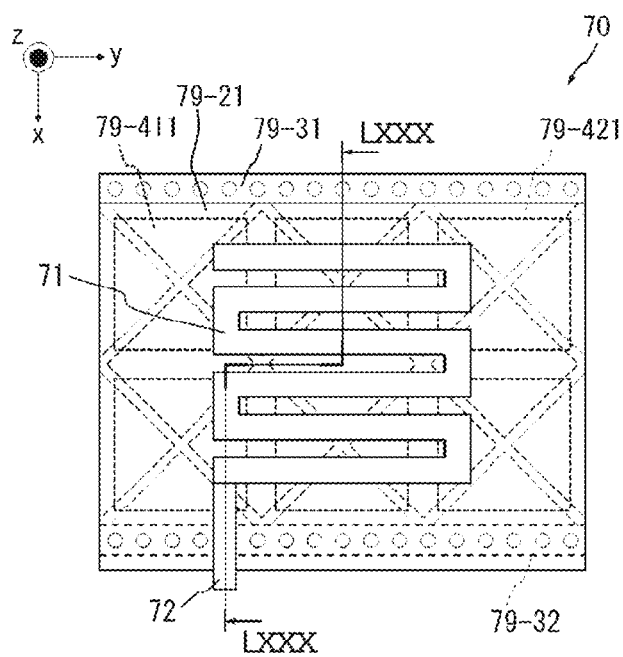
FIG. 79 is a planar view of an antenna according to embodiments.
Figure 80:
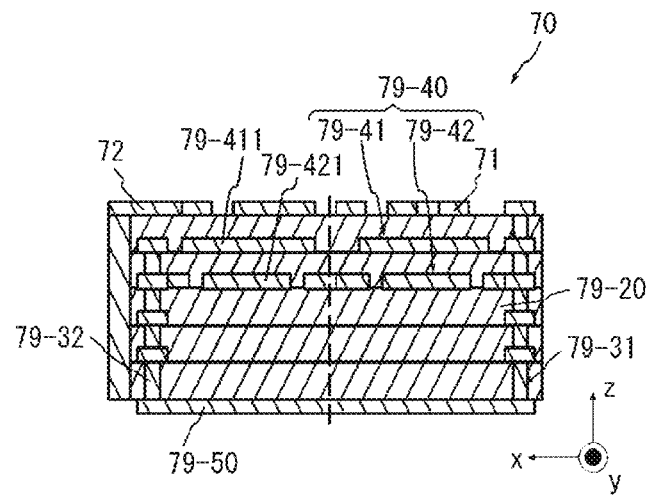
FIG. 80 is a cross-sectional view of the antenna illustrated in FIG. 79.

FIG. 79 is a planar view of the x-y plane when the second antenna 70 is viewed from the z direction. FIG. 80 is a cross-sectional view taken along LXXX-LXXX line illustrated in FIG. 79. In the second antenna 70 illustrated in FIGS. 79 and 80, a third conductor 79-40 is positioned in a base 79-20. The second feeding layer 71 is positioned on the base 79-20. The second feeding layer 71 is positioned to overlap with a unit structure 79-10X in the z direction. The second feeding line 72 is positioned on the base 79-20. The second feeding line 72 is configured to be electromagnetically connected to the second feeding layer 71 in the x-y plane.

Figure 81:
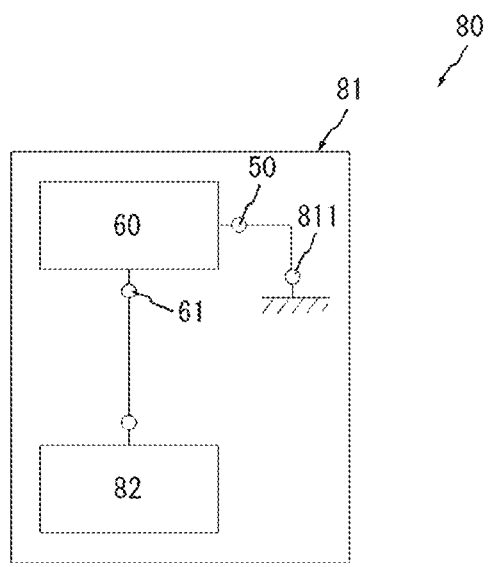
FIG. 81 is a block diagram illustrating a wireless communication module according to embodiments.
Figure 82:
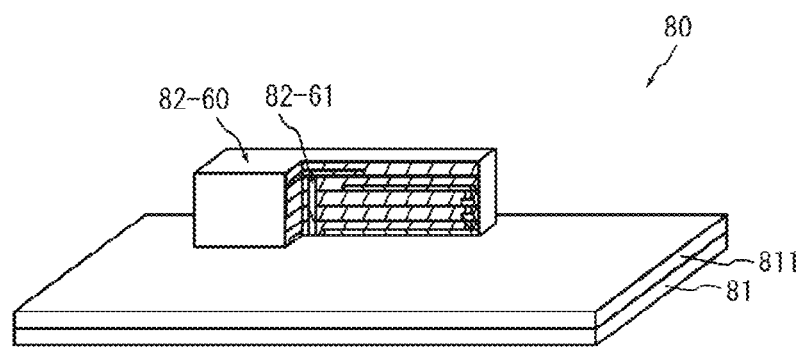
FIG. 82 is a partial cross-sectional perspective view of a wireless communication module according to embodiments.

A wireless communication module according to the present disclosure can be a wireless communication module 80 representing an example according to embodiments. FIG. 81 is a block structure diagram of the wireless communication module 80. FIG. 82 is a schematic block diagram of the wireless communication module 80. The wireless communication module 80 includes the first antenna 60, a circuit board 81, and an RF module 82. The wireless communication module 80 can include the second antenna 70 in place of the first antenna 60.

The first antenna 60 is positioned on the circuit board 81. In the first antenna 60, the first feeding line 61 is configured to be electromagnetically connected to the RF module 82 via the circuit board 81. In the first antenna 60, the fourth conductor 50 is configured to be electromagnetically connected to a ground conductor 811 of the circuit board 81.

The ground conductor 811 can extend in the x-y plane. In the x-y plane, the ground conductor 811 has a larger area than the area of the fourth conductor 50. The ground conductor 811 is longer than the fourth conductor 50 in the y direction. The ground conductor 811 is longer than the fourth conductor 50 in the x direction. In the y direction, the first antenna 60 can be positioned closer to an end of the ground conductor 811 than the center of the ground conductor 811. The center of the first antenna 60 can be different from the center of the ground conductor 811 in the x-y plane. The center of the first antenna 60 can be different from the center of the first conductor 31 and the centers of the second conductor 32. The point at which the first feeding line 61 is connected to the third conductor 40 can be different from the center of the ground conductor 811 in the x-y plane.

In the first antenna 60, the first current and the second current flow in a loop via the pair conductors 30. Since the first antenna 60 is positioned closer to an end of the ground conductor 811 in the y direction than the center of the ground conductor 811, the second electric current flowing through the ground conductor 811 becomes asymmetric. When the second electric current flowing through the ground conductor 811 becomes asymmetric, the antenna structure including the first antenna 60 and the ground conductor 811 has a greater polarization component in the x direction of the radiated waves. Because of an increase in the polarization component in the x direction of the radiated waves, the overall radiation efficiency of the radiated waves is enhanced.

The RF module 82 can be configured to control the electric power supplied to the first antenna 60. The RF module 82 is configured to modulate baseband signals and supply them to the first antenna 60. The RF module 82 can be configured to modulate the electrical signals, which are received in the first antenna 60, into baseband signals.

In the first antenna 60, there is only a small change in the resonance frequency attributed to the conductors on the side of the circuit board 81. As a result of including the first antenna 60, the influence from the external environment can be reduced in the wireless communication module 80.

The first antenna 60 can be configured in an integrated manner with the circuit board 81. When the first antenna 60 and the circuit board 81 are configured in an integrated manner, the fourth conductor 50 and the ground conductor 811 have an integrated configuration.

Figure 83:
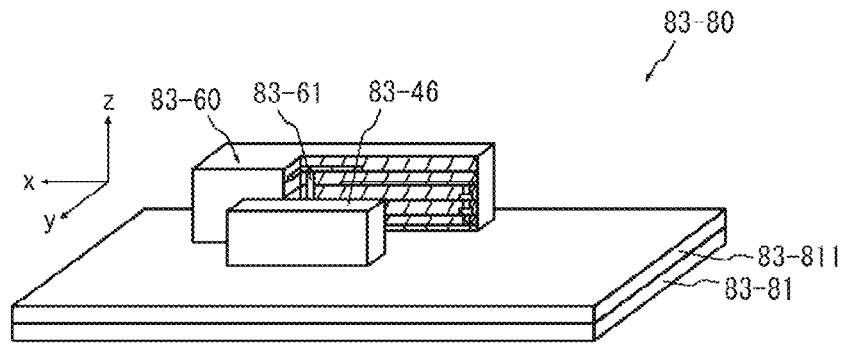
FIG. 83 is a partial cross-sectional view of a wireless communication module according to embodiments.

FIG. 83 is a partial cross-sectional view illustrating another example of the wireless communication module 80. A wireless communication module 83-80 illustrated in FIG. 83 includes a conductive component 83-46. The conductive component 83-46 is positioned on a ground conductor 83-811 of a circuit board 83-81. The conductive component 83-46 is arranged along with a first antenna 83-60 in the y direction. Herein, it is not limited to have only one conductive component 83-46, and a plurality of conductive components 83-46 can be positioned on the ground conductor 83-811.

Figure 84:
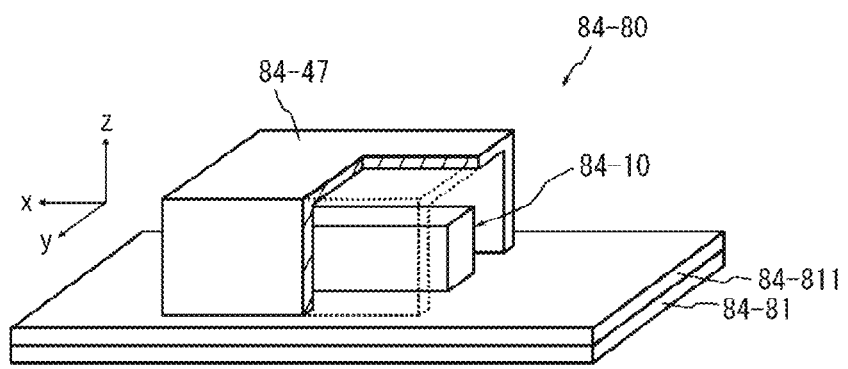
FIG. 84 is a partial cross-sectional view of a wireless communication module according to embodiments.
Figure 85:
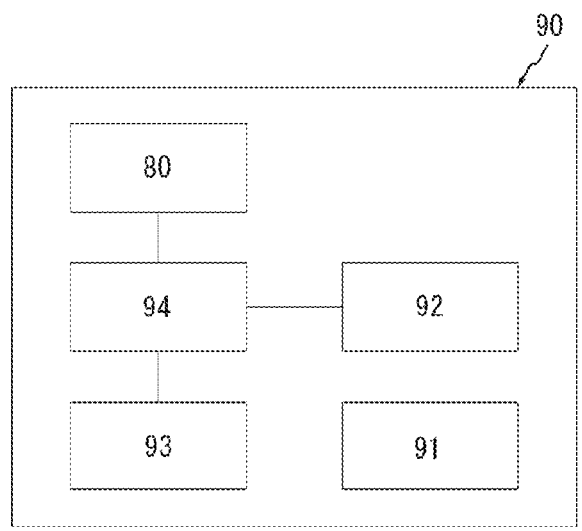
FIG. 85 is a block diagram illustrating a wireless communication device according to embodiments.

FIG. 84 is a partial cross-sectional view of still another example of the wireless communication module 80. A wireless communication module 84-80 illustrated in FIG. 84 includes a dielectric component 84-47. The dielectric component 84-47 is positioned on a ground conductor 84-811 of a circuit board 84-81. A conductive component 84-46 is arranged with a first antenna 84-60 in the y direction.

Figure 86:
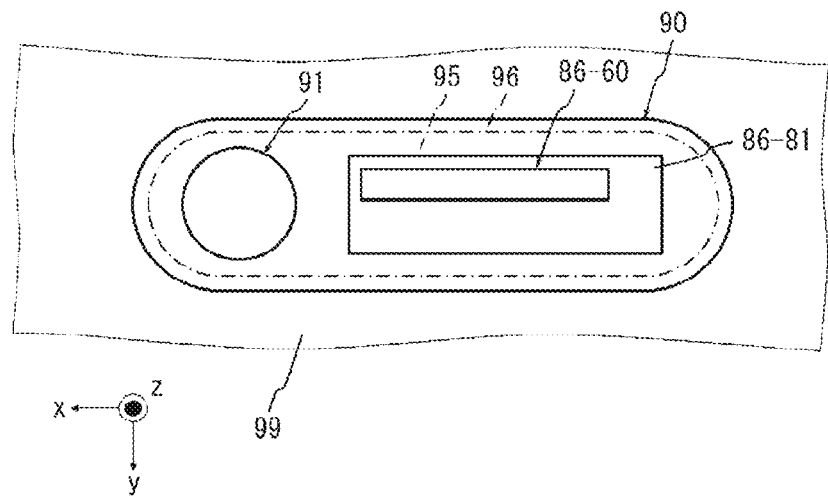
FIG. 86 is a planar view of a wireless communication device according to embodiments.
Figure 87:
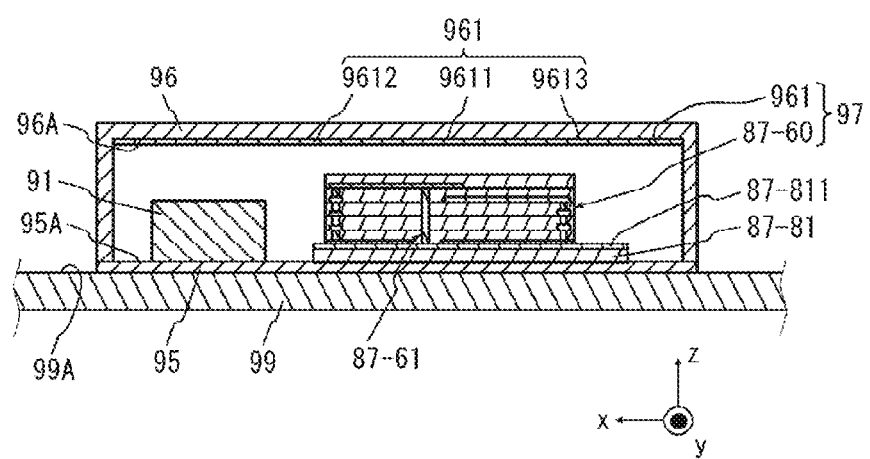
FIG. 87 is a cross-sectional view of a wireless communication device according to embodiments.
Figure 88:
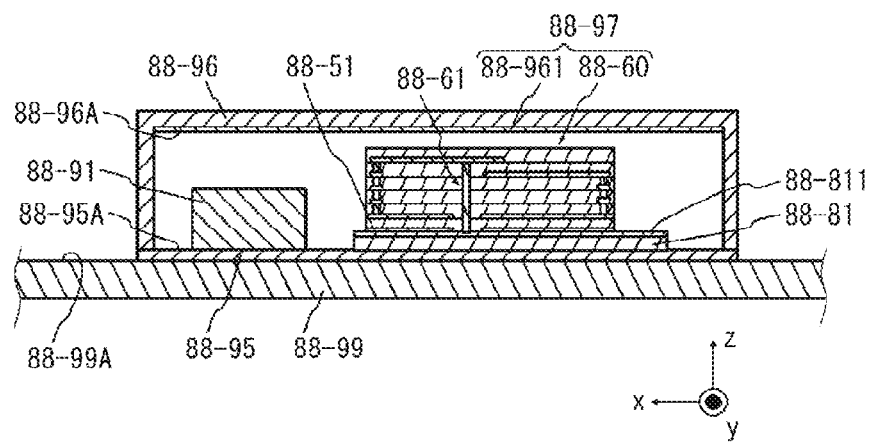
FIG. 88 is a planar view of a wireless communication device according to embodiments.

The wireless communication device according to the present disclosure can include a wireless communication device 90 representing an example according to embodiments. FIG. 86 is a block structure diagram of the wireless communication module 90. Herein, FIG. 86 is a planar view of the wireless communication device 90. In the wireless communication device 90 illustrated in FIG. 86, some of the constituent elements are not illustrated. FIG. 87 is a cross-sectional view of the wireless communication device 90. In the wireless communication device 90 illustrated in FIG. 87, some of the constituent elements are not illustrated. The wireless communication device 90 includes a wireless communication module 80, a battery 91, a sensor 92, a memory 93, a controller 94, a first case 95, and a second case 96. In the wireless communication device 90, although the wireless communication module 80 includes the first antenna 60, it can alternatively include the second antenna 70. In FIG. 88 is illustrated the wireless communication device 90 according to one of other embodiments. In a wireless communication device 88-90, a first antenna 88-60 can include a reference potential layer 88-51.

The battery 91 is configured to supply electric power to the wireless communication module 80. The battery 91 can be configured to supply electric power to at least one of the sensor 92, the memory 93, and the controller 94. The battery 91 can include at least either a primary battery or a secondary battery. The negative electrode of the battery 91 is configured to be electrically connected to the ground terminal of the circuit board 81. The negative electrode of the battery 91 is configured to be electrically connected to the fourth conductor 50 of the first antenna 60.

The sensor 92 can include, for example, a velocity sensor, a vibration sensor, an acceleration sensor, a gyro sensor, a rotation angle sensor, an angular velocity sensor, a geomagnetic sensor, a magnetic sensor, a temperature sensor, a humidity sensor, an atmospheric pressure sensor, a light sensor, an illumination sensor, a UV sensor, a gas sensor, a gas concentration sensor, an atmosphere sensor, a level sensor, an odor sensor, a pressure sensor, a pneumatic sensor, a contact sensor, a wind sensor, an infrared sensor, a motion sensor, a displacement sensor, an image sensor, a gravimetric sensor, a smoke sensor, a liquid leakage sensor, a vital sensor, a battery charge sensor, an ultrasound sensor, or a GPS (Global Positioning System) signal receiving device.

The memory 93 can include, for example, a semiconductor memory. The memory 93 can be configured to function as the work memory of the controller 94. The memory 93 can be included in the controller 94. The memory 93 stores, for example, programs in which the details of the operations for implementing the functions of the wireless communication device 90 are written, and information used in the operations performed in the wireless communication device 90.

The controller 94 can include, for example, a processor. The controller 94 can include one or more processors. The processors can include general-purpose processors for implementing particular functions by reading particular programs, and dedicated processors specialized in particular operations. A dedicated processor can include an IC intended for a specific use. An IC intended for a specific use is also called an ASIC (Application Specific Integrated Circuit). A processor can include a programmable logic device, which is abbreviated as PLD. A PLD can be an FPGA (Field-Programmable Gate Array). The controller 94 can be an SoC (System-on-a-Chip) in which one or more processors operate in cooperation, or can be an SiP (System In a Package). The controller 94 can store, in the memory 93, a variety of information and programs for operating the constituent elements of the wireless communication device 90.

The controller 94 is configured to generate transmission signals to be transmitted from the wireless communication device 90. For example, the controller 94 can be configured to obtain measurement data from the sensor 92. The controller 94 can be configured to generate transmission signals according to the measurement data. The controller 94 can be configured to transmit baseband signals to the RF module 82 of the wireless communication module 80.

The first case 95 and the second case 96 are configured to protect the other devices in the wireless communication device 90. The first case 95 can extend in the x-y plane. The first case 95 is configured to support the other devices. The first case 95 can be configured to support the wireless communication module 80. The wireless communication module 80 is positioned on an upper surface 95A of the first case 95. The first case 95 is also capable of supporting the battery 91. The battery 91 is positioned on the upper surface 95A of the first case 95. As an example of embodiments, on the upper surface 95A of the first case 95, the wireless communication module 80 and the battery 91 are arranged along the x direction. The first conductor 31 is positioned between the battery 91 and the third conductor 40. The battery 91 is positioned behind the pair conductors 30 when seen from the third conductor 40.

The second case 96 is capable of covering the other devices. The second case 96 has an under surface 96A positioned toward the z direction with respect to the first antenna 60. The under surface 96A extends along the x-y plane. The under surface 96A is not limited to be flat, and can have unevenness. The second case 96 can include an eighth conductor 961. The eighth conductor 961 is positioned in the second case 96 on at least either the outer side or the inner side. The eighth conductor 961 is positioned at least either on the upper surface of the second case 96 or on a lateral surface of the second case 96.

The eighth conductor 961 faces the first antenna 60. A first body 9611 of the eighth conductor 961 faces the first antenna 60 in the z direction. In addition to the first body 9611, the eighth conductor 961 can include at least either a second body that faces the first antenna 60 in the x direction, or a third body that faces the first antenna 60 in the y direction. A part of the eighth conductor 961 faces the battery 91.

The eighth conductor 961 can include a first extra-body 9612 that extends toward the outer side in the x direction with respect to the first conductor 31. The eighth conductor 961 can include a second extra-body 9613 that extends toward the outer side in the x direction with respect to the second conductor 32. The first extra-body 9612 can be configured to be electrically connected to the first body 9611. The second extra-body 9613 can be configured to be electrically connected to the first body 9611. The first extra-body 9612 of the eighth conductor 961 faces the battery 91 in the z direction. The eighth conductor 961 can be configured to be capacitively coupled with the battery 91. The eighth conductor 961 can have capacitance between the eighth conductor 961 and the battery 91.

The eighth conductor 961 is positioned away from the third conductor 40. The eighth conductor 961 is not electrically connected to the conductors of the first antenna 60. The eighth conductor 961 can be positioned away from the first antenna 60. The eighth conductor 961 can be configured to be electromagnetically coupled with any conductor of the first antenna 60. The first body 9611 of the eighth conductor 961 can be configured to be capacitively coupled with the first antenna 60. In the planar view from the z direction, the first body 9611 can overlap with the third conductor 40. Because of the overlapping of the first body 9611 and the third conductor 40, propagation due to electromagnetic coupling can be increased. The electromagnetic coupling between the eighth conductor 961 and the third conductor 40 can serve as mutual inductance.

The eighth conductor 961 extends along the x direction. The eighth conductor 961 extends along the x-y plane. The length of the eighth conductor 961 is greater than the length of the first antenna 60 along the x direction. The length of the eighth conductor 961 along the x direction is greater than the length of the first antenna 60 along the x direction. The length of the eighth conductor 961 can be greater than half of the operating wavelength $\lambda$ of the wireless communication device 90. The eighth conductor 961 can include a portion extending along the y direction. The eighth conductor 961 can have a bend in the x-y plane. The eighth conductor 961 can include a portion extending in the z direction. The eighth conductor 961 can have a bend from the x-y plane into the y-z plane or the z-x plane.

Figure 89:
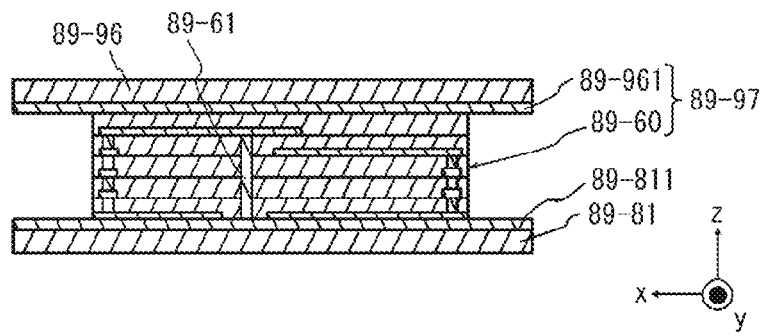
FIG. 89 is a cross-sectional view of a third antenna according to embodiments.

In the wireless communication device 90 that includes the eighth conductor 961, the first antenna 60 and the eighth conductor 961 can be electromagnetically coupled and can function as a third antenna 97. An operating frequency fc of the third antenna 97 can be different from the isolated resonance frequency of the first antenna 60. The operating frequency fc of the third antenna 97 can be closer to the resonance frequency of the first antenna 60 than the isolated resonance frequency of the eighth conductor 961. The operating frequency fc of the third antenna 97 can be within the resonance frequency band of the first antenna 60. The operating frequency fc of the third antenna 97 can be outside the isolated resonance frequency band of the eighth conductor 961. In FIG. 89 is illustrated the third antenna 97 according to another embodiment. An eighth conductor 89-961 can be configured in an integrated manner with a first antenna 89-60. In FIG. 89, some configuration of the wireless communication device 90 is not illustrated. In the example illustrated in FIG. 89, a second case 89-96 need not include the eighth conductor 961.

In the wireless communication device 90, the eighth conductor 961 is configured to be capacitively coupled with the third conductor 40. The eighth conductor 961 is configured to be electromagnetically coupled with the fourth conductor 50. In the air, the third antenna 97 includes the first extra-body 9612 and the second extra-body 9613, so that there is enhancement in the gain as compared to the first antenna 60.

Figure 90:
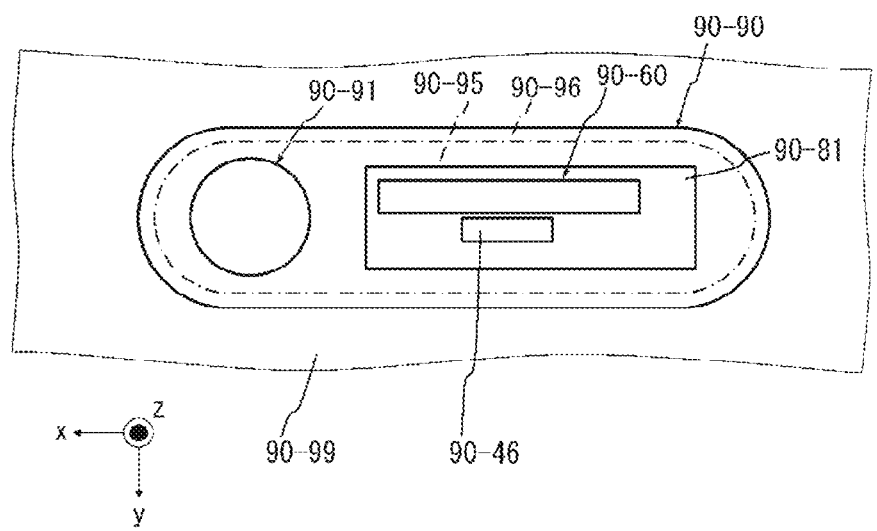
FIG. 90 is a planar view of a wireless communication device according to embodiments.

FIG. 90 is a planar view illustrating another example of the wireless communication device 90. A wireless communication device 90-90 includes a conductive component 90-46. The conductive component 90-46 is positioned on a ground conductor 90-811 of a circuit board 90-81. The conductive component 90-46 is arranged along with a first antenna 90-60 in the y direction. It is not limited to have only single conductive component 90-46, and a plurality of conductive components 90-46 can be positioned on the ground conductor 90-811.

Figure 91:
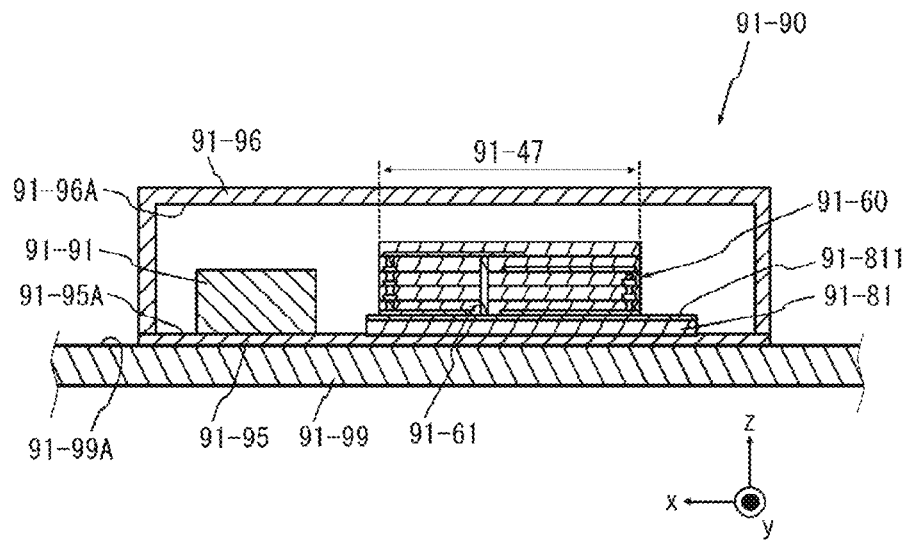
FIG. 91 is a cross-sectional view of a wireless communication device according to embodiments.

FIG. 91 is a cross-sectional view illustrating still another example of the wireless communication device 90. A wireless communication device 91-90 illustrated in FIG. 91 includes a dielectric component 91-47. The dielectric component 91-47 is positioned on a ground conductor 91-811 of a circuit board 91-81. The dielectric component 91-47 is arranged along with a first antenna 91-60 in the y direction. As illustrated in FIG. 91, some part of a second case 91-96 can be configured to function as the dielectric component 91-47. In the wireless communication device 91-90, the second case 91-96 can be treated as the dielectric component 91-47.

Figure 92:
FIG. 92 is a cross-sectional view of a wireless communication device according to embodiments.

The wireless communication device 90 can be positioned on various objects. The wireless communication device 90 can be positioned on an electrical conductive body 99. FIG. 92 is a planar view illustrating a wireless communication device 92-90 according to an embodiment. A conductor 92-99 is a conductor that transmits electricity. The material of the conductor 92-99 can be a metal, a high-dope semiconductor, an electricity-conducting plastic, or a liquid including ions. The conductor 92-99 can have a non-conductive layer that does not transmits electricity on the surface. The portion that transmits electricity and the non-conductive layer can include a common element. For example, the conductor 92-99 including aluminum can include a non-conductive layer having aluminum oxide on the surface. The portion that transmits electricity and the non-conductive layer can include different elements.

The electrical conductive body 99 is not limited to have the shape of a flat plate, and can have a stereoscopic shape such as a box shape. The stereoscopic shape of the electrical conductive body 99 can include a cuboid and a circular cylinder. The stereoscopic shape can have some recessed part, or some penetrated part, or some protruded part. For example, the electrical conductive body 99 can have a torus shape. The electrical conductive body 99 can have a hollow space inside. The electrical conductive body 99 can be a box having a space inside. The electrical conductive body 99 can be a cylindrical object having a space inside. The electrical conductive body 99 can be a tube having a space inside. The electrical conductive body 99 can be a pipe, a tube, or a hose.

The electrical conductive body 99 has an upper surface 99A on which the wireless communication device 90 can be mounted. The upper surface 99A can extend across the entire face of the electrical conductive body 99. The upper surface 99A can be treated as a part of the electrical conductive body 99. The upper surface 99A can have a larger area than the area of the wireless communication device. The wireless communication device 90 can be placed on the upper surface 99A of the electrical conductive body 99. The upper surface 99A can have a smaller area than the area of the wireless communication device 90. Some part of the wireless communication device 90 can be placed on the upper surface 99A of the electrical conductive body 99. The wireless communication device 90 can be placed on the upper surface 99A of the electrical conductive body 99 in various orientations. The orientation of the wireless communication device 90 can be arbitrary. The wireless communication device 90 can be appropriately fixed to the upper surface 99A of the electrical conductive body 99 using a holding fixture. The holding fixture can be a surface fixture such as a double-faced adhesive tape or an adhesive agent. The holding fixture can be a point fixture such as a screw or a nail.

The upper surface 99A of the electrical conductive body 99 can include a portion extending along a j direction. The portion extending along the j direction has a greater length along the j direction than the length in a k direction. The j and k directions are orthogonal to each other. The j direction is the direction in which the electrical conductive body 99 extends over a long distance. The k direction is the direction in which the electrical conductive body 99 has a smaller length than that in the j direction.

The wireless communication device 90 is placed on the upper surface 99A of the electrical conductive body 99. The first antenna 60 is configured to be electromagnetically coupled with the electrical conductive body 99 so as to induce an electric current in the electrical conductive body 99. The electrical conductive body 99 is configured to radiate electromagnetic waves due to the induced current. Since the wireless communication device 90 is placed thereon, the electrical conductive body 99 is configured to function as a part of an antenna. In the wireless communication device 90, the direction of propagation changes depending on the electrical conductive body 99.

The wireless communication device 90 can be placed on the upper surface 99A in such a way that the x direction is in line with the j direction. The wireless communication device 90 can be placed on the upper surface 99A to be in line with the x direction in which the first conductor 31 and the second conductor 32 are arranged. At the time of positioning the wireless communication device 90 on the electrical conductive body 99, the first antenna 60 may be configured to be electromagnetically coupled with the electrical conductive body 99. The fourth conductor 50 of the first antenna 60 is configured in such a way that the second electric current is generated therein along the x direction. The electrical conductive body 99 that is electromagnetically coupled with the first antenna 60 is configured in such a way that an electric current is induced therein due to the second electric current. When the x direction of the first antenna 60 is in line with the j direction of the electrical conductive body 99, the electric current flowing along the j direction becomes large in the electrical conductive body 99. When the x direction of the first antenna 60 is in line with the j direction of the electrical conductive body 99, radiation attributed to the induced electric current become large in the electrical conductive body 99. The angle of the x direction with respect to the j direction can be set to be 45 degrees or less.

The ground conductor 811 of the wireless communication device 90 is positioned away from the electrical conductive body 99. The wireless communication device 90 can be placed on the upper surface 99A in such way that the direction along the long side of the upper surface 99A is in line with the x direction in which the first conductor 31 and the second conductor 32 are arranged. The upper surface 99A can have a rhombic shape or a circular shape, other than a rectangular shape. The electrical conductive body 99 can have a rhombic surface, which can be treated as the upper surface 99A on which the wireless communication device 90 is placed. The wireless communication device 90 is placed on the upper surface 99A in such a way that the direction along the long diagonal side is in line with the x direction in which the first conductor 31 and the second conductor 32 are arranged. The upper surface 99A is not limited to be a flat surface. The upper surface 99A can have unevenness. The upper surface 99A can be a curved surface. A curved surface can be a ruled surface. The curved surface can be a cylindrical surface.

The electrical conductive body 99 extends in the x-y plane. The electrical conductive body 99 can have a greater length along the x direction than the direction along the y direction. The length of the electrical conductive body 99 along the y direction can be shorter than half of the wavelength λc at the operating frequency fc of the third antenna 97. The wireless communication device 90 can be positioned on the electrical conductive body 99. The electrical conductive body 99 is positioned away from the fourth conductor 50 in the z direction. The electrical conductive body 99 has a greater length in the x direction as compared to the fourth conductor 50. The electrical conductive body 99 has a larger area in the x-y plane as compared to the fourth conductor 50. The electrical conductive body 99 is positioned away from the ground conductor 811 in the z direction. The electrical conductive body 99 has a greater length in the x direction as compared to the ground conductor 811. The electrical conductive body 99 has a larger area in the x-y plane as compared to the ground conductor 811.

The wireless communication device 90 can be placed on the electrical conductive body 99 with such an orientation that the x direction, in which the first conductor 31 and the second conductor 32 are arranged, is in line with the direction in which the electrical conductive body 99 extends long. In other words, the wireless communication device 90 can be placed on the electrical conductive body 99 with such an orientation that the direction of flow of electric current in the first antenna 60 in the x-y plane is in line with the direction in which the electrical conductive body 99 extends long.

The first antenna 60 has a small change in the resonance frequency due to the conductors of the circuit board 81. As a result of including the wireless communication device 90, the influence from the external environment can be reduced in the wireless communication module 80.

In the wireless communication device 90, the ground conductor 811 is configured to be capacitively coupled with the electrical conductive body 99. The wireless communication device 90 includes such a portion of the electrical conductive body 99 which extends more toward the outside than the third antenna 97, so that there is enhancement in the gain as compared to the first antenna 60.

If n is an integer, the wireless communication device 90 can be attached at the position of $(2n-1) \times \lambda/4$ (an odd multiple of one-fourth of the operating wavelength λ) from the leading end of the electrical conductive body 99. As a result of such positioning, a standing wave of the electric current is induced in the electrical conductive body 99. Due to the induced standing wave, the electrical conductive body 99 becomes the source of radiation of electromagnetic waves. As a result of such installation, the communication performance of the wireless communication device 90 is enhanced.

Figure 93:
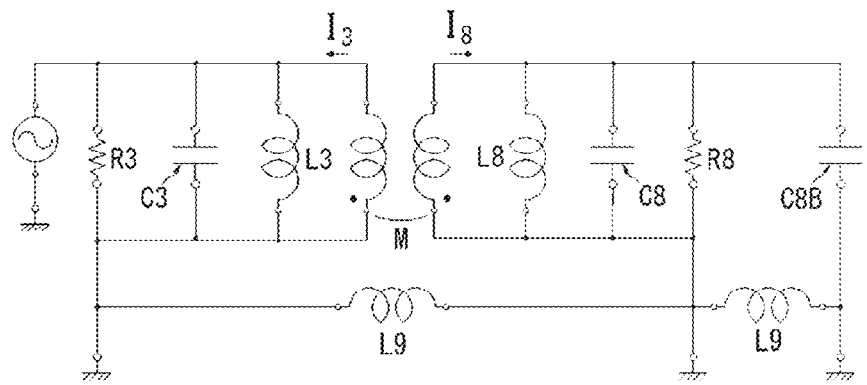
FIG. 93 is a diagram illustrating a schematic circuit of a wireless communication device.
Figure 94:
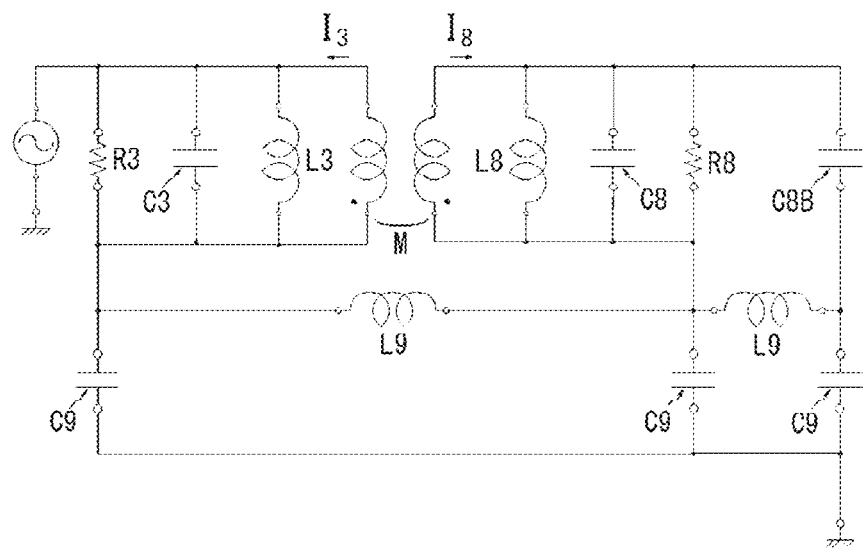
FIG. 94 is a diagram illustrating a schematic circuit of a wireless communication device.

In the wireless communication device 90, the resonance circuit in the air can be different from the resonance circuit on the conductor 99. FIG. 93 is a schematic circuit of a resonance structure in the air. FIG. 94 is a schematic circuit of a resonance structure on the conductor 99. Herein, L3 represents the inductance of the resonator 10; L8 represents the inductance of the eighth conductor 961; L9 represents the inductance of the conductor 99; and M represents the mutual inductance of the inductances L3 and L8. C3 represents the capacitance of the third conductor 40; C4 represents the capacitance of the fourth conductor 50; C8 represents the capacitance of the eighth conductor 961; C8B represents the capacitance of the eighth conductor 961 and the battery 91; and C9 represents the capacitance of the conductor 99 and the ground conductor 811. R3 represents the radiation resistance of the resonator 10, and R8 represents the radiation resistance of the eighth conductor 961. The operating frequency of the resonator 10 is lower than the resonance frequency of the eighth conductor. The wireless communication device 90 is configured in such a way that, in the air, the ground conductor 811 functions as a chassis ground. The wireless communication device 90 is configured in such a way that the fourth conductor 50 is capacitively coupled with conductor 99. On the conductor 99, the wireless communication device 90 is configured in such a way that the conductor 99 functions as the substantive chassis ground.

According to embodiments, the wireless communication device 90 includes the eighth conductor 961. The eighth conductor 961 is configured to be electromagnetically coupled with the first antenna 60 and to be capacitively coupled with the fourth conductor 50. By increasing the capacitance C8B attributed to capacitive coupling, the operating frequency can be increased when the wireless communication device 90 is placed on the conductor 99 from the air. By increasing the mutual inductance M attributed to electromagnetic coupling, the operating frequency can be reduced when the wireless communication device 90 is placed on the conductor 99 from the air. By varying the balance between the capacitance C8B and the mutual inductance M, it becomes possible to adjust the change in the operating frequency when the wireless communication device 90 is placed on the conductor 99 from the air. By varying the balance between the capacitance C8B and the mutual inductance M, it becomes possible to reduce the change in the operating frequency when the wireless communication device 90 is placed on the conductor 99 from the air.

The wireless communication device 90 includes the eighth conductor 961 that is configured to be electromagnetically coupled with the third conductor 40 and be capacitively coupled with the fourth conductor 50. As a result of including the eighth conductor 961, it becomes possible to adjust the changes in the operating frequency when the wireless communication device 90 is placed on the conductor 99 from the air. As a result of including the eighth conductor 961, it becomes possible to reduce the change in the operating frequency when the wireless communication device 90 is placed on the conductor 99 from the air.

Likewise, the wireless communication device 90 that does not include the eighth conductor 961 is also configured in such a way that, in the air, the ground conductor 811 functions as a chassis ground. Likewise, on the conductor 99, the wireless communication device 90 that does not include the eighth conductor 961 is configured in such a way that the conductor 99 functions as the substantive chassis ground. The resonance structure including the resonator 10 is capable of oscillation even if the chassis ground changes. This configuration corresponds to the fact that the resonator 10 including the reference potential layer 51 and the resonator 10 not including the reference potential layer 51 can perform oscillation.

Figure 95:
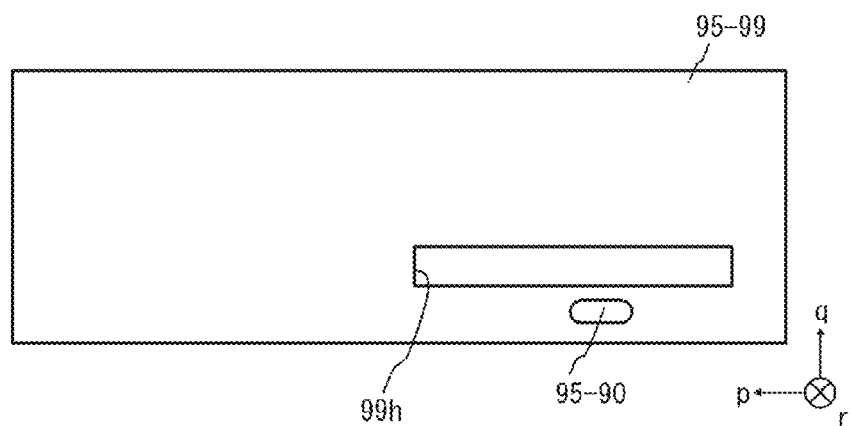
FIG. 95 is a planar view of a wireless communication device according to embodiments.

FIG. 95 is a planar view illustrating the wireless communication device 90 according to an embodiment. A conductor 95-99 can include a through hole 99$h$. The through hole 99$h$ can include a portion extending in a p direction. The through hole 99$h$ has a greater length in the p direction than the length in a q direction. The p and q directions are orthogonal to each other. The p direction represents the direction in which the conductor 95-99 extends long. The q direction represents the direction in which the electrical conductive body 99 has a smaller length than in the p direction. An r direction represents the direction orthogonal to the p and q directions.

The wireless communication device 90 can be placed close to the through hole 99$h$ of the electrical conductive body 99 in such a way that the x direction is in line with the p direction. The wireless communication device 90 can be placed close to the through hole 99$h$ of the electrical conductive body 99 to be in line with the x direction in which the first conductor 31 and the second conductor 32 are arranged. At the time of positioning the wireless communication device 90 on the electrical conductive body 99, the first antenna 60 can be configured to be electromagnetically coupled with the electrical conductive body 99. The fourth conductor 50 of the first antenna 60 is configured in such a way that the second current is generated along the x direction. The electrical conductive body 99 that is configured to be electromagnetically coupled with the first antenna 60 is configured in such a way that an electric current along the p direction is induced therein due to the second current. The induced current can flow along the through hole 99$h$ to the surrounding. The electrical conductive body 99 is configured in such a way that electromagnetic waves are radiated with the through hole 99$h$ serving as a slot. With the through hole 99$h$ serving as a slot, the electromagnetic waves are radiated toward a second surface forming a pair with a first surface on which the wireless communication device 90 is placed.

When the x direction of the first antenna 60 and the p direction of the electrical conductive body 99 are in line, there is an increase in the electric current flowing in the electrical conductive body 99 along the p direction. When the x direction of the first antenna 60 and the p direction of the electrical conductive body 99 are in line, there is an increase in the radiation from the through hole 99$h$ of the electrical conductive body 99 attributed to the induced current. The angle of the x direction with respect to the p direction can be set to be 45 degrees or less. When the length of the through hole 99$h$ along the p direction is equal to the operating wavelength at the operating frequency, there is an increase in the radiation of the electromagnetic waves. When $\lambda$ represents the operating wavelength and n represents an integer, if the through hole 99$h$ has the length of $(n \times \lambda)/2$ along the p direction, the through hole functions as a slot antenna. Regarding the radiated electromagnetic waves, the radiation increases due to the standing wave induced in the through hole. The wireless communication device 90 can be positioned at the position of $(m \times \lambda)/2$ from the end of the through hole in the p direction. Herein, m is an integer equal to or greater than zero and equal to or smaller than n. The wireless communication device 90 can be positioned at a position closer than $\lambda/4$ from the through hole.

Figure 96:
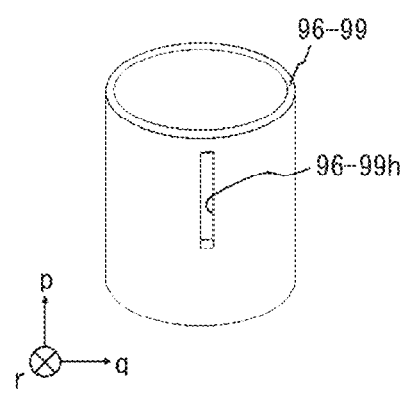
FIG. 96 is a perspective view of a wireless communication device according to embodiments.
Figure 97A:
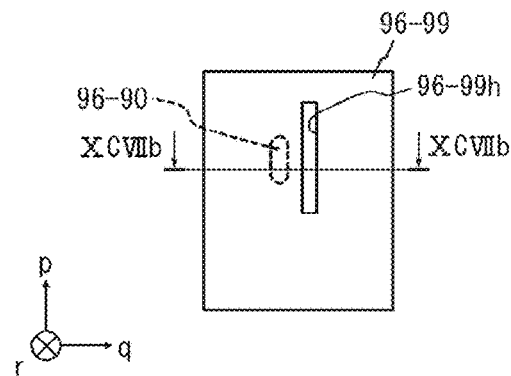
FIG. 97A is a lateral view of the wireless communication device illustrated in FIG. 96.
Figure 97B:
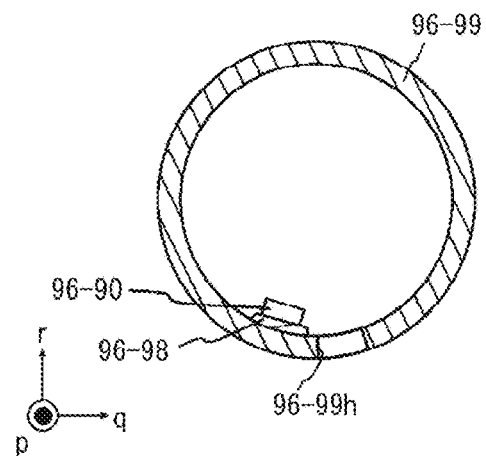
FIG. 97B is a cross-sectional view of the wireless communication device illustrated in FIG. 97A.

FIG. 96 is a perspective view illustrating a wireless communication device 96-90 according to an embodiment. FIG. 97A is a lateral view of the perspective view illustrated in FIG. 96. FIG. 97B is a cross-sectional view taken along XCVIIb-XCVIIb line illustrated in FIG. 97A. The wireless communication device 96-90 is positioned on the inner surface of a cylindrical conductor 96-99. The conductor 96-99 includes a through hole 96-99$h$ extending in the r direction. In the wireless communication device 96-90, the r direction and the x direction are in line in the vicinity of the through hole 96-99$h$.

Figure 98:
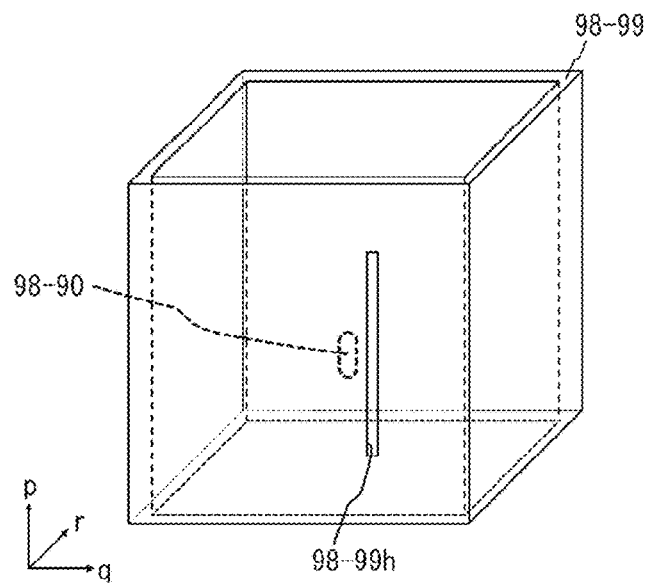
FIG. 98 is a perspective view of a wireless communication device according to embodiments.
Figure 99:
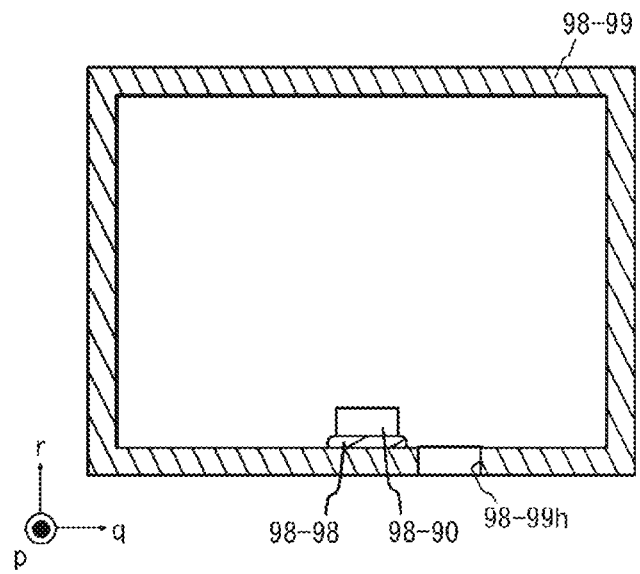

FIG. 98 is a perspective view illustrating a wireless communication device 98-90 according to an embodiment. FIG. 99 is a cross-sectional view of the vicinity of the wireless communication device 98-90 illustrated in the perspective view in FIG. 98. The wireless communication device 98-90 is positioned on the inner surface of a conductor 98-99 having a rectangular cylindrical shape. The conductor 98-99 has a through hole 98-99$h$ extending in the r direction. In the wireless communication device 98-90, the r direction and the x direction are in line in the vicinity of the through hole 98-99$h$.

Figure 100:
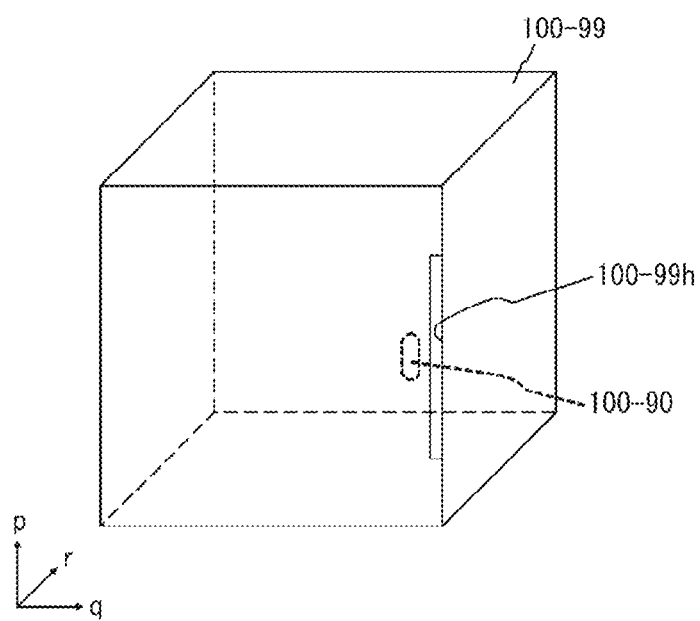

FIG. 100 is a perspective view of a wireless communication device 100-90 according to an embodiment. The wireless communication device 100-90 is positioned on the inner surface of a cuboid conductor 100-99. The conductor 100-99 has a through hole 100-99$h$ extending in the r direction. In the wireless communication device 100-90, the r direction and the x direction are in line in the vicinity of the through hole 100-99$h$.

Figure 101:
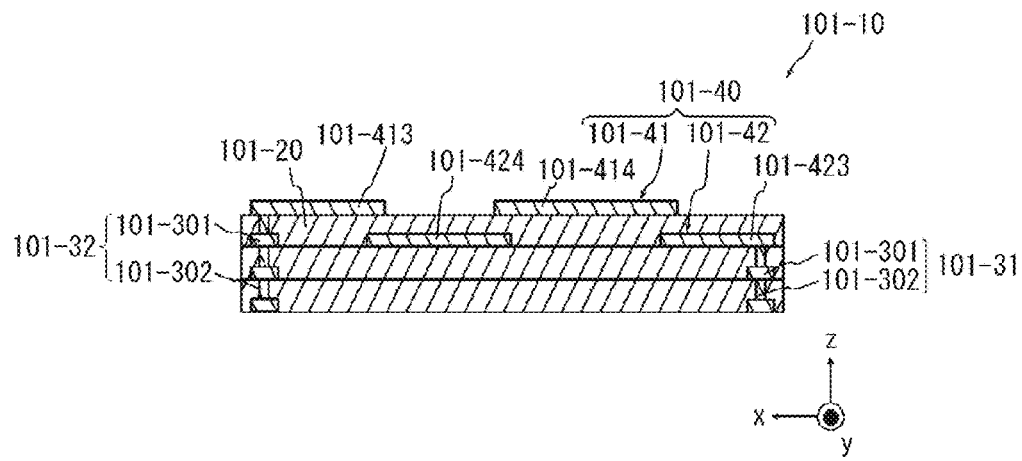
Figure 102:
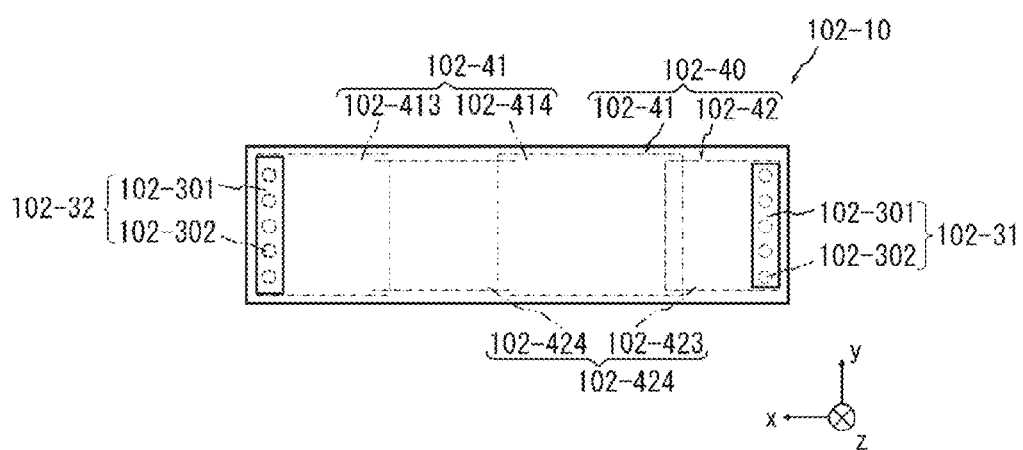
Figure 103:
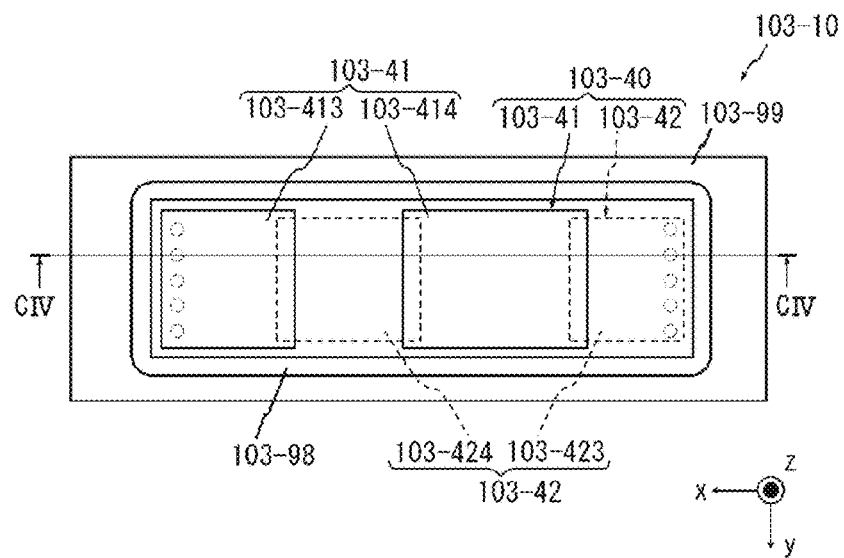
Figure 104:
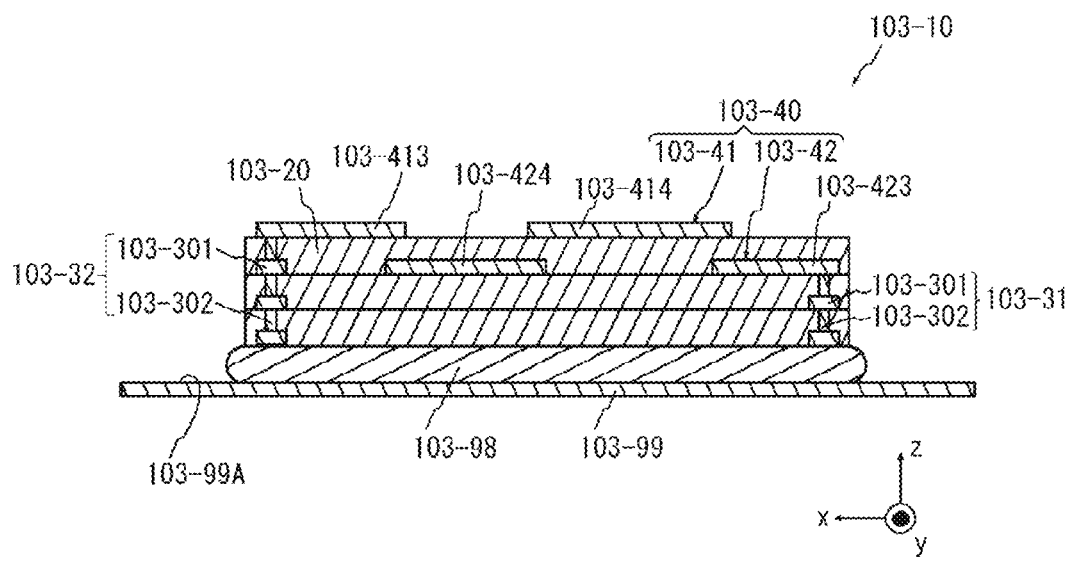

In the resonator 10 placed on the electrical conductive body 99 for use, at least a part of the fourth conductor 50 can be omitted. The resonator 10 includes the base 20 and the pair conductors 30. In FIG. 101 is illustrated an example of a resonator 101-10 that does not include the fourth conductor 50. FIG. 102 is a planar view when the resonator 10 is viewed in such a way that the far side of the drawing represents the +z direction. In FIG. 103 is illustrated an example in which a resonance structure is formed by placing a resonator 103-10 on a conductor 103-99. FIG. 104 is a cross-sectional view taken along CIV-CIV line illustrated in FIG. 103. The resonator 103-10 is attached on the conductor 103-99 via an attachment member 103-98. The resonator 10 not including the fourth conductor 50 is not limited to the examples illustrated in FIGS. 101 to 104. The resonator 10 not including the fourth conductor 50 is not limited to the resonator 18-10 from which a fourth conductor 18-50 is omitted. The resonator 10 not including the fourth conductor 50 can be obtained by omitting the fourth conductor 50 from the resonator 10 illustrated in FIGS. 1 to 64.

Figure 105:
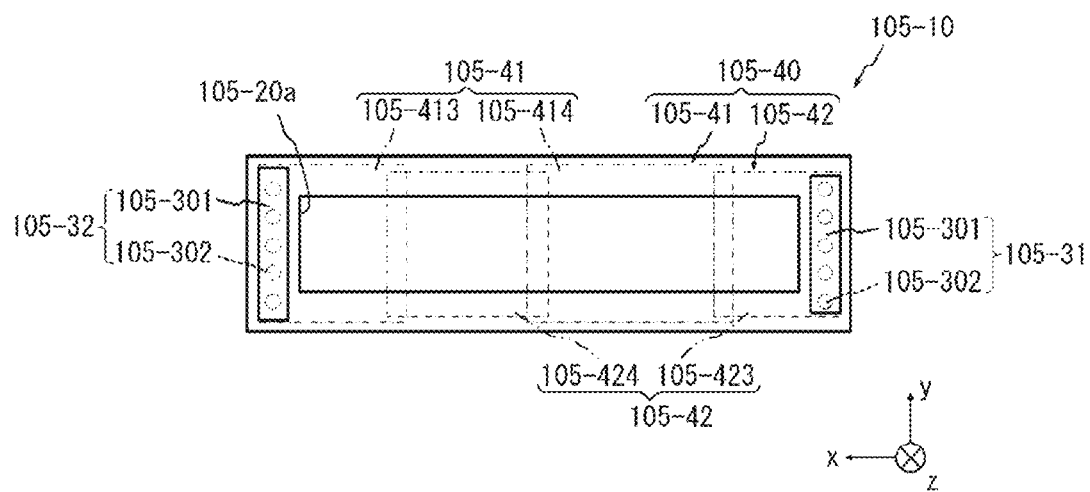
Figure 106:
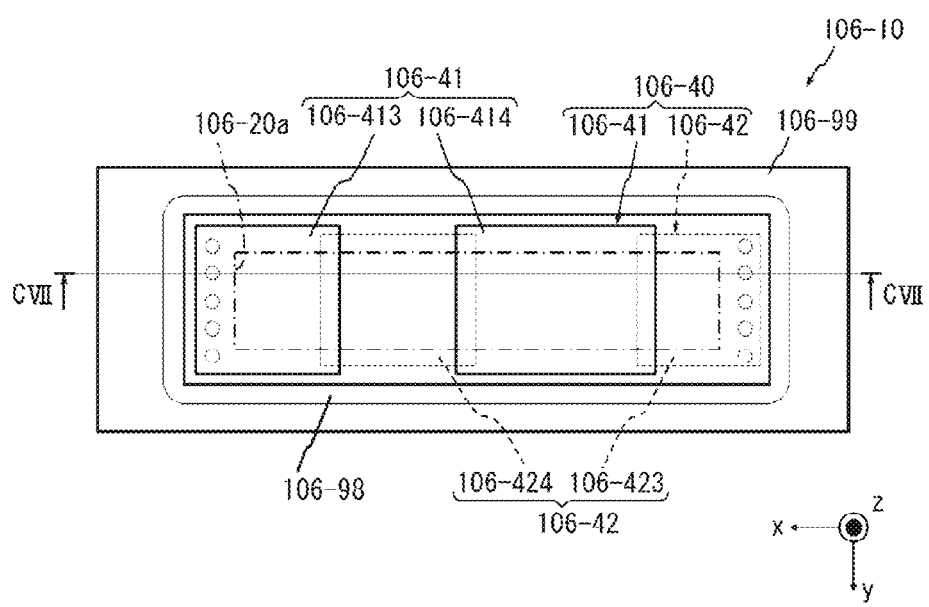
Figure 107:
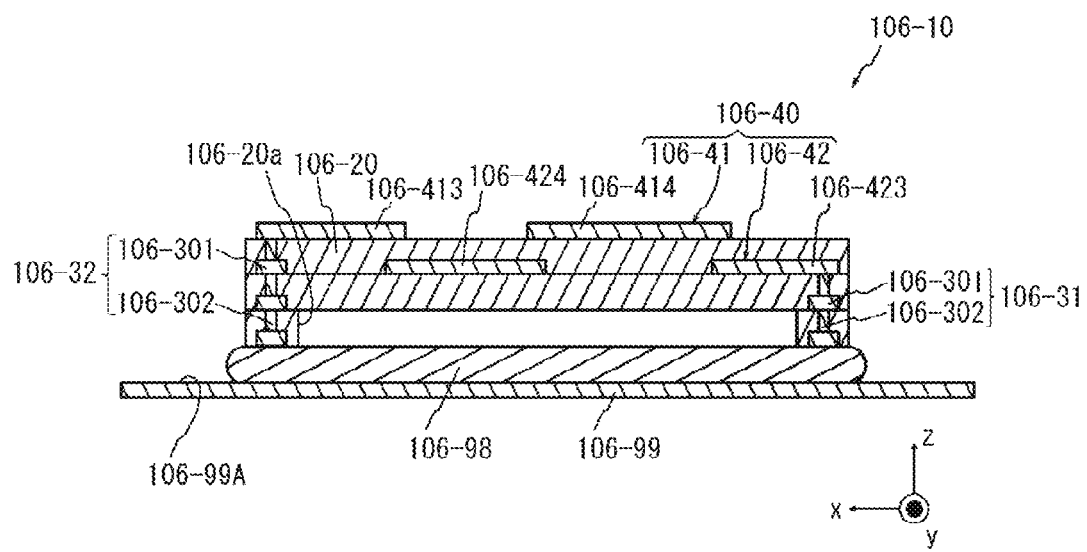

The base 20 can have the cavity 20a inside. In FIG. 105 is illustrated an example of a resonator 105-10 in which a base 105-20 has a cavity 105-20a. FIG. 105 is a planar view when the resonator 105-10 is viewed in such a way that the far side of the drawing represents the +z direction. In FIG. 106 is illustrated an example of a resonance structure formed by placing a resonator 106-10, which has a cavity 106-20a, on a conductor 106-99. FIG. 107 is a cross-sectional view taken along CVII-CVII line illustrated in FIG. 106. In the z direction, the cavity 106-20a is positioned between a third conductor 106-40 and the conductor 106-99. The permittivity in the cavity 106-20a is lower than the permittivity of a base 106-20. Since the base 106-20 includes the cavity 20a, the electromagnetic distance between the third conductor 106-40 and the conductor 106-99 can be shortened. The resonator 10 including the cavity 20a is not limited to the resonators illustrated in FIGS. 105 to 107. The resonator 10 including the cavity 20a can be the structure in which the fourth conductor is omitted from the resonator illustrated in FIG. 19B and in which the base 20 includes the cavity 20a. The resonator 10 including the cavity 20a can be obtained by omitting the fourth conductor 50 from the resonator 10 illustrated in FIGS. 1 to 64 and by including the cavity 20a in the base 20.

Figure 108:
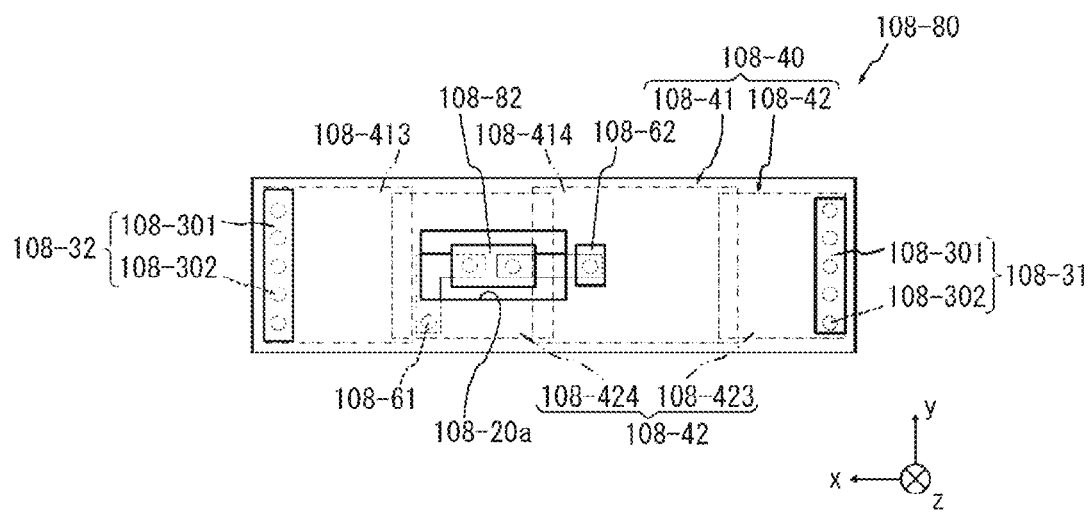
Figure 109:
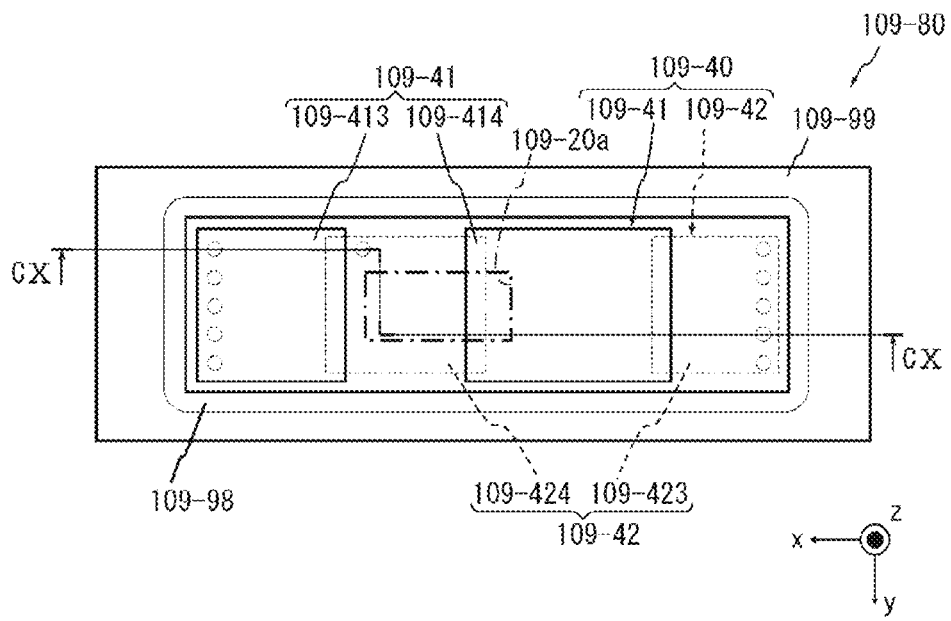
Figure 110:
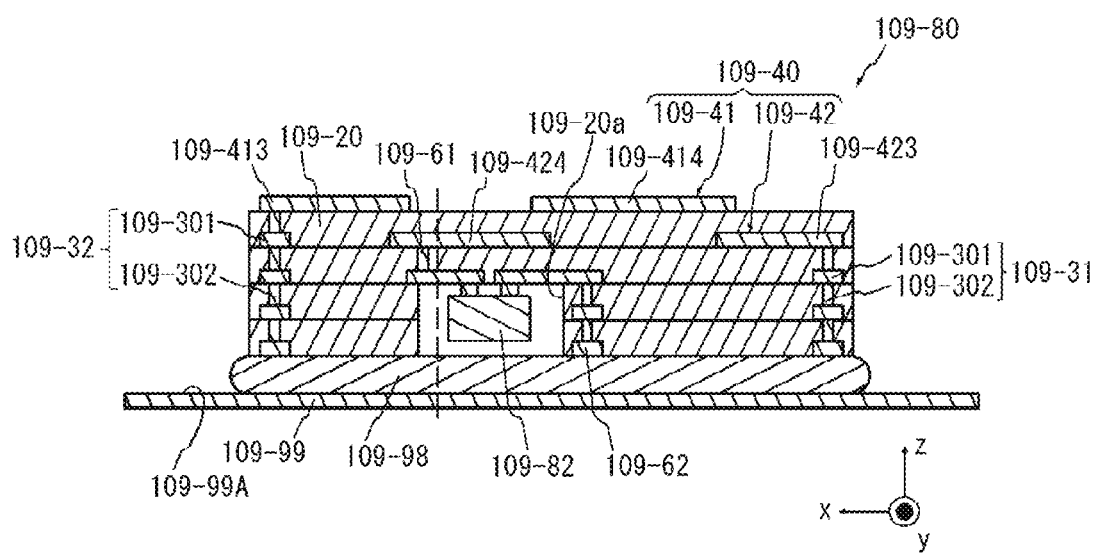

The base 20 can include the cavity 20a. In FIG. 108 is illustrated an example of a wireless communication module 108-80 in which a base 108-20 includes a cavity 108-20a. FIG. 108 is a planar view when the wireless communication module 108-80 is viewed in such a way that the far side of the drawing represents the +z direction. In FIG. 109 is illustrated a resonance structure formed by placing a wireless communication module 109-80, which includes a cavity 109-20a, on a conductor 109-99. FIG. 110 is a cross-sectional view taken along CX-CX line illustrated in FIG. 109. The wireless communication module 80 can be configured such that electronic devices is housed in the cavity 20a. The electronic devices include a processor and sensors. The electronic devices include the RF module 82. The wireless communication module 80 can be configured such that the RF module 82 is housed in the cavity 20a. The RF module 82 can be positioned in the cavity 20a. The RF module 82 is connected to the third conductors 40 via the first feeding line 61. The base 20 can include a ninth conductor 62 that guides the reference potential of the RF module toward the electrical conductive body 99.

In the wireless communication module 80, a part of the fourth conductor 50 can be omitted. The cavity 20a can be exposed to the outside from the omitted part of the fourth conductor 50. In FIG. 111 is illustrated an example of a wireless communication module 111-80 in which a part of the fourth conductor 50 is omitted. FIG. 111 is a planar view when the resonator 10 is viewed in such a way that the far side of the drawing represents the +z direction. In FIG. 112 is illustrated an example of a resonance structure formed by placing a wireless communication module 112-80, which includes a cavity 112-20a, on a conductor 112-99. FIG. 113 is a cross-sectional view taken along CXIII-CXIII line illustrated in FIG. 112.

The wireless communication module 80 can include a fourth base 25 in the cavity 20a. The fourth base 25 can include a resin material in its composition. The resin material can include a material obtained by curing an uncured material such as be an epoxy resin, a polyester resin, a polyimide resin, a polyamide-imide resin, a polyetherimide resin, and a liquid crystal polymer. In FIG. 114 is illustrated an example of a structure that includes a fourth base 114-25 in a cavity 114-20a.

An attachment member 98 includes a member having stickiness on both faces of the base material, an organic material that is cured or semi-cured, a soldering material, or a biasing mechanism. The member having stickiness on both faces of the base material can be called, for example, a double-faced adhesive tape. An organic material that is cured or semi-cured can be called, for example, an adhesive agent. The biasing mechanism includes screws and bands. The attachment member 98 can be a conductive member or a nonconductive member. The attachment member 98 of the conductive type can be a material having the conductive property or a member including a high proportion of a conductive material.

When the attachment member is nonconductive in nature, the pair conductors 30 of the resonator 10 are configured to be capacitively coupled with the electrical conductive body 99. In that case, in the resonator 10, the pair conductors 30 and the third conductors 40 along with the electrical conductive body 99 serve as a resonance circuit. In that case, the unit structure of the resonator 10 can include the base 20, the third conductor 40, the attachment member 98, and the electrical conductive body 99.

When the attachment member 98 is conductive in nature, the pair conductors 30 of the resonator 10 are configured to be conductive via the attachment member 98. By attaching the attachment member 98 to the electrical conductive body 99, the resistance value decreases. In that case, as illustrated in FIG. 115, if pair conductors 115-30 face the outside in the x direction, the resistance value between the pair conductors 115-30 via a conductor 115-99 decreases. In that case, in a resonator 115-10, the pair conductors 115-30 and a third conductor 115-40 along with an attachment member 115-98 serve as a resonance circuit. In that case, the unit structure of the resonator 115-10 can include a base 115-20, the third conductor 115-40, and the attachment member 115-98.

When the attachment member 98 is a biasing mechanism, the resonator 10 is pressed from the side of the third conductor 40 and abuts against the electrical conductive body 99. In that case, as an example, the pair conductors 30 of the resonator 10 are configured to make contact with the electrical conductive body 99 and perform conduction. In that case, as an example, the pair conductors 30 of the resonator 10 are configured to be capacitively coupled with the electrical conductive body 99. In that case, in the resonator 10, the pair conductors and the third conductor 40 along with the electrical conductive body 99 serve as a resonance circuit. In that case, the unit structure of the resonator 10 can include the base 20, the third conductor 40, and the electrical conductive body 99.

In general, when a conductor or a dielectric body approaches an antenna, the resonance frequency changes. If the resonance frequency undergoes a significant change, the actual gain of the antenna at the operating frequency changes. In an antenna used in the air or an antenna used by moving a conductor or a dielectric body close to it, the change in the actual gain attributed to the change in the resonance frequency may be made small.

In the resonator 10, the third conductor 40 and the fourth conductor 50 can have different lengths in the y direction. Herein, when a plurality of unit conductors is arranged in the y direction, the length of the third conductor 40 in the y direction represents the distance between the outside ends of the two unit conductors positioned at both ends in the y direction.

As illustrated in FIG. 116, the length of a fourth conductor 116-50 can be greater than the length of the third conductor 40. The fourth conductor 116-50 includes a first extension part 50a and a second extension part 50b that extend toward the outside from the ends in the y direction of the third conductor 40. In the planar view in the z direction, the first extension part 50a and the second extension part 50b are positioned on the outside of the third conductor 40. A base 116-20 can extend up to the end in the y direction of the third conductor 40. The base 116-20 can extend to between the end of the third conductor 40 and the end of the fourth conductor 116-50 in the y direction.

In a resonator 116-10, when the length of the fourth conductor 116-50 is greater than the length of the third conductor 40, there is a decrease in the change in the resonance frequency when a conductor moves closer to the outside of the fourth conductor 116-50. In the resonator 116-10, when $\lambda_1$ represents the operating wavelength, if the length of the fourth conductor 116-50 is greater than the length of the third conductor 40 by $0.075\lambda_1$ or more, the change in the resonance frequency in the operating frequency band is decreased. In the resonator 116-10, when $\lambda_1$ represents the operating wavelength, if the length of the fourth conductor 116-50 is greater than the length of the third conductor 40 by $0.075\lambda_1$ or more, the change in the actual gain at the operating frequency $f_1$ is decreased. In the resonator 116-10, when the total of the length of the first extension part 50a and the length of the second extension part 50b along the y direction is greater than the length of the third conductor 40 by $0.075\lambda_1$ or more, the change in the actual gain at the operating frequency $f_1$ is decreased. The total of the length of the first extension part 50a and the length of the second extension part 50b along the y direction corresponds to the difference between the length of the fourth conductor 116-50 and the length of the third conductor 40.

In the resonator 116-10, in the planar view from the reverse z direction, the fourth conductor 116-50 extends toward both sides of the third conductor 40 in the y direction. In the resonator 116-10, if the fourth conductor 116-50 extends toward both sides of the third conductor 40 in the y direction, there is a decrease in the change in the resonance frequency when a conductor moves closer to the outside of the fourth conductor 116-50. In the resonator 116-10, when $\lambda_1$ represents the operating wavelength, if the fourth conductor 116-50 extends toward both sides of the third conductor 40 by $0.025\lambda_1$ or more, the change in the resonance frequency in the operating frequency band is decreased. In the resonator 116-10, when $\lambda_1$ represents the operating wavelength, if the fourth conductor 116-50 extends toward both sides of the third conductor 40 by $0.025\lambda_1$ or more, the change in the actual gain at the operating frequency $f_1$ is decreased. In the resonator 116-10, if the length of the first extension part 50a in the y direction as well as the length of the second extension part 50b in the y direction is equal to or greater than $0.025\lambda_1$, the change in the actual gain at the operating frequency $f_1$ is decreased.

In the resonator 116-10, when $\lambda_1$ represents the operating wavelength, if the fourth conductor 116-50 extends toward both sides of the third conductor 40 by $0.025\lambda_1$ or more and when the length of the fourth conductor 116-50 is greater than the length of the third conductor 40 by $0.075\lambda_1$ or more, the change in the resonance frequency in the operating frequency band is decreased. In the resonator 116-10, when $\lambda_1$ represents the operating wavelength, if the fourth conductor 116-50 extends toward both sides of the third conductor 40 by $0.025\lambda_1$ or more and when the length of the fourth conductor 116-50 is greater than the length of the third conductor 40 by $0.075\lambda_1$ or more, the change in the actual gain in the operating frequency band is decreased. In the resonator 116-10, when the total of the length of the first extension part 50a and the length of the second extension part 50b along the y direction is greater than the length of the third conductor 40 by $0.075\lambda_1$ or more and when the length of the first extension part 50a in the y direction as well as the length of the second extension part 50b in the y direction is equal to or greater than $0.025\lambda_1$, the change in the actual gain at the operating frequency $f_1$ is decreased.

In a first antenna 116-60, the length of the fourth conductor 116-50 can be greater than the length of the third conductor 40. In the first antenna 116-60, when the length of the fourth conductor 116-50 is greater than the length of the third conductor 40, there is a decrease in the change in the resonance frequency when a conductor moves closer to the outside of the fourth conductor 116-50. In the first antenna 116-60, when $\lambda_1$ represents the operating wavelength, if the length of the fourth conductor 116-50 is greater than the length of the third conductor 40 by $0.075\lambda_1$ or more, the change in the resonance frequency in the operating frequency band is decreased. In the first antenna 116-60, when $\lambda_1$ represents the operating wavelength, if the length of the fourth conductor 116-50 is greater than the length of the third conductor 40 by $0.075\lambda_1$ or more, the change in the actual gain at the operating frequency $f_1$ is decreased. In the first antenna 116-60, when the total of the length of the first extension part 50a and the length of the second extension part 50b along the y direction is greater than the length of the third conductor 40 by $0.075\lambda_1$ or more, the change in the actual gain at the operating frequency $f_1$ is decreased. The total of the length of the first extension part 50a and the length of the second extension part 50b along the y direction corresponds to the difference between the length of the fourth conductor 116-50 and the length of the third conductor 40.

In the first antenna 116-60, in the planar view from the reverse z direction, the fourth conductor 116-50 extends toward both sides of the third conductor 40 in the y direction. In the first antenna 116-60, if the fourth conductor 116-50 extends toward both sides of the third conductor 40 in the y direction, there is a decrease in the change in the resonance frequency when a conductor moves closer to the outside of the fourth conductor 116-50. In the first antenna 116-60, when $\lambda_1$ represents the operating wavelength, if the fourth conductor 116-50 extends toward both sides of the third conductor 40 by $0.025\lambda_1$ or more, the change in the resonance frequency in the operating frequency band is decreased. In the first antenna 116-60, when $\lambda_1$ represents the operating wavelength, if the fourth conductor 116-50 extends toward both sides of the third conductor 40 by $0.025\lambda_1$ or more, the change in the actual gain at the operating frequency $f_1$ is decreased. In the first antenna 116-60, if the length of the first extension part 50a in the y direction as well as the length of the second extension part 50b in the y direction is equal to or greater than $0.025\lambda_1$, the change in the actual gain at the operating frequency $f_1$ is decreased.

In the first antenna 116-60, when $\lambda_1$ represents the operating wavelength, if the fourth conductor 116-50 extends toward both sides of the third conductor 40 by $0.025\lambda_1$ or more and if the length of the fourth conductor 116-50 is greater than the length of the third conductor 40 by $0.075\lambda_1$ or more, the change in the resonance frequency in the operating frequency band is decreased. In the first antenna 116-60, when $\lambda_1$ represents the operating wavelength, if the fourth conductor 116-50 extends toward both sides of the third conductor 40 by $0.025\lambda_1$ or more and if the length of the fourth conductor 116-50 is greater than the length of the third conductor 40 by $0.075\lambda_1$ or more, the change in the actual gain in the operating frequency band is decreased. In the first antenna 116-60, when $\lambda_1$ represents the operating wavelength, if the fourth conductor 116-50 extends toward both sides of the third conductor 40 by $0.025\lambda_1$ or more and if the length of the fourth conductor 116-50 is greater than the length of the third conductor 40 by $0.075\lambda_1$ or more, the change in the actual gain at the operating frequency $f_1$ is decreased. In the first antenna 116-60, if the total of the length of the first extension part 50$a$ and the length of the second extension part 50$b$ along the y direction is greater than the length of the third conductor 40 by $0.075\lambda_1$ or more and if the length of the first extension part 50$a$ in the y direction as well as the length of the second extension part 50$b$ in the y direction is equal to or greater than $0.025\lambda_1$, the change in the actual gain at the operating frequency $f_1$ is decreased.

As illustrated in FIG. 117, in a wireless communication module 117-80, a first antenna 117-60 is positioned on a ground conductor 117-811 of a circuit board 117-81. A fourth conductor 117-50 of the first antenna 117-60 is configured to be electrically connected to the ground conductor 117-811. The length of the ground conductor 117-811 is greater than the length of the third conductor 40. The ground conductor 117-811 includes a third extension part 811$a$ and a fourth extension part 811$b$ that extend toward the outside from the ends in the y direction of a resonator 117-10. In the planar view from the z direction, the third extension part 811$a$ and the fourth extension part 811$b$ are positioned on the outside of the third conductor 40. In the wireless communication module 117-80, the length of the first antenna 117-60 in the y direction can be different from the length of the ground conductor 117-811 in the y direction. In the wireless communication module 117-80, the length of the third conductor 40 of the first antenna 117-60 in the y direction can be different from the length of the ground conductor 117-811 in the y direction.

In the wireless communication module 117-80, the length of the ground conductor 117-811 can be greater than the length of the third conductor 40. In the wireless communication module 117-80, if the length of the ground conductor 117-811 is greater than the length of the third conductor 40, there is a decrease in the change in the resonance frequency when a conductor moves closer to the outside of the ground conductor 117-811. In the wireless communication module 117-80, when $\lambda_1$ represents the operating wavelength, if the length of the ground conductor 117-811 is greater than the length of the third conductor 40 by $0.075\lambda_1$ or more, the change in the resonance frequency in the operating frequency band is decreased. In the wireless communication module 117-80, when $\lambda_1$ represents the operating wavelength, if the length of the ground conductor 117-811 is greater than the length of the third conductor 40 by $0.075\lambda_1$ or more, the change in the actual gain at the operating frequency $f_1$ is decreased. In the wireless communication module 117-80, if the total of the length of the third extension part 811$a$ and the length of the fourth extension part 811$b$ along the y direction is greater than the length of the third conductor 40 by $0.075\lambda_1$ or more, the change in the actual gain at the operating frequency $f_1$ is decreased. The total of the length of the third extension part 811$a$ and the length of the fourth extension part 811$b$ along the y direction corresponds to the difference between the length of the ground conductor 117-811 and the length of the third conductor 40.

In the wireless communication module 117-80, in the planar view from the reverse z direction, the ground conductor 117-811 extends toward both sides of the third conductor 40 in the y direction. In the wireless communication module 117-80, if the ground conductor 117-811 extends toward both sides of the third conductor 40 in the y direction, there is a decrease in the change in the resonance frequency when a conductor moves closer to the outside of the ground conductor 117-811. In the wireless communication module 117-80, when $\lambda_1$ represents the operating wavelength, if the ground conductor 117-811 extends toward both sides of the third conductor 40 by $0.025\lambda_1$ or more, the change in the resonance frequency in the operating frequency band is decreased. In the wireless communication module 117-80, when $\lambda_1$ represents the operating wavelength, if the ground conductor 117-811 extends toward both sides of the third conductor 40 by $0.025\lambda_1$ or more, the change in the actual gain at the operating frequency $f_1$ is decreased. In the wireless communication module 117-80, if the length of the third extension part 811$a$ in the y direction as well as the length of the fourth extension part 811$b$ in the y direction is equal to or greater than $0.025\lambda_1$, the change in the actual gain at the operating frequency $f_1$ is decreased.

In the wireless communication module 117-80, when $\lambda_1$ represents the operating wavelength, if the ground conductor 117-811 extends toward both sides of the third conductor 40 by $0.025\lambda_1$ or more and if the length of the ground conductor 117-811 is greater than the length of the third conductor 40 by $0.075\lambda_1$ or more, the change in the resonance frequency in the operating frequency band is decreased. In the wireless communication module 117-80, when $\lambda_1$ represents the operating wavelength, if the ground conductor 117-811 extends toward both sides of the third conductor 40 by $0.025\lambda_1$ or more and if the length of the ground conductor 117-811 is greater than the length of the third conductor 40 by $0.075\lambda_1$ or more, the change in the actual gain in the operating frequency band is decreased. In the wireless communication module 117-80, when $\lambda_1$ represents the operating wavelength, if the ground conductor 117-811 extends toward both sides of the third conductor 40 by $0.025\lambda_1$ or more and if the length of the ground conductor 117-811 is greater than the length of the third conductor 40 by $0.075\lambda_1$ or more, the change in the actual gain at the operating frequency $f_1$ is decreased. In the wireless communication module 117-80, when the total of the length of the third extension part 811$a$ and the length of the fourth extension part 811$b$ along the y direction is greater than the length of the third conductor 40 by $0.075\lambda_1$ or more and when the length of the third extension part 811$a$ in the y direction as well as the length of the fourth extension part 811$b$ in the y direction is equal to or greater than $0.025\lambda_1$, the change in the actual gain at the operating frequency $f_1$ is decreased.

A simulation was performed to check the change in the resonance frequency in the operating frequency of the first antenna. As a model for the simulation, a resonance structure was adapted in which the first antenna was placed on the first surface of a circuit board having a ground conductor installed on the first surface. FIG. 118 is a perspective view of the conductor shape of the first antenna used in the simulation explained below. The first antenna had the length of 13.6 (mm) in the x direction, the length of 7 (mm) in the y direction, and the length of 1.5 (mm) in the z direction. The difference was checked between the resonance frequency of the resonance structure in the free space and the resonance frequency in the case of placing the resonance structure on a metallic plate having 100 (square millimeter (mm)).

In the model for a first simulation, the first antenna was placed at the center of the ground conductor and, while sequentially varying the length of the ground conductor in the y direction, the difference between the resonance frequency in the free space and the resonance frequency on the metallic plate was compared. In the model for the first simulation, the length of the ground conductor in the x direction was fixed to 0.13 $\lambda$s. Although the resonance frequency of the free space changed depending on the length of the ground conductor in the y direction, the resonance frequency in the operating frequency band of the resonance structure was in the vicinity of 2.5 (gigahertz (GHz)). Herein, $\lambda$s represents the wavelength at 2.5 (GHz). The result of the first simulation is given below in Table 1.

TABLE 1

| (mm) | (GHz) |
|---|---|
| 9 | 0.041 |
| 11 | 0.028 |
| 13 | 0.018 |
| 15 | 0.011 |
| 17 | 0.010 |
| 19 | 0.009 |
| 21 | 0.010 |
| 23 | 0.006 |
| 25 | 0.006 |
| 30 | 0.008 |
| 60 | 0.007 |

In FIG. 119 is illustrated a graph corresponding to the result given above in Table 1. In FIG. 119, the horizontal axis represents the difference between the length of the ground conductor and the length of the first antenna; and the vertical axis represents the difference between the resonance frequency in the free space and the resonance frequency on the metallic plate. From the graph illustrated in FIG. 119, a first linear region is assumed in which the variation in the resonance frequency is expressed as $y=a_1x+b_1$; and a second linear region is assumed in which the variation in the resonance frequency is expressed as $y=c_1$. Then, from the result given above in Table 1; $a_1$, $b_1$, and $c_1$ were calculated according to the least square method. As a result of the calculation, $a_1=-0.600$, $b_1=0.052$, and $c_1=0.008$ were obtained. The point of intersection of the first linear region and the second linear region was at 0.0733$\lambda$s. From such facts, it was understood that, when the length of the ground conductor is greater than the length of the first antenna by more than 0.0733$\lambda$s, the change in the resonance frequency is decreased.

In the model for a second simulation, while sequentially varying the position of the first antenna from the end of the ground conductor in the y direction, the difference between the resonance frequency in the free space and the resonance frequency on the metallic plate was compared. In the model for the second simulation, the length of the ground conductor in the y direction was fixed to 25 (mm). Although the resonance frequency changed depending on the position on the ground conductor, the resonance frequency in the operating frequency band of the resonance structure was in the vicinity of 2.5 (GHz). Herein, $\lambda$s represents the wavelength at 2.5 (GHz). The result of the second simulation is given below in Table 2.

TABLE 2

| ($\lambda$) | (GHz) |
|---|---|
| 0.004 | 0.033 |
| 0.013 | 0.019 |
| 0.021 | 0.013 |
| 0.029 | 0.012 |
| 0.038 | 0.010 |
| 0.046 | 0.008 |
| 0.054 | 0.010 |
| 0.071 | 0.006 |

In FIG. 120 is illustrated a graph corresponding to the result given above in Table 2. In FIG. 120, the horizontal axis represents the position of the first antenna from the end of the ground conductor; and the vertical axis represents the difference between the resonance frequency in the free space and the resonance frequency on the metallic plate. From the graph illustrated in FIG. 120, the first linear region is assumed in which the variation in the resonance frequency is expressed as $y=a_2x+b_2$; and the second linear region is assumed in which the variation in the resonance frequency is expressed as $y=c_2$. Then, $a_2$, $b_2$, and $c_2$ were calculated according to the least square method. As a result of the calculation; $a_2=-1.200$, $b_2=0.034$, and $c_2=0.009$ were obtained. The point of intersection of the first linear region and the second linear region was at 0.0227$\lambda$s. From such facts, it was understood that, when the first antenna is positioned on the inside by more than 0.0227$\lambda$s from the end of the ground conductor, the change in the resonance frequency is decreased.

In the model for a third simulation, while sequentially varying the position of the first antenna from the end of the ground conductor in the y direction, the difference between the resonance frequency in the free space and the resonance frequency on the metallic plate was compared. In the model for the third simulation, the length of the ground conductor in the y direction was fixed to 15 (mm). In the model for the third simulation, the total of the lengths of the ground conductor extending on the outside of the resonator in the y direction was set 0.075$\lambda$s. In the third simulation, the ground conductor is shorter than in the second simulation, and fluctuation in the resonance frequency is easier to occur. Although the resonance frequency changed depending on the position on the ground conductor, the resonance frequency in the operating frequency band of the resonance structure was in the vicinity of 2.5 (GHz). Herein, $\lambda$s represents the wavelength at 2.5 (GHz). The result of the third simulation is given below in Table 3.

TABLE 3

| ($\lambda$) | (GHz) |
|---|---|
| 0.004 | 0.032 |
| 0.014 | 0.023 |
| 0.025 | 0.014 |
| 0.035 | 0.014 |
| 0.041 | 0.014 |

In FIG. 121 is illustrated a graph corresponding to the result given above in Table 3. In FIG. 121, the horizontal axis represents the position of the first antenna from the end of the ground conductor; and the vertical axis represents the difference between the resonance frequency in the free space and the resonance frequency on the metallic plate. From the graph illustrated in FIG. 121, the first linear region is assumed in which the variation in the resonance frequency is expressed as $y=a_3x+b_3$; and the second linear region is assumed in which the variation in the resonance frequency is expressed as $y=c_3$. Then, $a_3$, $b_3$, and $c_3$ were calculated according to the least square method. As a result of the calculation; $a_3=-0.878$, $b_3=0.036$, and $c_3=0.014$ were obtained. The point of intersection of the first linear region and the second linear region was at $0.0247\lambda s$. From such facts, it was understood that, when the first antenna is positioned on the inside by more than $0.0247\lambda s$ from the end of the ground conductor, the change in the resonance frequency is decreased.

From the result of the third simulation in which the conditions are tougher than in the second simulation; it was understood that, when the first antenna is positioned on the inside by more than $0.025\lambda s$ from the end of the ground conductor, the change in the resonance frequency is decreased.

In the first simulation, the second simulation, and the third simulation; the length of the ground conductor along the y direction is set to be greater than the length of the third conductor along the y direction. In the resonator 10, even if the length of the fourth conductor along the y direction is set to be greater than the length of the third conductor along the y direction, it is still possible to reduce the change in the resonance frequency when a conductor is moved closer to the resonator from the side of the fourth conductor. When the length of the fourth conductor along the y direction is greater than the length of the third conductor along the y direction, even if the ground conductor and the circuit board are omitted, the change in the resonance frequency in the resonator can be reduced.

The resonator 10 constitutes a structure (resonance structure) that is mounted on a mounting board 100 and that resonates. The resonance structure can function as an antenna when it includes a feeding line (the first feeding line 61) connected to the third conductor 40. On the mounting board 100, an RF module that is configured to be electrically connected to an antenna can be mounted. By mounting an RF module on the mounting board 100, it becomes possible to implement a communication module including the antenna and the RF module. On the mounting board 100, a battery that is configured to supply electric power to the communication module can be mounted. By mounting a battery on the mounting board 100, it becomes possible to implement a wireless communication device including the communication module and the battery.

FIG. 122 is a perspective view for explaining the hierarchical structure of a resonator 122-10 according to embodiments that is mounted on a mounting board 122-100. The resonator 122-10 includes a first resist layer 122-44*a*, a metallic layer 122-101, a first prepreg layer 122-43*a*, a core layer 122-200, a second conductive layer 122-42, a second prepreg layer 122-43*b*, a first conductive layer 122-41, and a second resist layer 122-44*b* in that buildup sequence. In the resonator 122-10, a partial area of the metallic layer 122-101 (including first areas described later), which are exposed to the outside via a plurality of through holes of the first resist layer 122-44*a*, are connected to the mounting board 122-100 using solder.

As illustrated in FIG. 122, the mounting board 122-100 faces the metallic layer 122-101 with a distance therebetween. The mounting board 122-100 has an upper surface on which the resonator 122-10 is mounted, an under surface on the opposite side of the upper surface, and a plurality of through holes (second through holes 122-100*a*) formed from the upper surface up to the under surface. As explained above, the metallic layer 122-101 that is exposed to the outside via a plurality of through holes can be configured to be electrically connected to the mounting board 122-100 using solder. If the through holes formed on the resonator 122-10 overlap with the second through holes 122-100*a*, the solder enters the second through holes 122-100*a* and this leads to a decrease in the quantity of the solder. If there are portions in which the quantity of solder has partially decreased, it may cause development of portions that are vulnerable to stress and may cause a decline in the adhesion force. Hence, in order to prevent a decline in the mounting strength, the resonator 122-10 in may be mounted such a way that a plurality of through holes formed thereon do not overlap with any of a plurality of second through holes 122-100*a* formed on the mounting board 122-100.

The resonator 122-10 includes through hole conductors. As illustrated in FIG. 122, on a first conductor 122-31 and a second conductor 122-32 of the resonator 122-10, semi-circular end-face through holes having a recess that is recessed toward the center in the first direction (the x direction) are formed. That is, the first conductor 122-31 and the second conductor 122-32 expand along the recesses.

The first resist layer 122-44*a* and the second resist layer 122-44*b* are layers of a resist that is a dielectric body. As explained above, the first resist layer 122-44*a* has a plurality of through holes formed thereon. The second resist layer 122-44*b* does not have through holes formed thereon. Examples of the resist include epoxy-based resin, polyimide, BCB (benzocyclobutene), and acrylic resin. Regarding the through holes, the detailed explanation is given later. Meanwhile, the second resist layer 122-44*b* too can have through holes formed thereon. Those through holes can be used in, for example, establishing electric connection of the impedance elements 45 with the first conductive layer 122-41.

The metallic layer 122-101 is a conductive layer and includes a fourth conductor 122-50 and a first feeding line 122-61. The fourth conductor 122-50 is configured to function as the ground conductor in the resonator 122-10. The first feeding line 122-61 is configured to feed electric power to a third conductor 122-40. The first feeding line 122-61 includes a first constituting part 122-61*a* extending along the first direction (the x direction), and a second constituent part extending along the second direction (the z direction). The metallic layer 122-101 includes the first constituting part 122-61*a* of the first feeding line 122-61. The first constituting part 122-61*a* of the first feeding line 122-61 faces the mounting board 122-100 with a distance therebetween. Since the first constituting part 122-61*a* of the first feeding line 122-61 and the mounting board 122-100 have a gap (an air gap) therebetween except at the soldered portions, it becomes possible to reduce the power loss.

The first prepreg layer 122-43*a*, the core layer 122-200, and the second prepreg layer 122-43*b* are dielectric body layers that constitute a base 122-20. The first prepreg layer 122-43*a*, the core layer 122-200, and the second prepreg layer 122-43*b* can have the composition including a resin material and a fiber component. The fiber component can be made of a glass cloth and a cover placed on the upper surface of the glass cloth. Examples of a glass cloth include a fabric cloth or a non-woven fabric made of a glass fiber. The glass fiber can contain at least one of the following glass materials: E glass, D glass, S glass, NE glass, L glass, T glass, and quartz glass. In the example illustrated in FIG. 122, the first prepreg layer 122-43*a* and the second prepreg layer 122-43*b* have the same composition of the resin material and the fiber component. Herein, the first prepreg layer 122-43*a* and the second prepreg layer 122-43*b* are collectively referred to as a first dielectric layer. For example, the core layer 122-200 can include a fiber component having a greater diameter than the diameter of the fiber component of the first dielectric layer.

The first conductive layer 122-41 and the second conductive layer 122-42 are conductive layers included in the third conductor 122-40. The second conductive layer 122-42 can be configured to be capacitively coupled with the first conductive layer 122-41.

FIG. 123 is a planar view of the resonator 122-10 illustrated in FIG. 122. In FIG. 123, the first resist layer 122-44*a* and the metallic layer 122-101 are illustrated. The first resist layer 122-44*a* is transparent in nature, and the metallic layer 122-101 is illustrated through the first resist layer 122-44*a*. The first resist layer 122-44*a* covers almost entirely the surface, which faces the mounting board 122-100, of the metallic layer 122-101. However, as illustrated in FIG. 123, the first resist layer 122-44*a* has through holes 122-120*a* formed thereon. On the metallic layer 122-101, the fourth conductor 122-50 includes a plurality of first areas 122-111 that are exposed to the outside via the through holes 122-120*a* formed on the first resist layer 122-44*a*. The first resist layer 122-44*a* has a through hole 122-120*b* meant for the first feeding line 122-61. On the metallic layer, the first feeding line 122-61 has an area that is exposed to the outside via one through hole 122-120*b*. The first resist layer 122-44*a* does not cover second areas 122-112, which are end portions of the end-face through holes in the fourth conductor 122-50. That is, the first resist layer 122-44*a* extends on the first conductor 122-31 and the second conductor 122-32, excluding the second areas 122-112 in the first conductor 122-31 and the second conductor 122-32. The fourth conductor 122-50 is exposed to the outside not only via a plurality of first areas 122-111 but also via the second areas 122-112. The first areas 122-111 and the second areas 122-112 are arranged along the first plane (the x-y plane). Since no resist is applied on the second areas 122-112, a plurality of first areas 122-111 as well as the second areas 122-112 can be soldered to the mounting board 122-100. That results in an enhancement in the adhesion level of the solder at the time of mounting the resonator 122-10.

As illustrated in FIG. 123, in the first direction, the cross-sectional surfaces of the end-face through holes are more on the outside than the through holes 122-120*a* and the through hole 122-120*b*, which is meant for the first feeding line 122-61. Hence, the first feeding line 122-61 is soldered to the mounting board 122-100 more on the inside than the second areas 122-112 in the first direction. For example, when a force is exerted in the end portions on both sides of the resonator 122-10 in the first direction, in the inside portion of the through hole 122-120*b*, the intensity of the stress is reduced as compared to the end portions on both sides. That results in an enhancement in the reliability of the mounting of the resonator 122-10. In order to ensure that the through holes 122-120*a* are positioned more on the inside; in the first direction, a distance L2 from the cross-sectional surfaces of the end-face through holes to the respective nearest through holes 122-120*a* may be set to be greater than a distance L1 between the neighboring through holes 122-120*a*.

In the first resist layer 122-44*a*, the area of the through hole 122-120*b*, which is meant for the first feeding line 122-61, may be greater than the area of the through holes 122-120*a*. Greater the area of the through hole 122-120*b*, the smaller becomes the resist covering the first feeding line 122-61, which enables achieving reduction in the dielectric loss.

FIG. 124 is a perspective view of the resonator 122-10 illustrated in FIG. 122. The resonator 122-10 includes the base 122-20 that has: a first surface and a second surface that are parallel to the first plane (the x-y plane); a third surface and a fourth surface that are parallel to the second plane (the y-z plane) orthogonal to the first plane; and a fifth surface and a sixth surface that are parallel to the third plane (the z-x plane) orthogonal to the first plane and the second plane. In FIG. 124 are illustrated the first resist layer 122-44*a* and the metallic layer 122-101 that expand along the second surface of the base 122-20. In an identical manner to FIG. 123, the metallic layer 122-101 is illustrated through the first resist layer 122-44*a*. In FIG. 124 is illustrated the second conductor 122-32 that expands along the fourth plane and extends along the second direction (the z direction). Herein, the first conductor 122-31, which expands along the third surface and extends along the second direction, has the same configuration as the configuration of the second conductor 122-32. The first conductor 122-31 and the second conductor 122-32 include third areas 122-113 that are portions extending along the second direction. The third areas 122-113 are exposed to the exterior space. The third areas 122-113 are areas continuous to the second areas 122-112. The second areas 122-112 and the third areas 122-113 constitute the end-face through holes in the first conductor 122-31 and the second conductor 122-32. Herein, the second areas 122-112 and the third areas 122-113 include a plurality of areas (for example, three areas on one surface) along the third direction (the y direction).

Each third area 122-113 has a curved surface centered on the second direction. Thus, with only a small number of the end-face through holes, the area of the y-z plane can be increased. Herein, the RF module that is mountable on the mounting board 122-100 includes, for example, a power amplifier that amplifies RF signals. In general, a power amplifier radiates a large amount of heat. In the resonator 122-10, the heat transmitted from the power amplifier via the fourth conductor 122-50, which is the ground conductor, can be efficiently released from the end-face through holes that have a large surface area.

If the end-face through holes are formed by performing drilling, then the surfaces of the third areas 122-113 remain coarse. In other words, the curved surfaces of the third areas 122-113 centered on the second direction are not steady with respect to the reference line parallel to the second direction, and have different distances to the reference line. Having coarse surfaces of the third areas 122-113 leads to an increase in the surface area of the end-face through holes. That enables releasing the heat in a more efficient manner.

As explained above, the base 122-20 is a dielectric body that is configured to support the first conductor 122-31, the second conductor 122-32, the third conductor 122-40, and the fourth conductor 122-50. As illustrated in FIG. 124, a dielectric body has recesses which extend in the second direction and are recessed toward the center in the first direction. The third areas 122-113 of the end-face through holes expand along the recesses. Herein, the end-face thorough holes can be made by cutting circular through hole conductors, which are formed using, for example, a drill, along the third direction. In the third surface and the fourth surface, some portion of the base 122-20 is exposed to the exterior space.

Herein, FIG. 125 is an enlarged view of an area A0 illustrated in FIG. 124. As illustrated in FIG. 125, for example, a part of the dielectric body includes a fiber component 122-20X that comes in contact with the first conductor or the second conductor (more particularly, with the third areas 122-113). Of the third areas 122-113, in the portions coming in contact with the fiber component 122-20X, the surface of the conductor portion has asperity due to the asperity of the fiber component 122-20X. Of the third areas 122-113, in the portions coming in contact with the fiber component 122-20X, portions 122-113a may be developed to be more protruded than the surrounding portions. Of the third areas 122-113, in the portions coming in contact with the fiber component 122-20X, portions may be developed to be more recessed than the surrounding portions. The dielectric body includes, for example, a plurality of resin layers (a first resin member 122-20Y and a second resin member 122-43Y). At the interfaces of a plurality of resin layers, the dielectric body includes portions that are significantly recessed than the surrounding portions. Herein, at the time of forming a through hole conductor using a drill, in those portions of the third areas 122-113 which come in contact with the interfaces of a plurality of resin layers, portions 122-113b may be developed in which the conductor portion extends along the recess of the interfaces of the resin layers and which have a greater surface area than the surrounding portions. Meanwhile, in the case of cutting the circular through hole conductor that is formed, portions 122-113c may be developed in which a part of the conductor in the third areas 122-113 extends along the cutting direction (for example, the positive y-axis direction) and protrudes into the space of the through hole conductor. Because of the development of the portions 122-113a, 122-113b, and 122-113c explained above, there is a further increase in the surface area of the end-face through holes. That enables releasing the heat in a more efficient manner.

FIG. 126 is a perspective view of the resonator 122-10 illustrated in FIG. 122. In FIG. 126 are illustrated the second resist layer 122-44b and the first conductive layer 122-41 that expand along the first surface of the base 122-20. The second resist layer 122-44b is transparent in nature, and the first conductive layer 122-41 is illustrated through the second resist layer 122-44b. The second resist layer 122-44b covers almost entirely the surface of the first conductive layer 122-41 on the positive side in the z direction. However, the second resist layer 122-44b does not cover areas 122-114 and 122-115 that include the cross-sectional surfaces of the edge-face through holes in the first conductive layer 122-41. That is, the second resist layer 122-44b extends on the first conductor 122-31 and the second conductor 122-32, excluding the areas 122-114 and 122-115. Herein, the areas 122-114 and 122-115 are a part of the third conductor 122-40 and are exposed to the exterior space even when the resonator 122-10 is mounted on the mounting board 100. Moreover, the areas 122-114 and 122-115 are areas continuous to the third areas 122-113 (those areas of the first conductor 122-31 and the second conductor 122-32 which are exposed to the exterior space), and are connected to the ground conductor. That is, the first conductor 122-31, the second conductor 122-32, and the third conductor 122-40 are at least partially exposed to the exterior space. In the resonator 122-10, the ground conductor has exposed portions on various surfaces (the first surface, the third surface, and the fourth surface), and thus the ground conductor can be made to function as a lightning rod against, for example, the static electricity coming from a human body or against the electrification charge of a constituent component. Particularly, as illustrated in FIG. 126, the resonator 122-10 includes the conductor portions exposed to the exterior space at the corner at which the first surface and the third surface intersect and at the corner at which the first surface and the fourth surface intersect. Since the exposed portions of the ground conductor are provided at the corners that are easily touchable by a person, the static electricity from the human body can easily flow to the ground conductor. Herein, in the areas of the fifth surface and the sixth surface of the resonator 122-10 positioned between the first conductor 122-31 and the second conductor 122-32 in the first direction (the x direction), the third conductor 122-40 is not exposed to the exterior space. That is, the resonator 122-10 does not include conductors such as end-face through holes on the fifth surface and the sixth surface. As explained earlier, from the third conductor 40, the z-x planes (the fifth surface and the sixth surface) at both ends in the y direction of the resonator 10 are seen as magnetic conductors. In the resonator 122-10, since there are no conductors on the fifth surface and the sixth surface, the magnetic field cannot be obstructed. As a result, in the resonator 122-10, the antenna characteristics can be enhanced.

Herein, the third conductor 40 includes a plurality of unit conductors. In the example illustrated in FIG. 126, a plurality of first floating conductors 122-414 constituting the unit conductors is illustrated. The first floating conductors 122-414 sandwich gaps 122-131 and 122-132 therebetween. That is, the unit conductors face each other along the first direction. Moreover, the unit conductors face each other along the third direction. The gap 122-131 is a gap formed along the third direction and in the central portion of the resonator 122-10 in the first direction. Because of the gap 122-131, the resonator 122-10 has an increased flexibility thereby enabling alleviation of the stress applied in the first direction. The gap 122-132 is a gap formed along the first direction and in the central part of the resonator 122-10 in the third direction. Because of the gap 122-132, the resonator 122-10 has an increased flexibility thereby enabling alleviation of the stress applied in the third direction.

Herein, the first constituting part 122-61a of the first feeding line 122-61 (hereinafter, also simply called the first constituting part 122-61a) is positioned on the inside of both ends of the fourth conductor 122-50 in the third direction. In the example illustrated in FIG. 123, the first constituting part 122-61a extends in the first direction at a position different from the center in the third direction. More particularly, the first constituting part 122-61a of the first feeding line 122-61 is positioned at the end portion in the third direction (i.e., from among the positions of a plurality of through holes, the end portion in the third direction). Herein, if the resonator 122-10 is resonating, an electric current flows in a concentrated manner in the end portions (the surrounding part) of the fourth conductor 122-50. In the example illustrated in FIG. 123, the first constituting part 122-61a extending along the first direction is present near the portion of the fourth conductor 122-50 in which the electric current flows in a concentrated manner. The electric current that flows in the fourth conductor 122-50 in the resonating state flows along the first constituting part 122-61a (i.e., flows near the first constituting part 122-61a in the first direction in which the first constituting part 122-61a extends). The first direction in which the first constituting part 122-61a extends is the opposite direction to electric conductors. Since the first constituting part 122-61a extends in the first direction, there is less impact of the flow of electric current. As a result of having the first constituting part 122-61a, the fourth conductor 122-50 has a different shape at the end portion in the negative y direction than the shape at the end portion in the positive y direction. Hence, the electric current flowing along the end portions of the fourth conductor 122-50 has different paths in the negative y direction and the positive y direction. Because of such differences (asymmetry) in the paths of the electric current, the antenna bandwidth is expanded as compared to the case in which the paths of the electric current are symmetric.

FIG. 127 is a diagram illustrating another example of the position of the first feeding line 122-61 in the resonator 122-10 illustrated in FIG. 122. As illustrated in FIG. 127, the first feeding line 122-61 can be surrounded by the first areas 122-111. In other words, the resonator 122-10 can include the first feeding line 122-61 that is connected to the third conductor 122-40 and that is exposed from the first resist layer 122-44*a* in the area surrounded by the first areas 122-111. At that time, the first feeding line 122-61 is soldered to the mounting board 122-100 more on the inside in the first and third directions. Hence, in the portions in which the first feeding line 122-61 is soldered, the intensity of the stress is further reduced and the reliability related to the mounting is further enhanced.

The configuration according to the present disclosure is not limited to embodiments described above, and it is possible to have a number of modifications and variations. For example, the functions included in the constituent elements can be rearranged without causing any logical contradiction. Thus, a plurality of constituent elements can be combined into one constituent elements, or constituent elements can be divided.

In the present disclosure, the constituent elements corresponding to already-illustrated constituent elements are referred to with common reference numerals, along with prefixes indicating the respective drawing numbers. Even if a constituent element has a drawing number assigned thereto as the prefix, it can still include the same configuration as other constituent elements referred to by the same common reference numeral. In each constituent element, the configuration of other constituent elements referred to by the same common reference numeral can be adapted as long as there is no logical contradiction. In each constituent element, two or more constituent elements referred to by the same common reference numeral can be partially or entirely combined together. In the present disclosure, the prefix assigned to a common reference numeral can be removed. In the present disclosure, the prefix assigned to a common reference numeral can be changed to an arbitrary number. In the present disclosure, the prefix assigned to a common reference numeral can be changed to the same number as the number of another constituent element referred to by the same common reference numeral, as long as there is no logical contradiction.

The drawings used for explaining the configurations according to the present disclosure are schematic in nature. That is, the dimensions and the proportions in the drawings do not necessarily match with the actual dimensions and proportions.

In the present disclosure, the terms "first", "second", "third", and so on are examples of identifiers meant to distinguish the configurations from each other. In the present disclosure, regarding the configurations distinguished by the terms "first" and "second", the respective identifying numbers can be reciprocally exchanged. For example, regarding a first frequency and a second frequency, the identifiers "first" and "second" can be reciprocally exchanged. The exchange of identifiers is performed in a simultaneous manner. Even after the identifiers are exchanged, the configurations remain distinguished from each other. Identifiers can be removed too. The configurations from which the identifiers are removed are still distinguishable by the reference numerals. For example, the first conductor 31 can be referred to as the conductor 31. In the present disclosure, the terms "first", "second", and so on of the identifiers should not be used in the interpretation of the ranking of the concerned configurations, or should not be used as the basis for having identifiers with low numbers, or should not be used as the basis for having identifiers with high numbers. In the present disclosure, a configuration in which the second conductive layer 42 includes the second unit slot 422 but in which the first conductive layer 41 does not include a first unit slot is included.

The invention claimed is:

1. A structure, comprising:
a first conductor extending in a second direction, and a second conductor facing the first conductor in a first direction and extending along the second direction, wherein each of the first conductor and the second conductor includes
a portion having a curved surface extending along the second direction and exposed to an exterior space;
a third conductor configured to capacitively connect the first conductor and the second conductor;
a fourth conductor configured to be electrically connected to the first conductor and the second conductor, and extending along a first plane, and
a dielectric body supporting the first conductor, the second conductor, the third conductor, and the fourth conductor, wherein the dielectric body includes
a recess extending in the second direction and recessed toward a center of the dielectric body in the first direction, wherein the recess of the dielectric body corresponds to at least one of the curved surface of the first conductor or the second conductor, and
a fiber component partially contacting the portion of each of the first conductor and the second conductor at the recess, wherein, the fiber component protrudes toward the exterior space beyond an outer surface of each of the first conductor and the second conductor at the recess.

2. The structure according to claim 1, wherein the curved surface is centered on the second direction.

3. The structure according to claim 2, wherein the curved surface has different distances to a reference line parallel to the second direction.

4. The structure according to claim 1, wherein the first conductor and the second conductor expand along the recess.

5. The structure according to claim 4, wherein of the first conductor or the second conductor, the portion coming in contact with the fiber component is more protruded than a surrounding portion thereof.

6. The structure according to claim 4, wherein the dielectric body includes
a plurality of resin layers, and
a further portion that is recessed than a surrounding portion thereof at an interface of the plurality of resin layers, and
the first conductor and the second conductor have a large surface area at the interface of the plurality of resin layers.

7. An antenna comprising:
the structure according to claim 1; and
a feeding liner that is connected to the third conductor.

8. A wireless communication module comprising:
the antenna according to claim 7; and
an RF module that is configured to be electrically connected to the antenna.

9. A wireless communication device comprising:
the wireless communication module according to claim 8; and
a battery that is configured to supply electric power to the wireless communication module.

10. The structure according to claim 1, wherein the dielectric body includes
a plurality of resin layers adjacent to the fiber component in the second direction, and
a conducting portion protruding from the plurality of resin layers beyond the outer surface of each of the first conductor and the second conductor at the recess.

\* \* \* \* \*